United States Patent
Nabesaka et al.

(10) Patent No.: US 12,256,542 B2
(45) Date of Patent: Mar. 18, 2025

(54) THREE-DIMENSIONAL MEMORY DEVICE CONTAINING A PILLAR CONTACT BETWEEN CHANNEL AND SOURCE AND METHODS OF MAKING THE SAME

(71) Applicant: SANDISK TECHNOLOGIES LLC, Addison, TX (US)

(72) Inventors: Kyohei Nabesaka, Yokkaichi (JP); Teruo Okina, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 445 days.

(21) Appl. No.: 17/931,362

(22) Filed: Sep. 12, 2022

(65) Prior Publication Data

US 2024/0090217 A1    Mar. 14, 2024

Related U.S. Application Data

(63) Continuation-in-part of application No. 17/684,975, filed on Mar. 2, 2022, now Pat. No. 12,108,597.

(51) Int. Cl.
*H10B 41/27*    (2023.01)
*H10B 43/20*    (2023.01)
(Continued)

(52) U.S. Cl.
CPC ............. *H10B 43/20* (2023.02); *H10B 43/35* (2023.02); *H10B 43/40* (2023.02)

(58) Field of Classification Search
CPC ........ H10B 41/27; H10B 41/10; H10B 41/35; H10B 43/10; H10B 43/27; H10B 43/35;
(Continued)

(56) References Cited

U.S. PATENT DOCUMENTS 5,915,167 A    6/1999  Leedy
9,530,790 B1   12/2016  Lu et al.
(Continued)

FOREIGN PATENT DOCUMENTS

WO    2019221792 A1    11/2019

OTHER PUBLICATIONS

U.S. Appl. No. 16/951,325, filed Nov. 18, 2020, SanDisk Technologies LLC.
(Continued)

*Primary Examiner* — David Vu
(74) *Attorney, Agent, or Firm* — THE MARBURY LAW GROUP PLLC

(57) ABSTRACT

A memory die includes an alternating stack of insulating layers and electrically conductive layers, a semiconductor material layer located over the alternating stack, a dielectric spacer layer located over the semiconductor material layer, a memory opening vertically extending through the alternating stack, through the semiconductor material layer, and at least partly through the dielectric spacer layer, a memory opening fill structure located in the memory opening and including a dielectric core, a vertical semiconductor channel having a hollow portion which surrounds the dielectric core and a pillar portion which does not surround the dielectric core, and a memory film, and a source layer located over the dielectric spacer layer and contacting the pillar portion. In one embodiment, a tubular spacer laterally surrounds the pillar portion, is laterally spaced from the pillar portion by a cylindrical portion of the memory film, and contacts a cylindrical sidewall of the semiconductor material layer.

20 Claims, 70 Drawing Sheets

(51) Int. Cl.
*H10B 43/27* (2023.01)
*H10B 43/35* (2023.01)
*H10B 43/40* (2023.01)

(58) Field of Classification Search
CPC ........ H10B 43/50; H10B 43/20; H10B 43/40; G11C 16/0483; H01L 23/5226; H01L 23/5283; H01L 24/06; H01L 24/08; H01L 24/80; H01L 25/0657; H01L 2224/06181; H01L 2224/08146; H01L 2224/80001; H01L 2225/06541; H01L 2924/1431; H01L 2924/1451; H01L 21/76898; H01L 25/18; H01L 2224/80894; H01L 2225/06524; H01L 2225/06565
See application file for complete search history.

(56) References Cited

U.S. PATENT DOCUMENTS

| | | | |
|---|---|---|---|
| 10,629,616 | B1 | 4/2020 | Kai et al. |
| 10,991,718 | B2 | 4/2021 | Pachamuthu et al. |
| 11,031,413 | B2 * | 6/2021 | Xiao .................... H10B 43/10 |
| 11,101,284 | B2 | 8/2021 | Pachamuthu et al. |
| 11,195,587 | B2 | 12/2021 | Kai et al. |
| 11,195,781 | B2 | 12/2021 | Okina et al. |
| 11,201,107 | B2 | 12/2021 | Okina et al. |
| 2021/0035965 | A1 | 2/2021 | Mizutani et al. |
| 2021/0036003 | A1 | 2/2021 | Pachamuthu et al. |
| 2021/0091063 | A1 | 3/2021 | Ninomiya et al. |
| 2021/0151413 | A1 | 5/2021 | Liu |
| 2021/0202458 | A1 | 7/2021 | Jung et al. |
| 2021/0391315 | A1 | 12/2021 | Zhang |

OTHER PUBLICATIONS

U.S. Appl. No. 16/951,354, filed Nov. 18, 2020, SanDisk Technologies LLC.
U.S. Appl. No. 17/082,629, filed Oct. 28, 2020, SanDisk Technologies LLC.
U.S. Appl. No. 17/122,296, filed Dec. 15, 2020, SanDisk Technologies LLC.
U.S. Appl. No. 17/134,997, filed Dec. 28, 2020, SanDisk Technologies LLC.
U.S. Appl. No. 17/232,209, filed Apr. 16, 2021, SanDisk Technologies LLC.
U.S. Appl. No. 17/577,533, filed Jan. 18, 2022, SanDisk Technologies LLC.
U.S. Appl. No. 17/684,975, filed Mar. 2, 2022, SanDisk Technologies LLC.
USPTO Office Communication, Notice of Allowance in a corresponding application, U.S. Appl. No. 17/684,975, mailed Aug. 6, 2024, 15 pages.

* cited by examiner

THREE-DIMENSIONAL MEMORY DEVICE CONTAINING A PILLAR CONTACT BETWEEN CHANNEL AND SOURCE AND METHODS OF MAKING THE SAME

RELATED APPLICATIONS

This application is a continuation-in-part application of U.S. application Ser. No. 17/684,975 filed on Mar. 2, 2022, the entire contents of which are incorporated herein by reference.

FIELD

The present disclosure relates generally to the field of semiconductor devices, and particularly to a bonded three-dimensional memory device containing a pillar contact between vertical semiconductor channels and a source layer and methods of making the same.

BACKGROUND

Support circuitry for performing write, read, and erase operations of the memory cells in the vertical NAND strings may be provided by complementary metal oxide semiconductor (CMOS) devices formed on a same substrate as the three-dimensional memory device containing the NAND strings.

SUMMARY

According to an aspect of the present disclosure, a memory die includes an alternating stack of insulating layers and electrically conductive layers, a semiconductor material layer located over the alternating stack, a dielectric spacer layer located over the semiconductor material layer, a memory opening vertically extending through the alternating stack, through the semiconductor material layer, and at least partly through the dielectric spacer layer, a memory opening fill structure located in the memory opening and including a dielectric core, a vertical semiconductor channel having a hollow portion which surrounds the dielectric core and a pillar portion which does not surround the dielectric core, and a memory film, and a source layer located over the dielectric spacer layer and contacting the pillar portion. In one embodiment, a tubular spacer laterally surrounds the pillar portion, is laterally spaced from the pillar portion by a cylindrical portion of the memory film, and contacts a cylindrical sidewall of the semiconductor material layer.

According to another aspect of the present disclosure, a method of forming a memory device is provided, which comprises: forming a dielectric spacer layer, a semiconductor material layer, and an alternating stack of insulating layers and spacer material layers over a carrier substrate, wherein the spacer material layers are formed as or are subsequently replaced with electrically conductive layers; forming a memory opening through the alternating stack and the semiconductor material layer, wherein a surface of the dielectric spacer layer is physically exposed to the memory opening; forming memory opening fill structure in the memory opening, by forming a memory film in the memory opening, forming a vertical semiconductor channel on the memory film, and forming a dielectric core on the vertical semiconductor channel; removing the carrier substrate; physically exposing the pillar portion of the vertical semiconductor channel after removing the carrier substrate; and forming a source layer directly on the pillar portion of the vertical semiconductor channel. In on embodiment, the method further comprises selectively depositing a tubular spacer on physically exposed surfaces of the semiconductor material layer, wherein the memory film is deposited on the tubular spacer and on sidewalls of the alternating stack after selectively depositing the tubular spacer.

According to an aspect of the present disclosure, a semiconductor structure is provided, which comprises: a memory die bonded to a logic die, the memory die comprising: an alternating stack of insulating layers and electrically conductive layers; a semiconductor material layer located on a distal surface of the alternating stack, wherein the semiconductor material layer is more distal from the logic die than the alternating stack is from the logic die; a dielectric spacer layer located on a distal surface of the semiconductor material layer; memory opening fill structures located in the memory openings, wherein each of the memory opening fill structures comprises a dielectric core, a vertical semiconductor channel having a hollow portion which surrounds the dielectric core and a pillar portion which does not surround the dielectric core, and a memory film; and a source layer located over a distal surface of the dielectric spacer layer and contacting the pillar portions of the vertical semiconductor channels.

According to another aspect of the present disclosure, a method of forming a three-dimensional memory device is provided, which comprises: forming a dielectric spacer layer, a semiconductor material layer, and an alternating stack of insulating layers and spacer material layers over a carrier substrate, wherein the spacer material layers are formed as, or are subsequently replaced with, electrically conductive layers; forming memory openings through the alternating stack, the semiconductor material layer, and the dielectric spacer layer into an upper portion of the carrier substrate; forming memory opening fill structures in the memory openings, wherein each of the memory opening fill structures comprises a dielectric core, a vertical semiconductor channel having a hollow portion which surrounds the dielectric core and a pillar portion which does not surround the dielectric core, and a memory film; removing the carrier substrate; physically exposing the pillar portion of each of the vertical semiconductor channels after removing the carrier substrate; and forming a source layer directly on the pillar portion of each of the vertical semiconductor channels.

DETAILED DESCRIPTION

Figure 1:
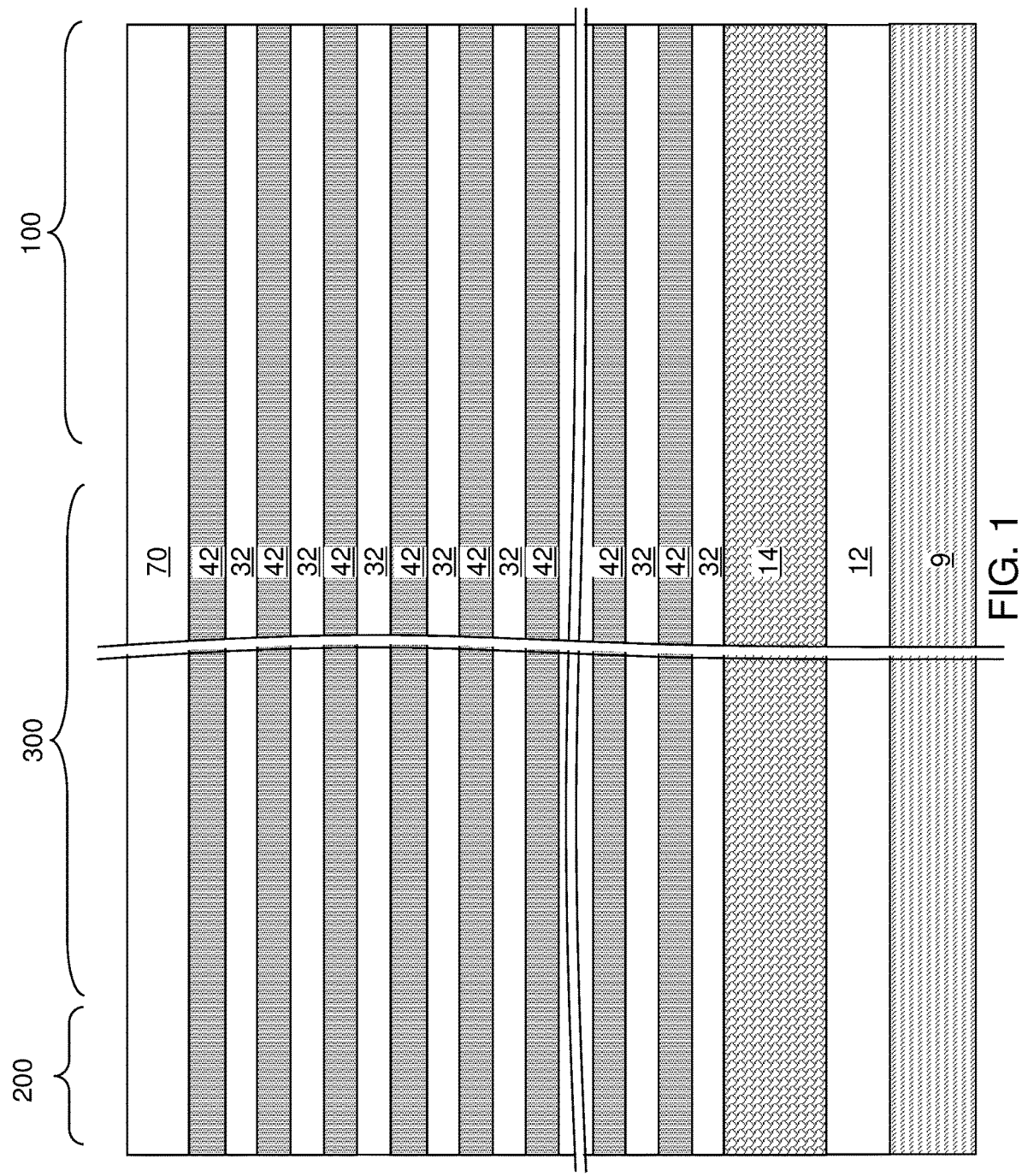
FIG. 1 is a schematic vertical cross-sectional view of a first exemplary structure after formation of a dielectric spacer layer, a semiconductor material layer, and an alternating stack of insulating layers and sacrificial material layers over a carrier substrate according to an embodiment of the present disclosure.

As discussed above, the embodiments of the present disclosure are directed to a bonded three-dimensional memory device employing a pillar contact between vertical semiconductor channels and a source layer and methods of making the same, the various aspects of which are described below. The embodiments of the present disclosure can be used to form various structures including a multilevel memory structure, non-limiting examples of which include semiconductor devices such as three-dimensional memory array devices comprising a plurality of NAND memory strings. The embodiments of the present disclosure can be used to form a bonded assembly of multiple semiconductor dies including a memory die. Support circuitry (also referred to as peripheral or driver circuitry) used to perform write, read, and erase operations of the memory cells in the vertical NAND strings may be implemented in CMOS devices formed on a same substrate as the three-dimensional memory device. In such devices, design and manufacturing consideration is that degradation of CMOS devices due to collateral thermal cycling and hydrogen diffusion during manufacture of the three-dimensional memory device places severe constraints on performance of the support circuitry. Various embodiments include methods that provide high-performance support circuitry for three-dimensional memory device. Various embodiments include methods that provide a source layer in three-dimensional memory devices that is easier to implement than conventional methods.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "proto-type" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, a first exemplary structure according to an embodiment of the present disclosure is illustrated, which can be used, for example, to fabricate a device structure containing vertical NAND memory devices. The first exemplary structure includes a carrier substrate 9, a dielectric spacer layer 12, a semiconductor material layer 14, and an alternating stack of first material layers 32 and second material layers 42 located over the semiconductor material layer 14. In one embodiment, the carrier substrate 9 may comprise a semiconductor substrate, an insulating substrate, or a conductive substrate. The carrier substrate 9 has a thickness that is sufficient to provide structural support to the dielectric spacer layer 12, the semiconductor material layer 14, and the alternating stack that are formed thereabove. In one embodiment, the carrier substrate 9 may comprise a commercially-available silicon wafer.

The dielectric spacer layer 12 comprises a dielectric material such as undoped silicate glass (i.e., silicon oxide) or a doped silicate glass. The dielectric spacer layer 12 may be formed by deposition of a dielectric material. Alternatively, in case the carrier substrate 9 comprises a semiconductor material, such as a single crystalline silicon or polysilicon, the dielectric spacer layer 12 may be formed by oxidation of a surface portion of the carrier substrate 9. The thickness of the dielectric spacer layer 12 may be in a range from 10 nm to 200 nm, such as from 20 nm to 100 nm, although lesser and greater thicknesses may also be employed.

The semiconductor material layer 14 includes a semiconductor material such as amorphous silicon, polysilicon, or silicon-germanium alloy. The semiconductor material layer 14 may be formed by a chemical vapor deposition (CVD) process (e.g., low pressure CVD, plasma enhanced CVD, etc.) or by a physical vapor deposition (PVD) process. The thickness of the semiconductor material layer 14 may be in a range from 50 nm to 300 nm, such as from 100 nm to 250 nm, although lesser and greater thicknesses may also be employed. The semiconductor material layer 14 may comprise a heavily doped (e.g., p-type or n-type doped) amorphous silicon or polysilicon layer which may function as a source side select gate electrode of a NAND device.

The alternating stack of the first material layers and the second material layers can be formed over the semiconductor material layer 14. Each first material layer includes a first material, and each second material layer includes a second material that is different from the first material. In one embodiment, each first material layer can be an insulating layer 32, and each second material layer can be a sacrificial material layer 42.

The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride. The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The first exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

Figure 2:
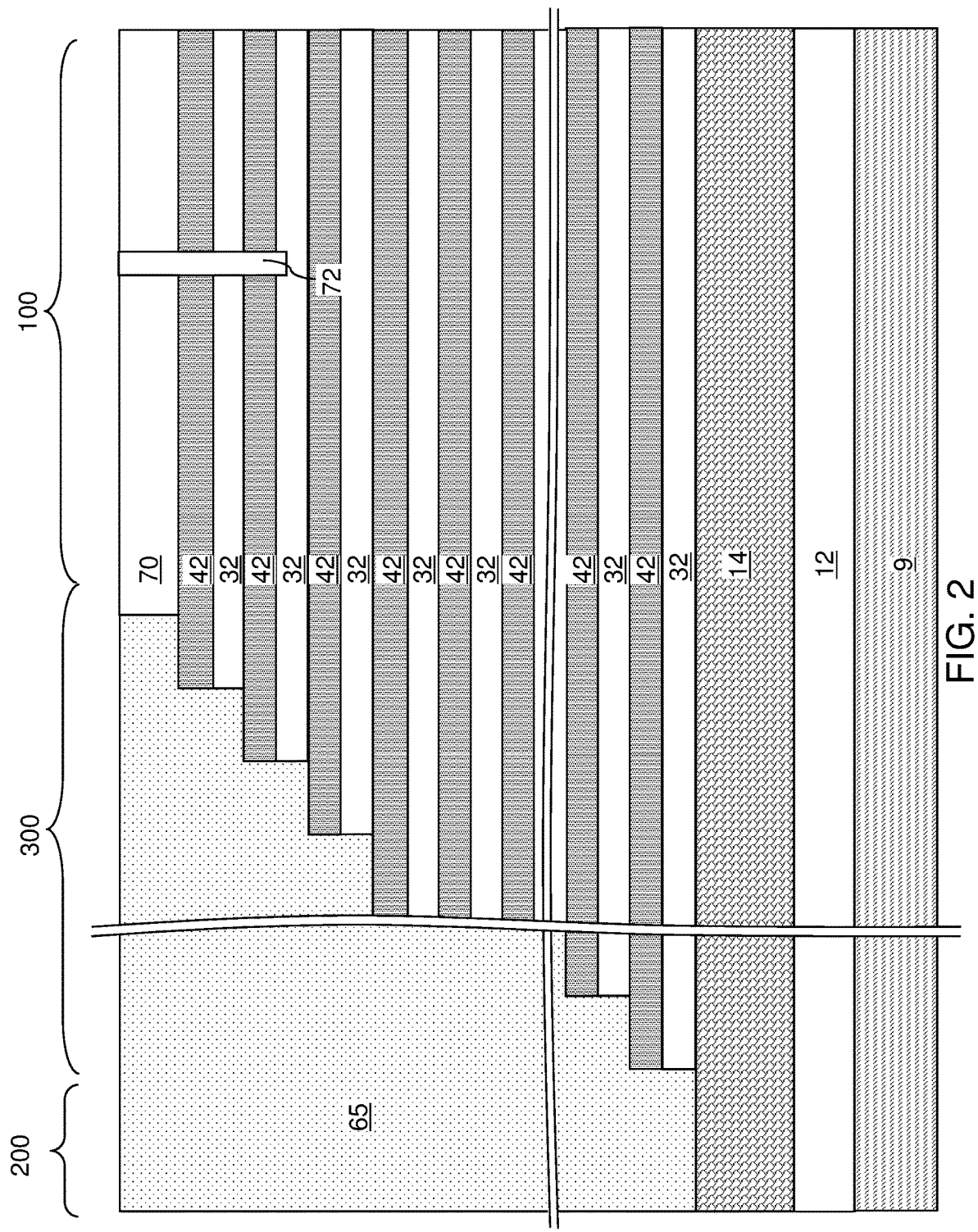
FIG. 2 is a schematic vertical cross-sectional view of the first exemplary structure after formation of stepped surfaces and a stepped dielectric material portion according to an embodiment of the present disclosure.

Referring to FIG. 2, stepped surfaces are formed in the staircase region 300, which is also referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a step-wise-increasing lateral extent that increases with a vertical distance from the carrier substrate 9.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 3A:
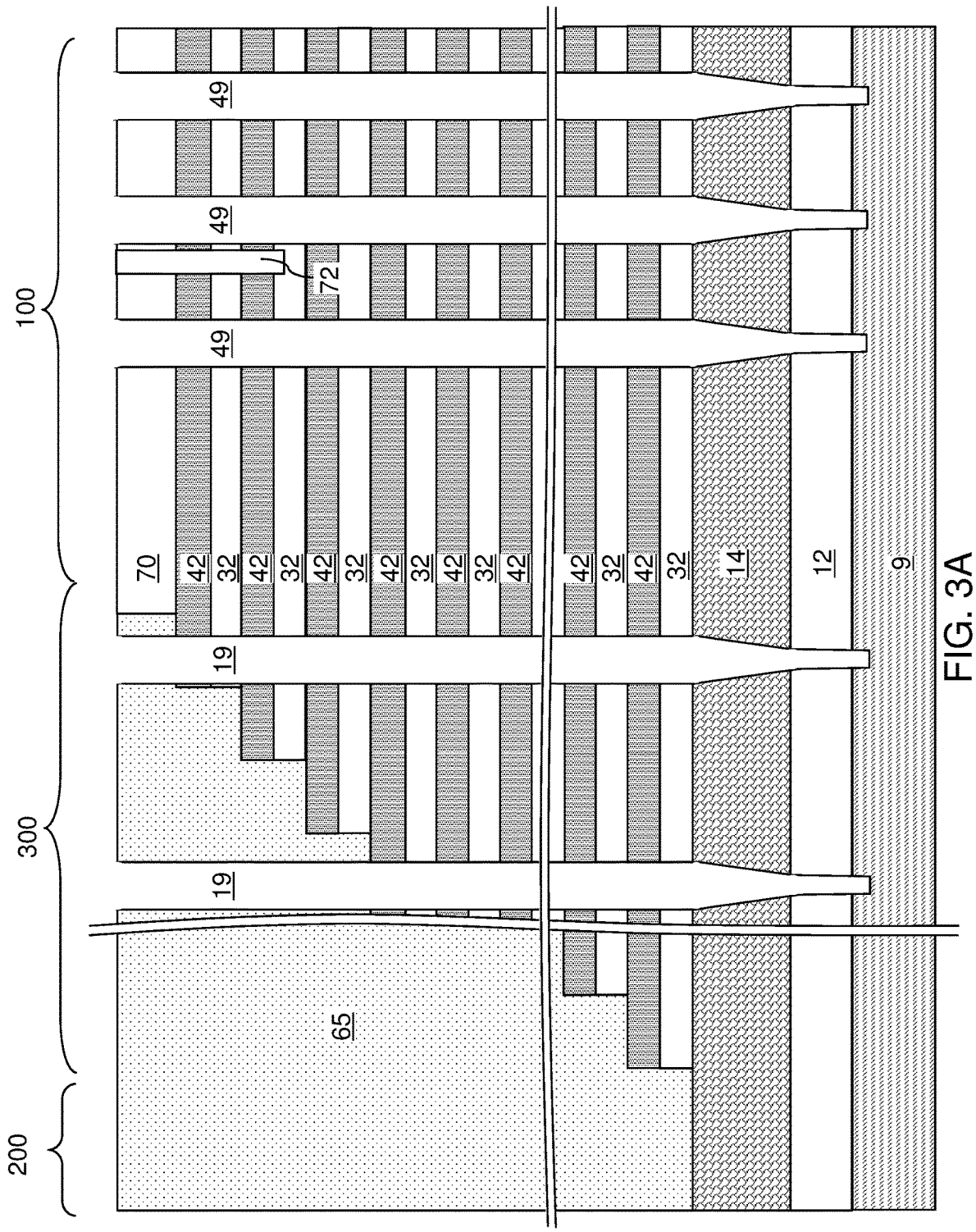
FIG. 3A is a schematic vertical cross-sectional view of the first exemplary structure after formation of memory openings and support openings according to an embodiment of the present disclosure.
Figure 3B:
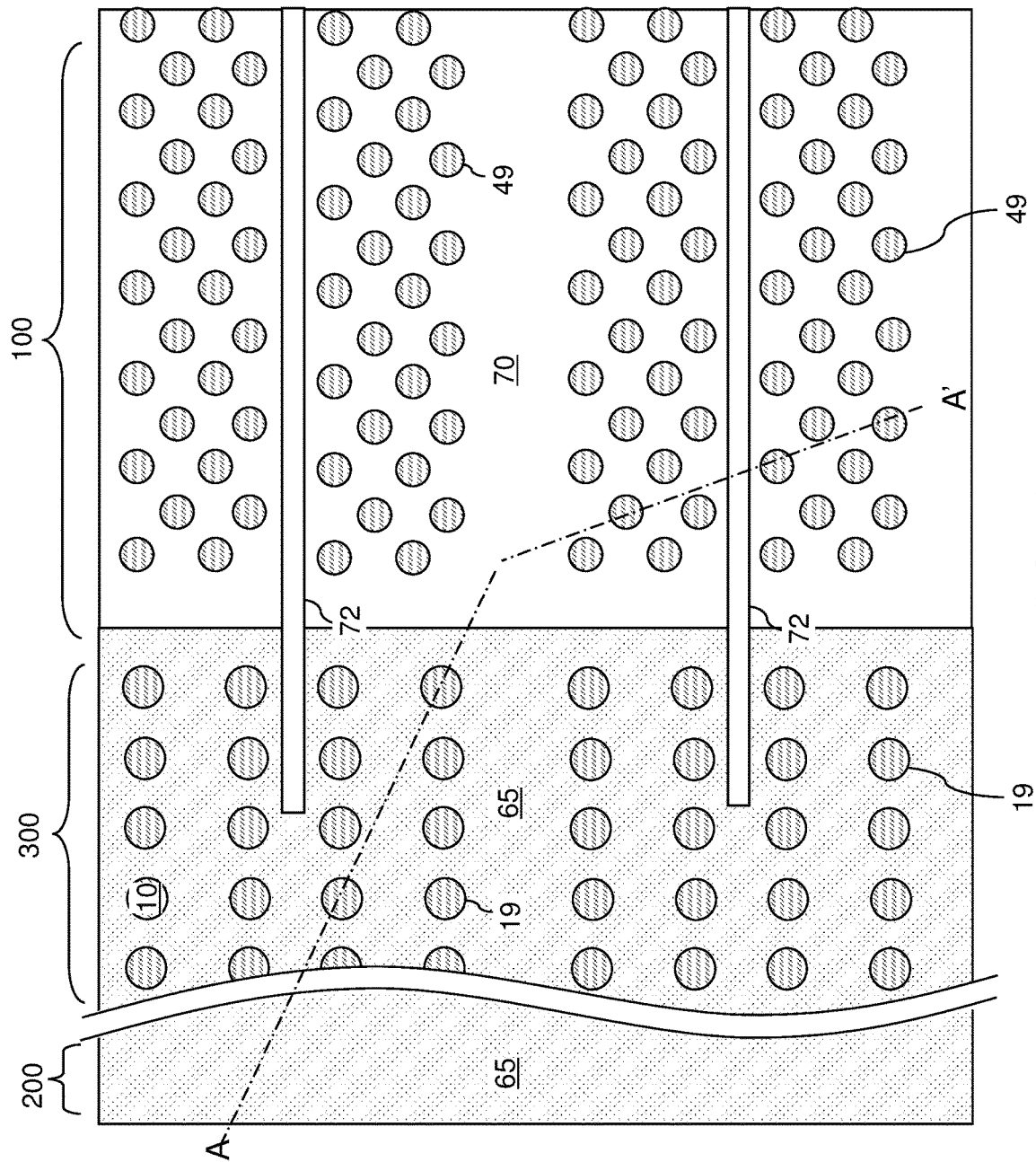
FIG. 3B is a top-down view of the first exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by performing an anisotropic etch process that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The anisotropic etch process can include a series of anisotropic etch steps that sequentially etch the materials of the stepped dielectric material portion 65 and the alternating stack (32, 42), the semiconductor material of the semiconductor material layer 14, and the dielectric material of the dielectric spacer layer 12. The anisotropic etch process forms memory openings 49 in the memory array region 100, and forms support openings 19 in the staircase region 300.

In one embodiment, the anisotropic etch process may comprise a first anisotropic etch step that etches the materials of the stepped dielectric material portion 65 and the alternating stack (32, 42), a second anisotropic etch step that etches the semiconductor material of the semiconductor material layer 14, and a third anisotropic etch step that etches the dielectric material of the dielectric spacer layer 12. In one embodiment, the first anisotropic etch process may indiscriminately etch the materials of the stepped dielectric material portion 65, the insulating layers 32, and the sacrificial material layers 42. A terminal portion of the first anisotropic etch process may be selective to the semiconductor material of the semiconductor material layer 14.

According to an aspect of the present disclosure, the second anisotropic etch step that etches the semiconductor material of the semiconductor material layer 14 may have an etch chemistry that etches the semiconductor material with the taper angle. In other words, the second anisotropic etch step forms sloped sidewalls of the memory openings 49 and the support openings 49 while etching through the semiconductor material layer 14. The taper angle of the sloped sidewalls of the semiconductor material layer 14 around the memory openings 49 and the support openings 19 may be in a range from 3 degrees to 25 degrees, such as from 5 degrees to 15 degrees, although lesser and greater taper angles may also be employed. The taper angles are measures with respect to the vertical direction. Generally, the taper angle of the sloped sidewalls of the semiconductor material layer 14 around the memory openings 49 and the support openings 19 and the thickness of the semiconductor material layer 14 may be selected such that the diameter or the minor axis of a horizontal cross-sectional shape of each memory opening 49 in a horizontal plane including an interface between the dielectric spacer layer 12 and the semiconductor material layer 14 is not greater than twice the sum of the thickness of a memory film to be formed and the thickness of a vertical semiconductor channel material to be subsequently formed within each memory opening 49. For example, the diameter or the minor axis of a horizontal cross-sectional shape of each memory opening 49 in the horizontal plane including the interface between the dielectric spacer layer 12 and the semiconductor material layer 14 may be in a range from 30 nm to 120 nm, such as from 40 nm to 80 nm, although lesser and greater dimensions may also be employed.

The third to anisotropic etch step that extends the memory openings 49 and the support openings 19 through the dielectric spacer layer 12 may have an etch chemistry that etches the dielectric material of the dielectric spacer layer 12 while forming a vertical or substantially vertical sidewall around each portion of the memory openings 49 and the support openings 19 that extends through the dielectric spacer layer 12. The patterned lithographic material stack can be subsequently removed, for example, by ashing.

The memory openings 49 and the support openings 19 can extend from the top surface of the alternating stack (32, 42) to at least the horizontal plane including the topmost surface of the carrier substrate 9. In one embodiment, physically exposed to portions of the carrier substrate 9 may be vertically recessed from the un-recessed top surface of the carrier substrate 9 by a recess depth. The recess depth can be, for example, in a range from 1 nm to 50 nm, although lesser and greater recess depths can also be used. A two-dimensional array of memory openings 49 can be formed in the memory array region 100. A two-dimensional array of support openings 19 can be formed in the staircase region 300. Optionally, an isotropic wet etch may be conducted to widen the diameter of the support openings 19 and the memory openings 49 after the anisotropic etches.

Figure 4:
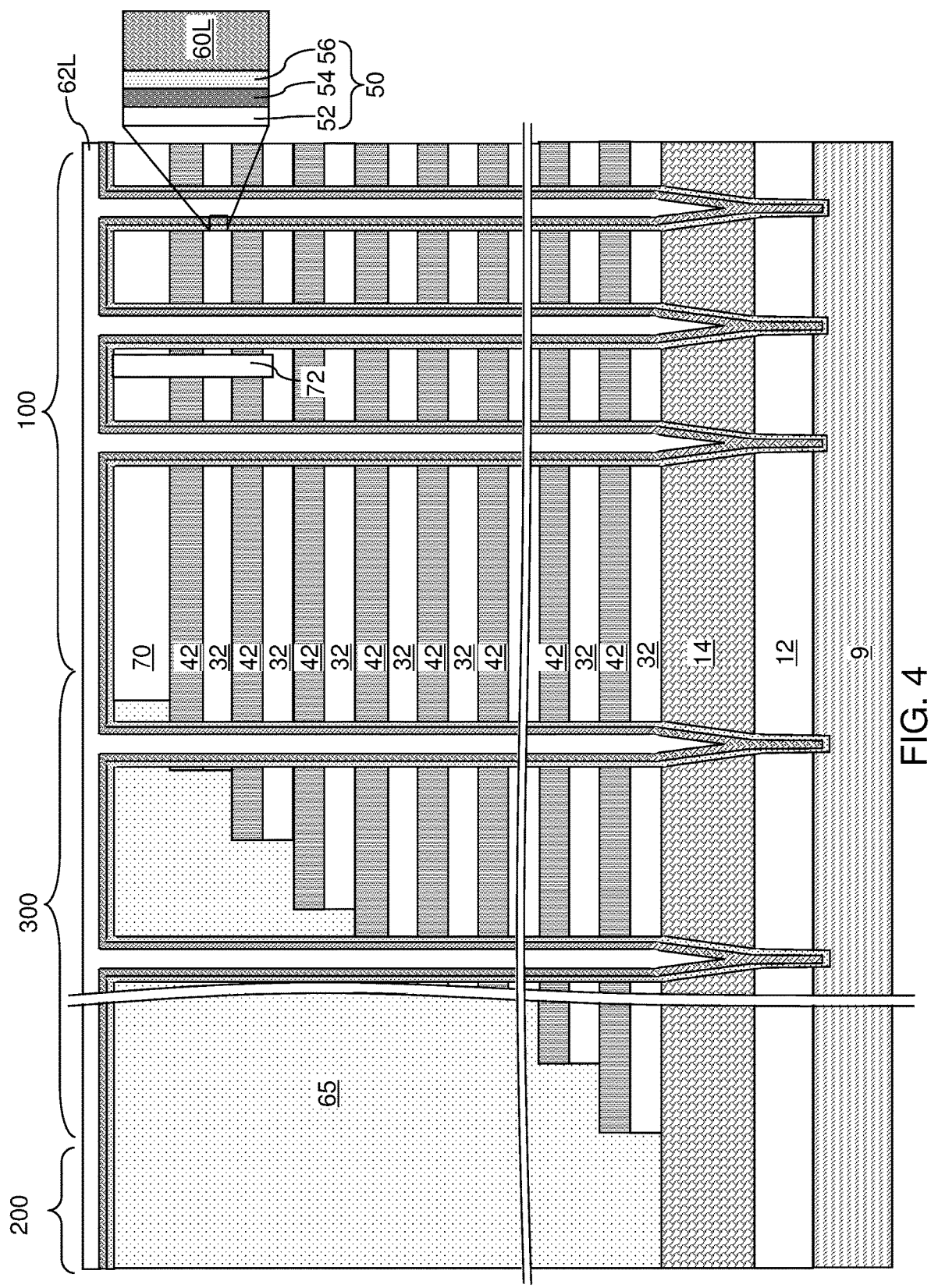
FIG. 4 is a schematic vertical cross-sectional view of the first exemplary structure after deposition of a memory film, semiconductor channel material layer, and a dielectric core material layer of memory openings and support openings according to an embodiment of the present disclosure.

Referring to FIG. 4, a memory film 50 and a semiconductor channel material layer 60L can be sequentially deposited in the memory openings 49 and the support openings 19. In one embodiment, the memory film 50 comprises a stack of layers including a blocking dielectric layer 52, a charge storage layer 54, a tunneling dielectric layer 56.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer. The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

According to an aspect of the present disclosure, the thickness of the memory film 50 and the lateral dimensions of the memory openings 49 at the level of the dielectric spacer layer 12 can be selected such that a vertically-extending continuous cavity is present within each memory opening 49 between the horizontal plane including the bottom surface of the dielectric spacer layer 12 and the horizontal plane including the top surface of the dielectric spacer layer 12. In other words, each of the memory openings 49 comprises an empty cylindrical volume at the level of the dielectric spacer layer 12.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. The semiconductor material of the semiconductor channel material layer 60L may be intrinsic (i.e., not intentionally doped) or may be doped with a doping of a first-conductivity-type, which may be p-type or n-type. The atomic concentration of dopants of the first conductivity in the semiconductor channel material layer 60L may be in a range from $1.0 \times 10^{14}/cm^3$ to $1.0 \times 10^{18}/cm^3$, although lesser and greater atomic concentrations may also be employed. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

According to an aspect of the present disclosure, each empty cylindrical volume of the memory openings 49 located at the level of the dielectric spacer layer 12 and laterally surrounded by a respective tubular portion of the memory film 50 is filled with the semiconductor channel material layer 60L. Within each memory opening 49, an elongated empty volume laterally bounded by an inner sidewall of the semiconductor channel material layer 60L is provided. Each such elongated empty volume comprises a tapered bottom region having an inverted conical shape. Tapered surface segments of an inner sidewall of the semiconductor channel material layer 60L merge at an apex of the inverted conical shape. According to an aspect of the present disclosure, the apexes of the inverted conical shapes of the tapered bottom regions of the elongated empty volumes within the memory openings 49 are located above the horizontal plane including the bottom surface of the semiconductor material layer 14 and below the horizontal plane including the top surface of the semiconductor material layer 14.

A dielectric core layer 62L can be deposited in the elongated empty volumes within the memory openings 49 and the support openings 19. The dielectric core layer 62L includes a dielectric material such as silicon oxide or organosilicate glass. The dielectric core layer 62L can be deposited by a conformal deposition method such as low pressure chemical vapor deposition (LPCVD), atomic layer deposition (ALD), or by a self-planarizing deposition process such as spin coating.

Figure 5:
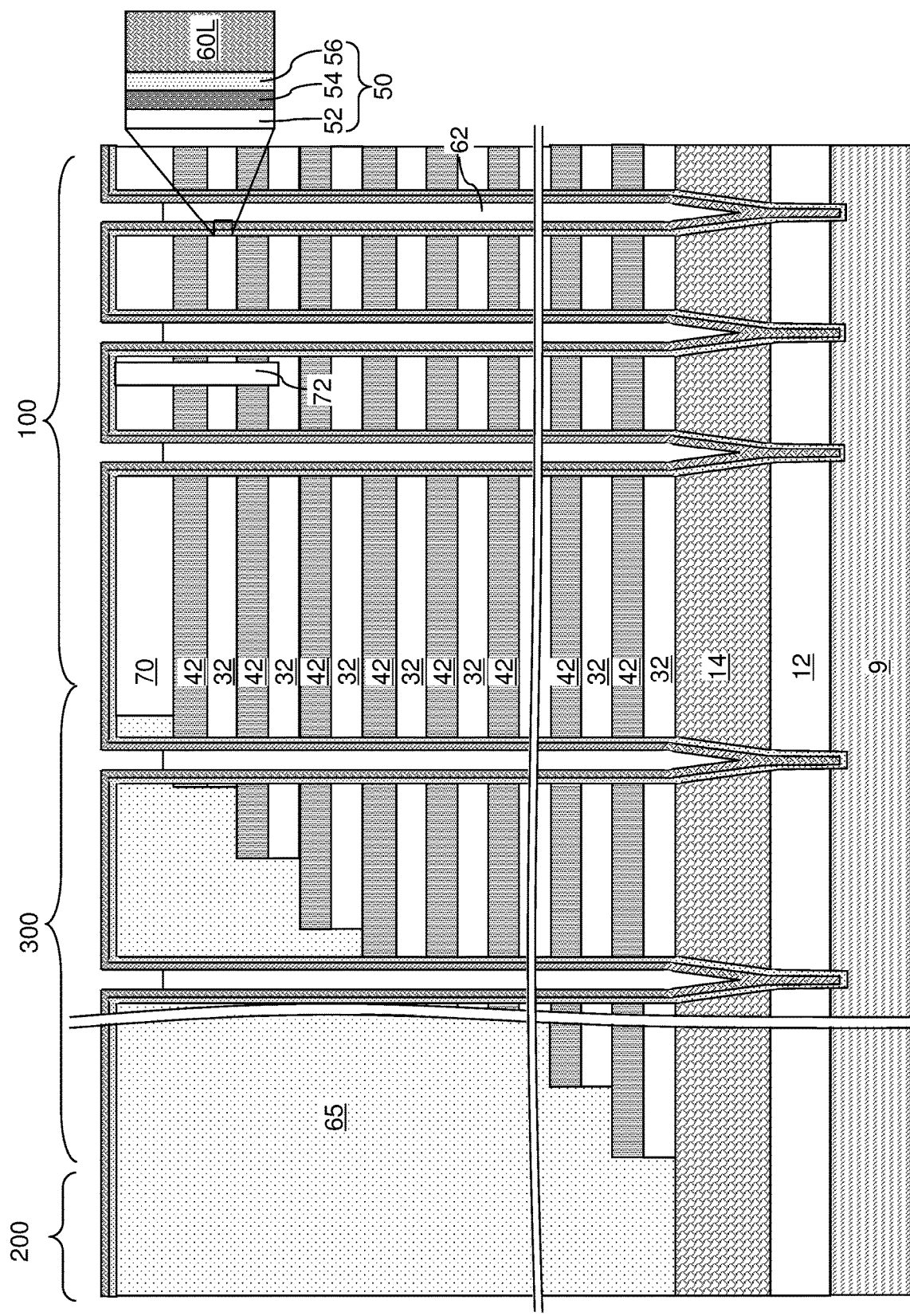
FIG. 5 is a schematic vertical cross-sectional view of the first exemplary structure after deposition of a memory film, semiconductor channel material layer, and a dielectric core material layer of memory openings and support openings according to an embodiment of the present disclosure.

Referring to FIG. 5, the dielectric core layer 62L can be recessed selective to the material of the semiconductor channel material layer 60L, for example, by a recess etch. The material of the dielectric core layer 62L is vertically recessed below the horizontal plane core layer 62L constitutes a dielectric core 62.

Figure 6:
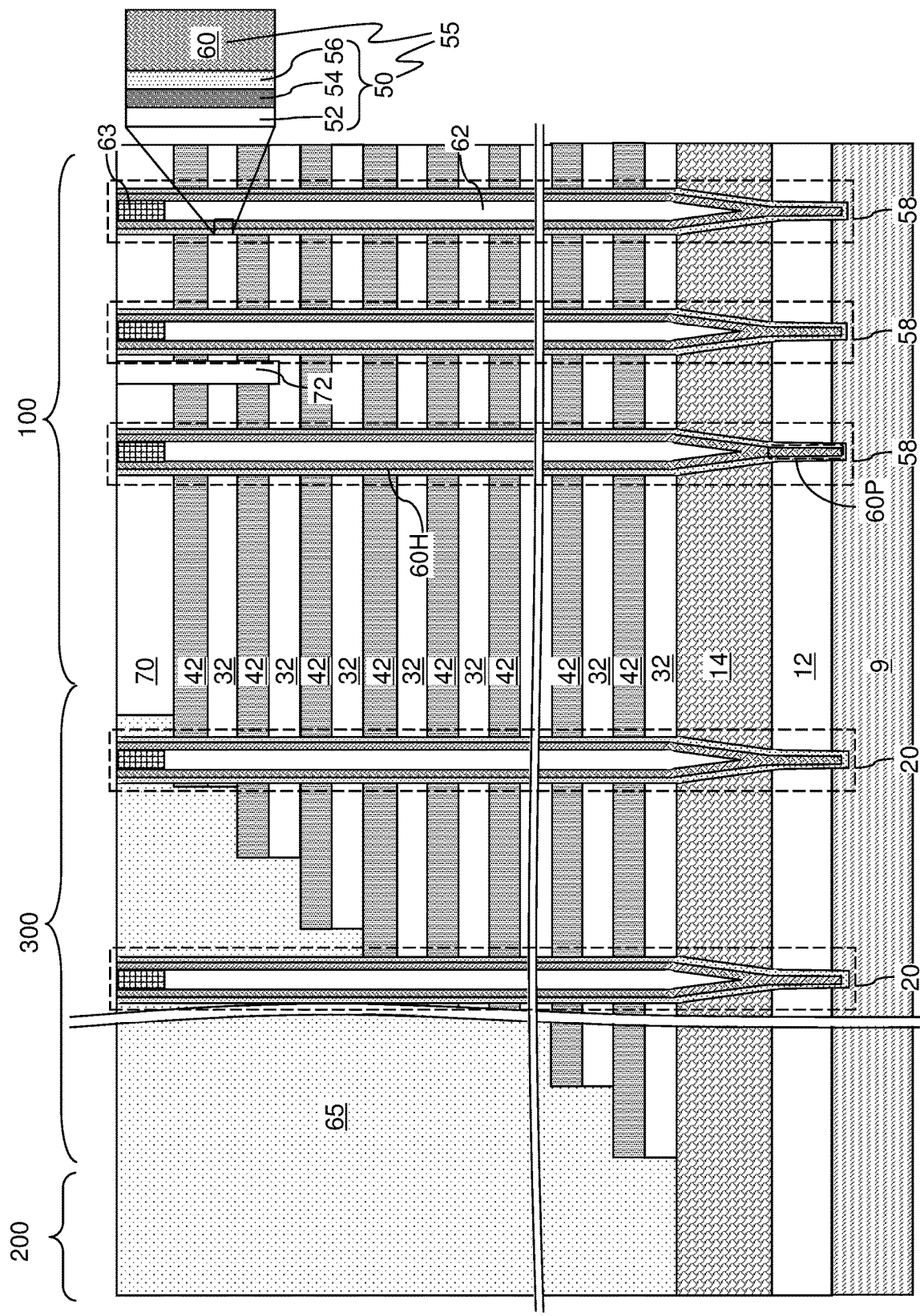
FIG. 6 is a schematic vertical cross-sectional view of the first exemplary structure after formation of memory opening fill structures and support pillar structures according to an embodiment of the present disclosure.

Referring to FIG. 6, a semiconductor material having a doping of a second conductivity type can be deposited in the recess regions that overlie the dielectric cores 62. The second conductivity type that is the opposite of the first conductivity type. For example, if the first conductivity type is p-type, the second conductivity type is n-type, and vice versa. The atomic concentration of dopants of the second conductivity type in the deposited semiconductor material can be in a range from $5.0 \times 10^{18}/cm^3$ to $2.0 \times 10^{21}/cm^3$, although lesser and greater atomic concentrations can also be used. The doped semiconductor material can be, for example, doped poly silicon.

Portions of the deposited semiconductor material, the semiconductor channel material layer 60L, and the memory film 50 that are located above the horizontal plane including the top surface of the insulating cap layer 70 can be removed by a planarization process. For example, a chemical mechanical polishing (CMP) process or a recess etch process may be employed to remove material portions that overlie the horizontal plane including the top surface of the insulating cap layer 70. Each remaining portion of the doped semiconductor material having a doping of the second conductivity type constitutes a drain region 63. Each remaining portion of the semiconductor channel material layer 60L that remains in a respective memory opening 49 or in a respective support opening 19 constitutes a vertical semiconductor channel 60. The memory film 50 is divided into a plurality of memory films 50 located within a respective one of the memory openings 49 and the support openings 19.

Electrical current can flow through each vertical semiconductor channel 60 when a vertical NAND device including the vertical semiconductor channel 60 is turned on. Within each memory opening 49, a tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 constitutes a memory stack structure 55.

Each memory stack structure 55 is a combination of a semiconductor channel, a tunneling dielectric layer, a plurality of memory elements comprising portions of the charge storage layer 54, and an optional blocking dielectric layer 52. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 constitutes a support pillar structure 20.

An instance of a memory opening fill structure 58 can be formed within each memory opening 49. An instance of the support pillar structure 20 can be formed within each support opening 19. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50 and/or for the vertical semiconductor channel 60.

Generally, memory opening fill structures 58 are formed in the memory openings 49. Each of the memory stack structures 58 comprises a respective memory film 50 and a respective vertical semiconductor channel 60. According to an aspect of the present disclosure, each vertical semiconductor channel 60 includes a solid semiconductor (e.g., silicon) pillar portion 60P that vertically extends through the dielectric spacer layer 12 and has no hollow space inside. In one embodiment, each of the memory opening fill structures 58 comprises a respective dielectric core 62 that is laterally surrounded by the respective vertical semiconductor channel 60. The dielectric core 62 does not extend inside the pillar portion 60P, and the pillar portion 60P does not surround the dielectric core 62. Each vertical semiconductor channel 60 also includes a hollow portion 60H which surrounds the dielectric core 62.

In one embodiment, each of the memory openings 49 has a tapered-segment-containing vertical cross-sectional profile such that each of the memory openings 49 has a lesser lateral dimension at an interface between the semiconductor material layer 14 and the dielectric spacer layer 12 than at an interface between the semiconductor material layer 14 and the alternating stack (32, 42). As used herein, a "tapered-segment-containing vertical cross-sectional profile" refers to a vertical cross-sectional profile that includes at least one tapered segment within the vertical cross-sectional profile. In the exemplary structure, a vertical cross-sectional profile of a memory opening 49 has a tapered sidewall of the semiconductor material 14 as a tapered segment of the vertical cross-sectional profile.

In one embodiment, each of the dielectric cores 62 has a respective conical portion embedded within the semiconductor material layer 14. The conical portion may be located between the horizontal plane including the interface between the semiconductor material layer 14 and the dielectric spacer layer 12 and the horizontal plane including the interface between the semiconductor material layer 14 and the alternating stack (32, 42). In one embodiment, the respective conical portion has a respective apex that is more proximal to the vertical plane including the topmost surface of the alternating stack (32, 42) than the dielectric spacer layer 12 is to the vertical plane including the topmost surface of the alternating stack (32, 42).

In one embodiment, each of the memory openings 49 has a sidewall including a sidewall segment of the semiconductor material layer 14 and a sidewall segment of the dielectric spacer layer 12. In one embodiment, the sidewall segment of the semiconductor material layer 14 has a greater taper angle relative to a vertical direction than the sidewall segment of the dielectric spacer layer 12 has a taper angle relative to the vertical direction. In one embodiment, the taper angle of the sidewall segment of the semiconductor material layer 14 may be in a range from 3 degrees to 25 degrees, such as from 5 degrees to 15 degrees. The taper angle of the sidewall segment of the dielectric spacer layer 12 may be in a range from 0 degrees to 5 degrees, such as from 0.2 degree to 3 degrees, and is less than the taper angle of the sidewall segment of the semiconductor material layer 14 by at least 3 degrees, such as at least 5 degrees.

Figure 7A:
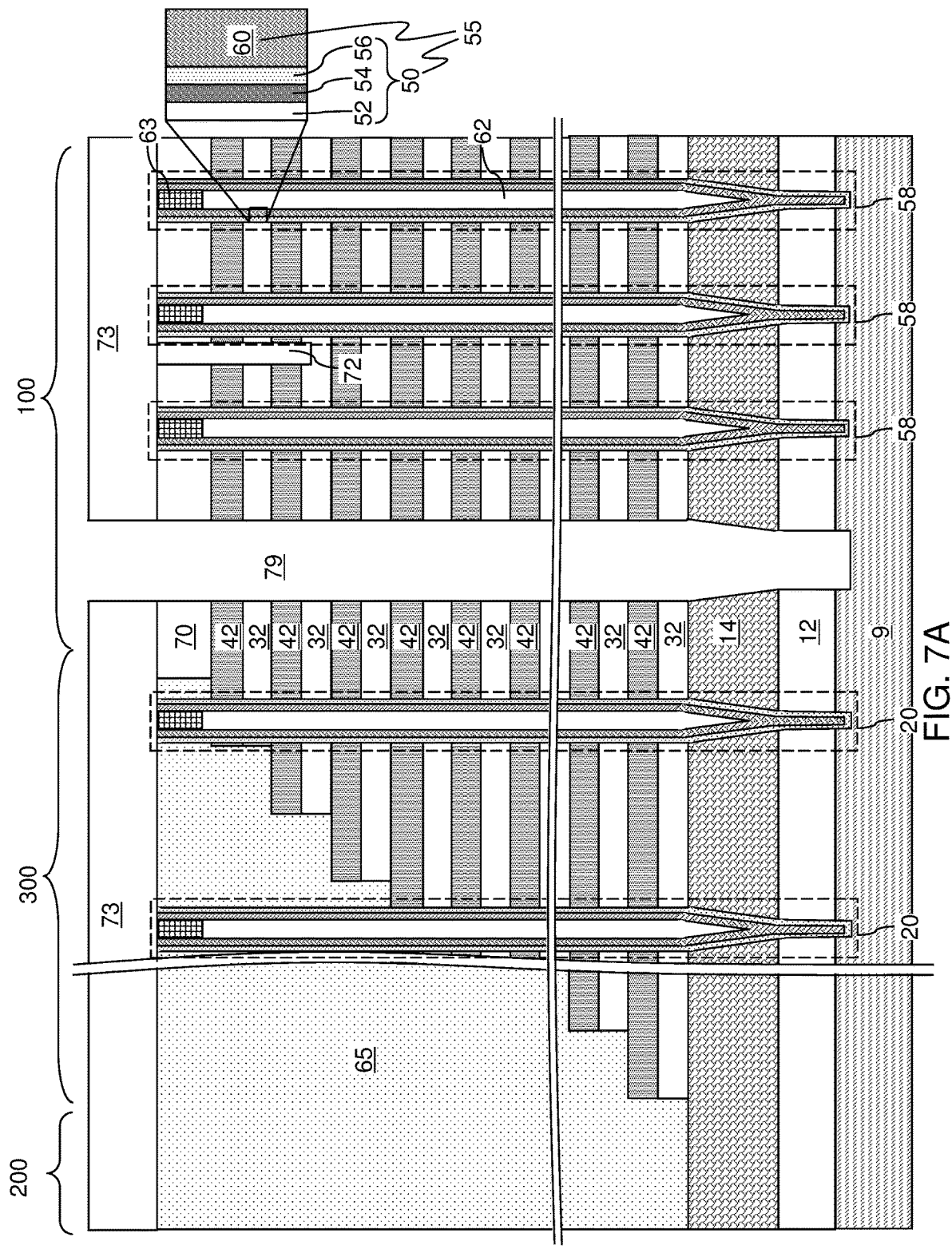
FIG. 7A is a schematic vertical cross-sectional view of the first exemplary structure after formation of backside trenches according to an embodiment of the present disclosure.
Figure 7B:
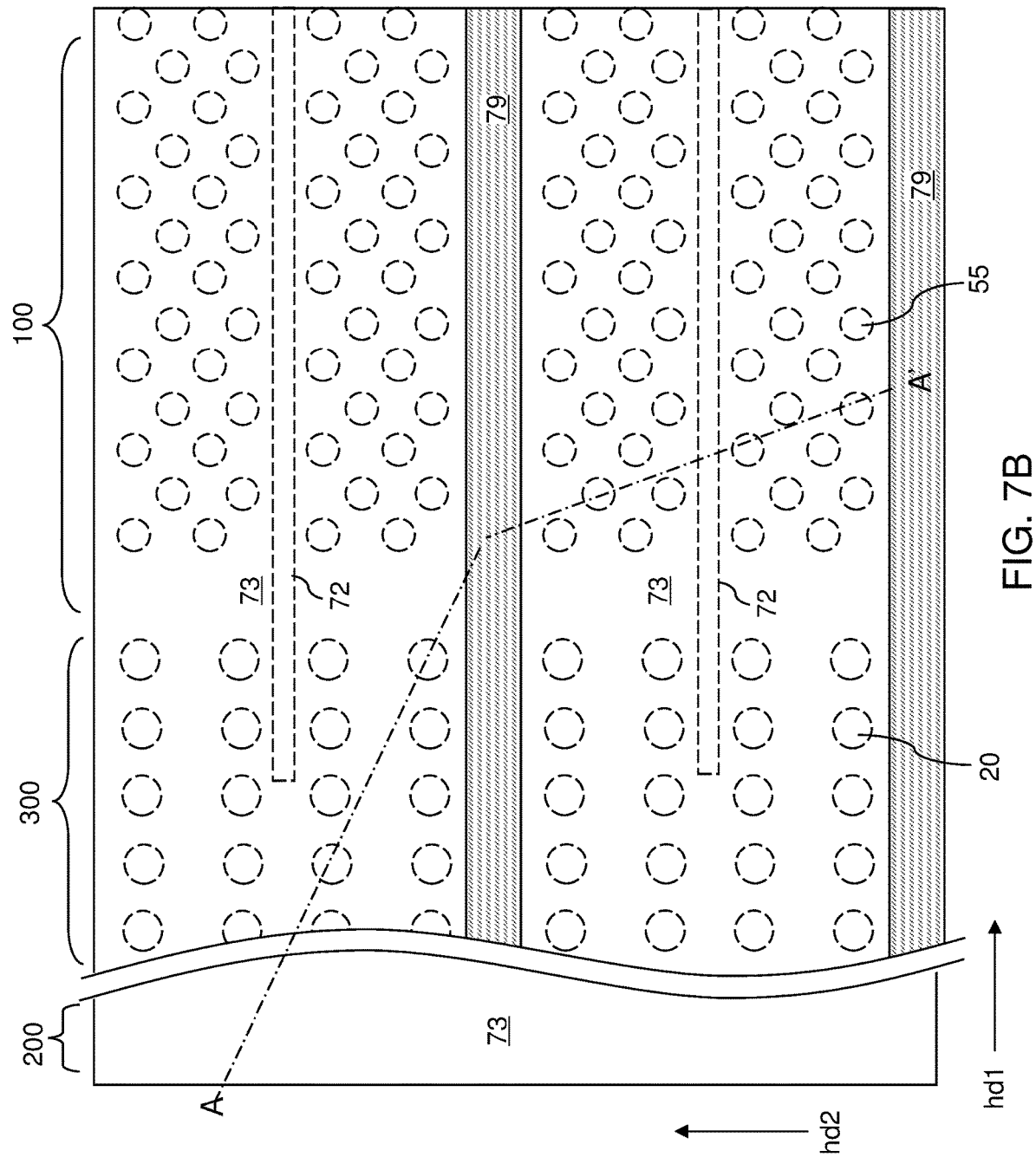
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and the stepped dielectric material portion 65, the semiconductor material layer 14, and the dielectric spacer layer 12, and into an upper portion of the carrier substrate 9 by performing an anisotropic etch process. The anisotropic etch process forms backside trenches 79, which vertically extend from the top surface of the contact level dielectric layer 73 at least to the top surface of the carrier substrate 9, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
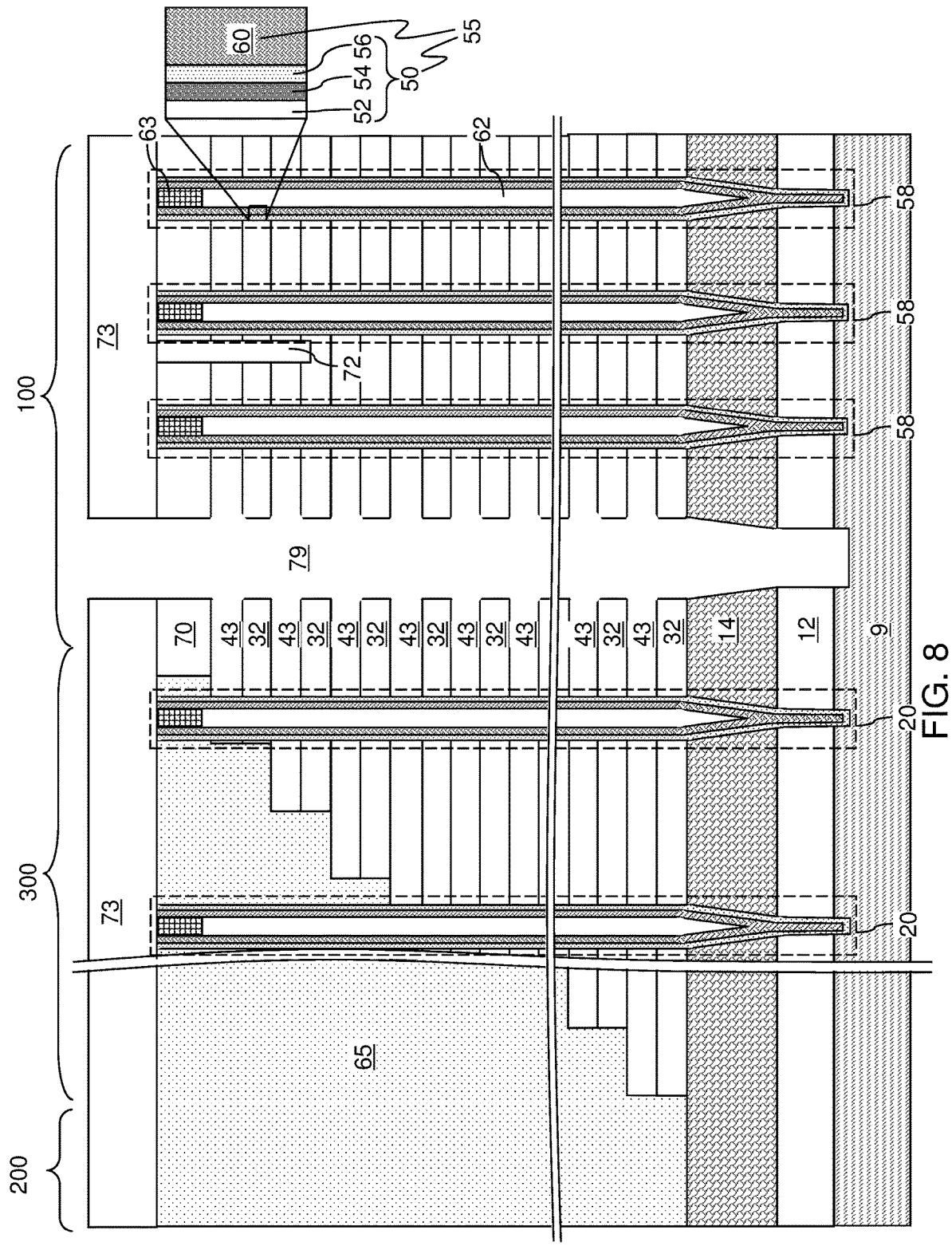
FIG. 8 is a schematic vertical cross-sectional view of the first exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 14, the material of the dielectric spacer layer 12, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials used in the art. The support pillar structure 20, the stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate semiconductor material layer 14. In this case, each backside recess 43 can define a space for receiving a respective word line of the array of monolithic three-dimensional NAND strings.

Figure 9:
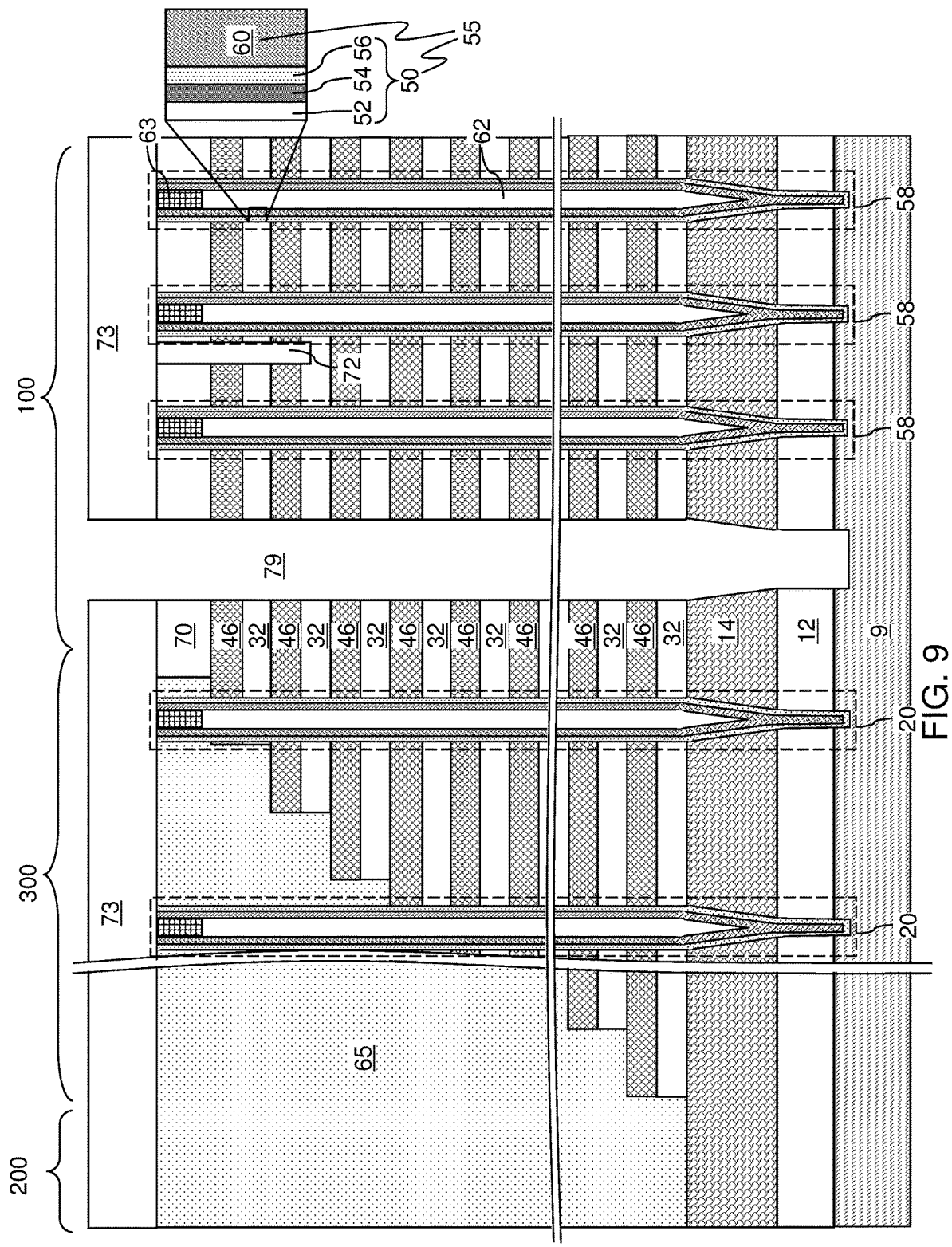
FIG. 9 is a schematic vertical cross-sectional view of the first exemplary structure after formation of electrically conductive layers according to an embodiment of the present disclosure.

Each of the plurality of backside recesses 43 can extend substantially parallel to the top surface of the substrate semiconductor material layer 14. A backside recess 43 can be vertically bounded by a top surface of an underlying insulating layer 32 and a bottom surface of an overlying insulating layer 32. In one embodiment, each backside recess 43 can have a uniform height throughout Referring to FIG. 9, a backside blocking dielectric layer (not shown) can be optionally formed by a conformal deposition process on physically exposed surfaces around the backside recesses 43 and at peripheral regions of the backside trenches 79. The backside blocking dielectric layer comprises a dielectric material such as a dielectric metal oxide. The thickness of the backside blocking dielectric layer (not shown) can be in a range from 1 nm to 15 nm, such as 2 to 6 nm, although lesser and greater thicknesses can also be used.

At least one metallic material is deposited in the plurality of backside recesses 43, on the sidewalls of the at least one the backside trench 79, and over the top surface of the contact level dielectric layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous metallic material layer (not shown) can be formed on the sidewalls of each backside trench 79 and over the contact level dielectric layer 73. Each electrically conductive layer 46 includes a portion of the metallic barrier liner and a portion of the metallic fill material layer that are located between a vertically neighboring pair of dielectric material layers such as a pair of insulating layers 32. The continuous metallic material layer (not shown) includes a continuous portion of the metallic barrier liner and a continuous portion of the metallic fill material layer that are located in the backside trenches 79 or above the contact level dielectric layer 73. Each sacrificial material layer 42 can be replaced with an electrically conductive layer 46. A backside cavity is present in the portion of each backside trench 79 that is not filled with the optional backside blocking dielectric layer and the continuous metallic material layer.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. The word lines comprise a metallic (e.g., metal or metal alloy) material. One or more topmost electrically conductive layers 46 may comprise drain side select gate electrodes of the NAND strings. The semiconductor material layer 14 may comprise the bottommost source side select gate electrode of the NAND strings. Optionally, one or more bottommost electrically conductive layers 46 may comprise additional source side select gate electrodes of the NAND strings.

Figure 10:
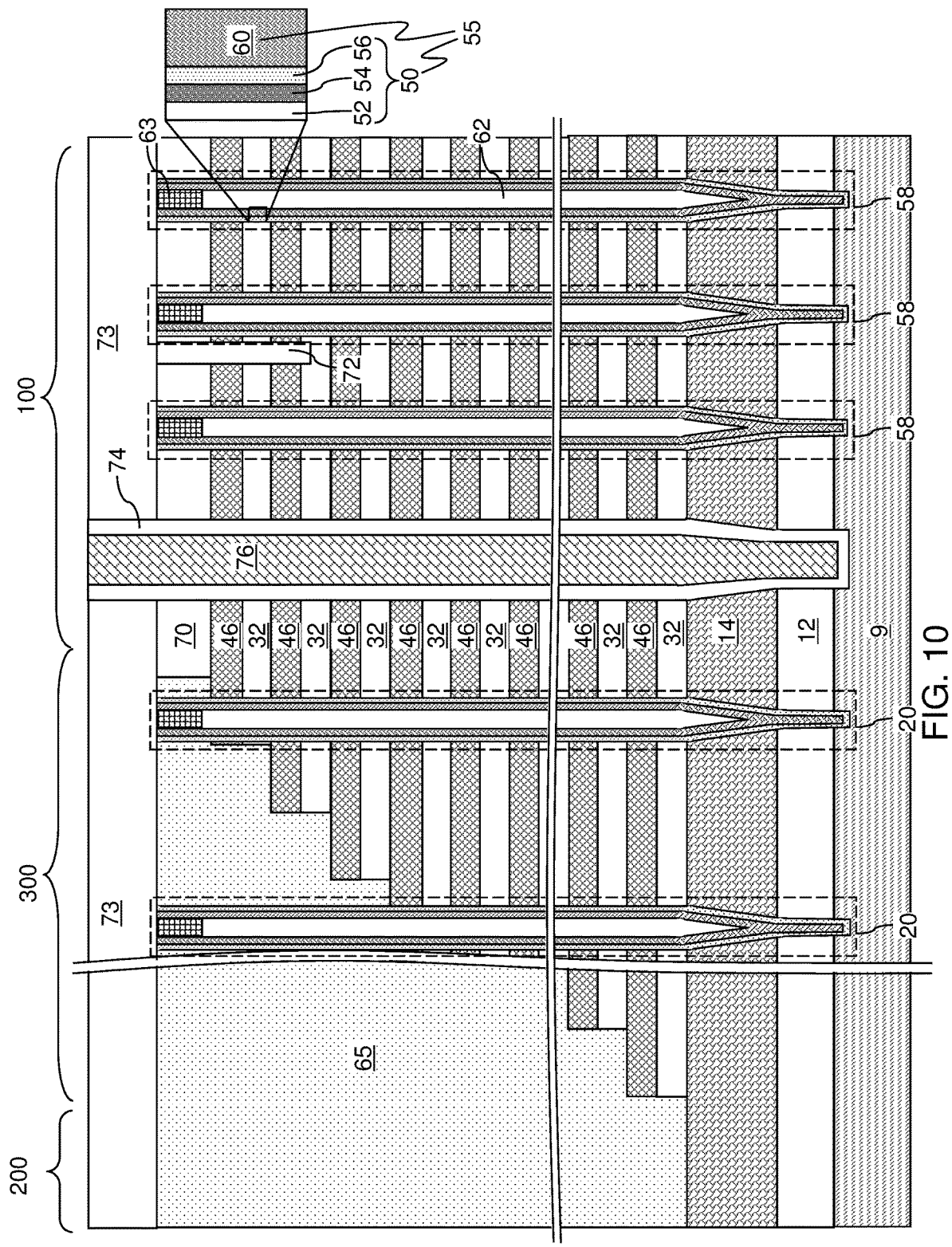
FIG. 10 is a schematic vertical cross-sectional view of the first exemplary structure after formation of backside trench fill structures according to an embodiment of the present disclosure.

Referring to FIG. 10, an insulating material such as silicon oxide can be conformally deposited at peripheral regions of the backside trenches 79. An optional conductive fill material, such as a metallic material, can be deposited in remaining volumes of the backside trenches 79 by a conformal deposition process. Portions of the insulating material and the conductive fill material that are deposited outside the backside trenches 79 can be removed by a planarization process, which may employ a chemical mechanical polishing process and/or a recess etch process. Each remaining portion of the insulating material that remains in the backside trenches 79 constitute a backside insulating spacer 74. Each remaining portion of the conductive fill material that remains in the backside trenches 79 constitutes a backside trench via structure 76.

Figure 11A:
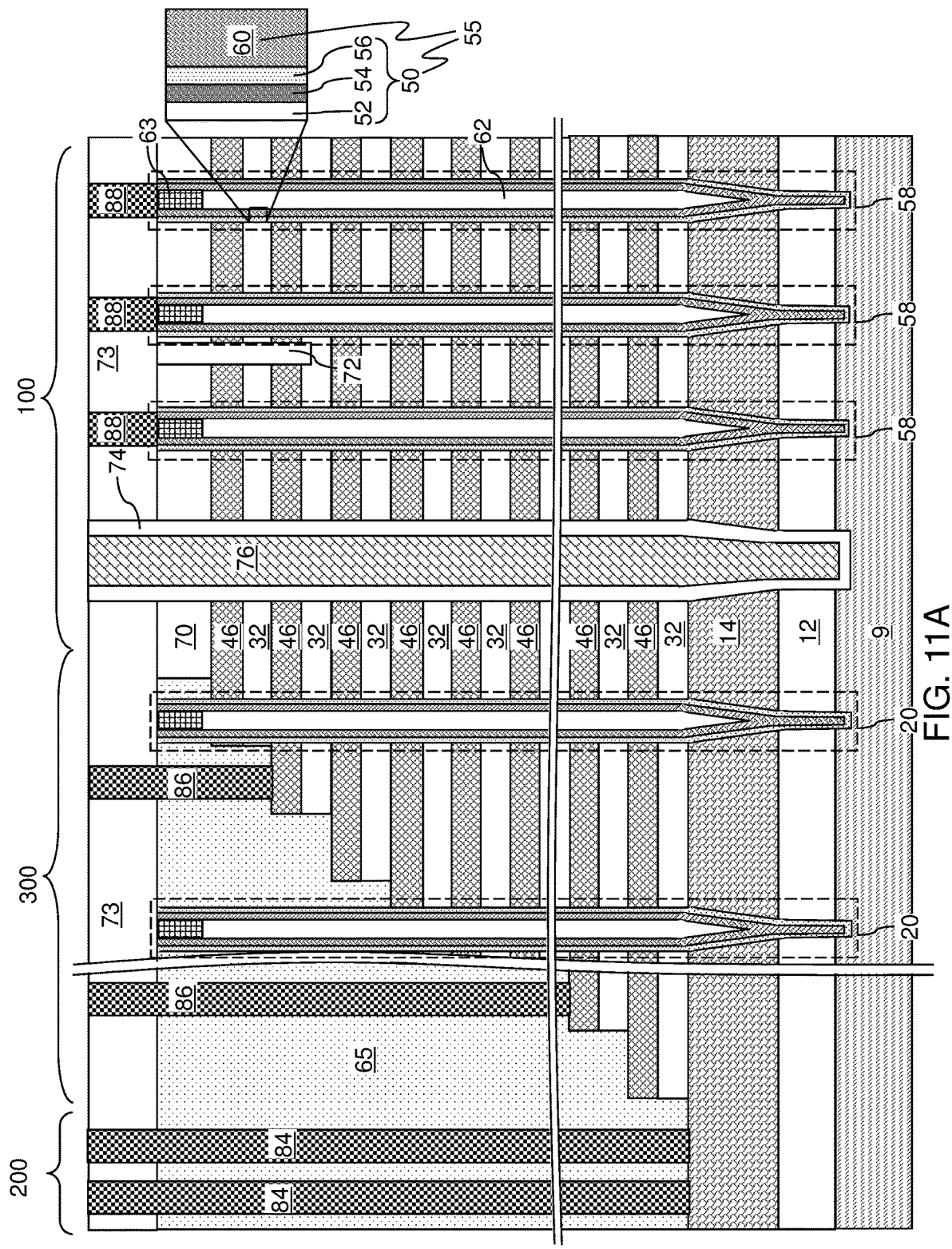
FIG. 11A is a schematic vertical cross-sectional view of the first exemplary structure after formation of contact via structures according to an embodiment of the present disclosure.
Figure 11B:
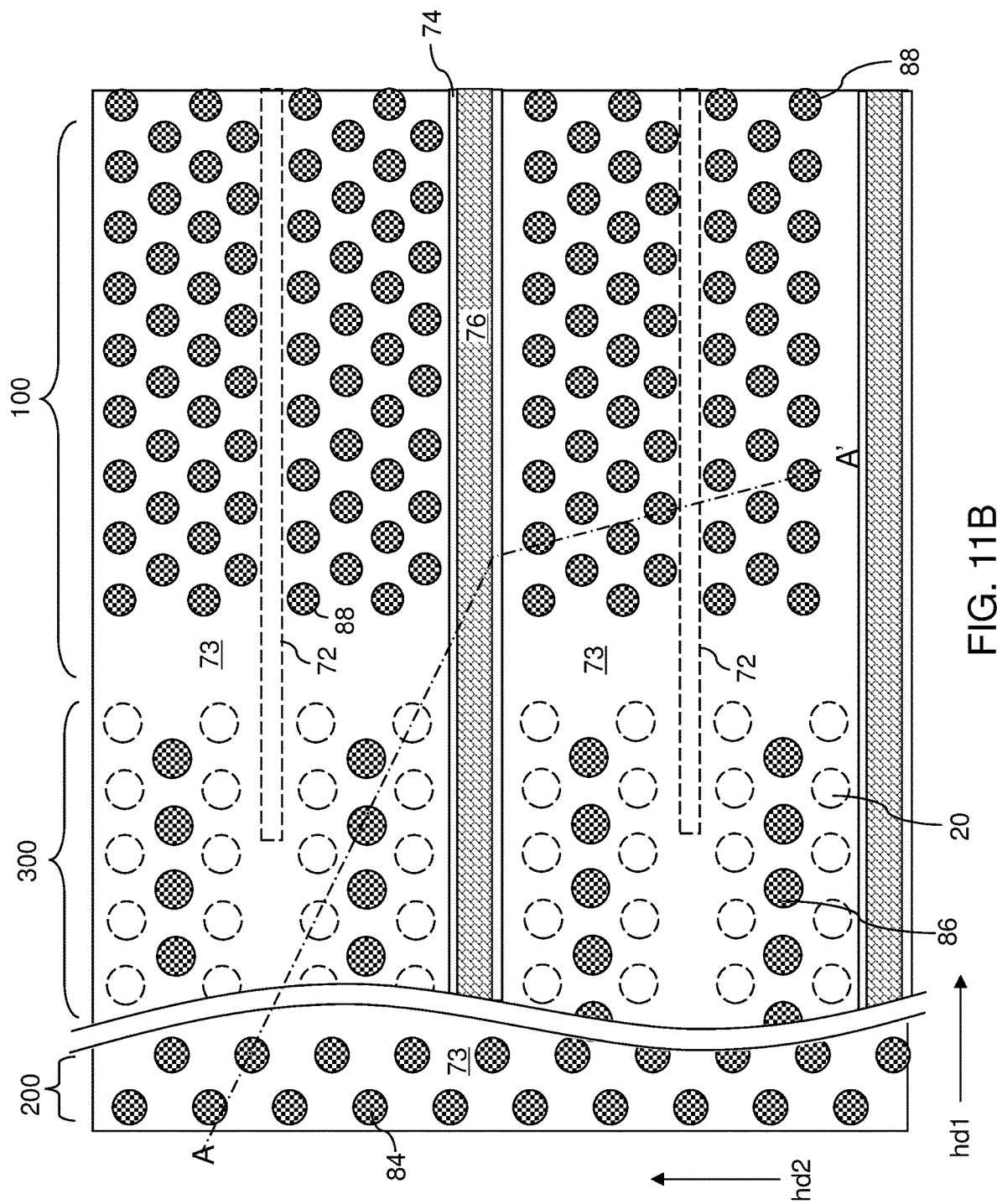
FIG. 11B is a top-down view of the first exemplary structure of FIG. 11A. The vertical plane A-A' is the plane of the schematic vertical cross-sectional view of FIG. 11A.

Referring to FIGS. 11A and 11B, contact via structures (88, 86, 84) can be formed through the contact level dielectric layer 73, and optionally through the stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the stepped dielectric material portion 65. Pass-through via structures 84 can be formed through the stepped dielectric material portion 65 and on the semiconductor material layer 14.

Figure 12:
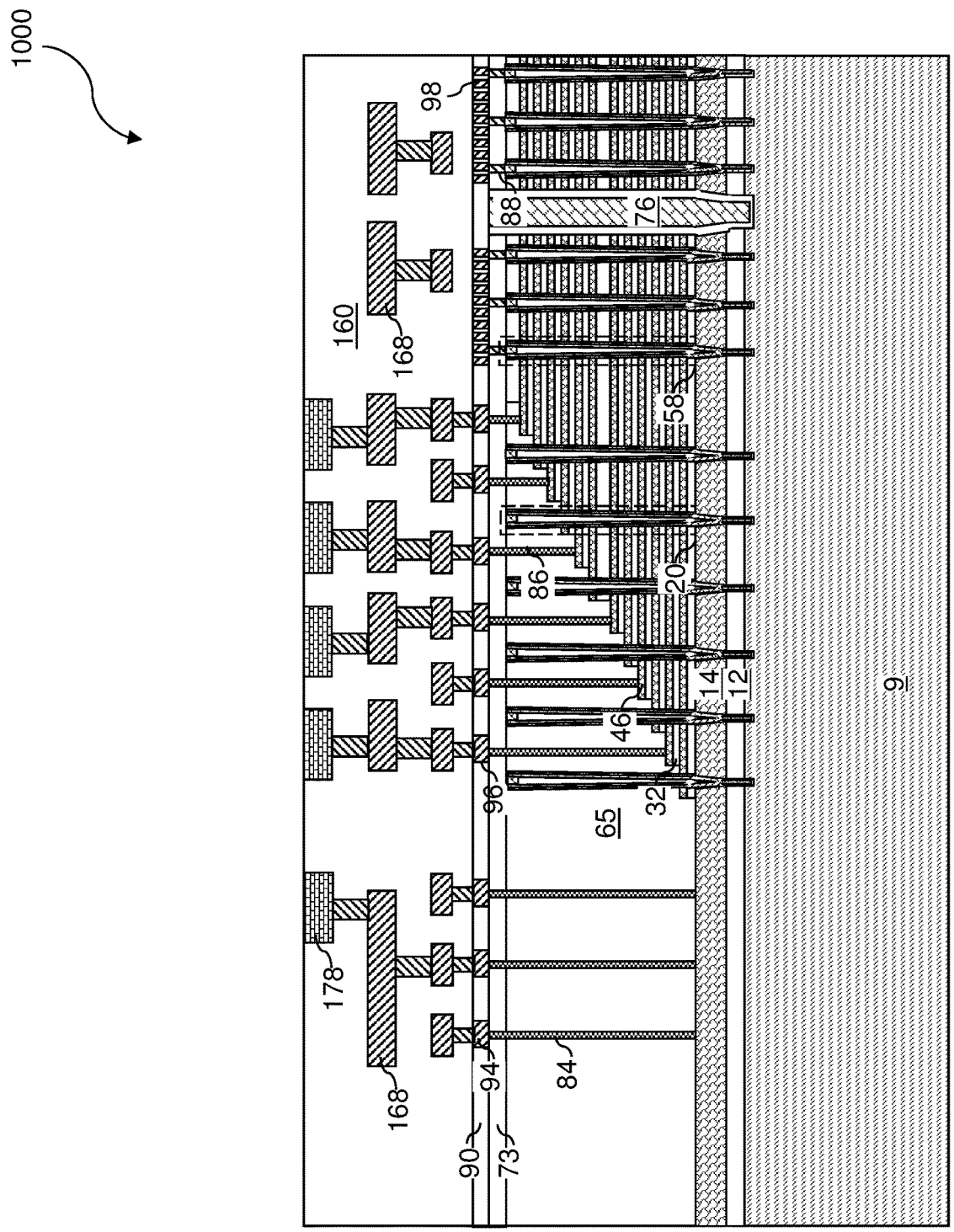
FIG. 12 is a schematic vertical cross-sectional view of the first exemplary structure that after formation of a first semiconductor die according to an embodiment of the present disclosure.

Referring to FIG. 12, a first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88, word-line-connection metal interconnect lines 96 that are electrically connected to a respective one of the word line contact via structures 86, and peripheral metal interconnect lines 94 that are electrically connected to a respective one of the pass-through via structures 84. The bit lines 98 are electrically connected to upper ends of a respective subset of the vertical semiconductor channels 60 in the memory stack structures 55 in the memory array region 100 via a respective subset of the drain regions 63. The drain regions 63 are located at end portions of the vertical semiconductor channels 60 that are distal from the semiconductor material layer 14 and the dielectric spacer layer 12. In one embodiment, the memory stack structures 55 are arranged in rows that extend along the first horizontal direction (e.g., word line direction) hd1, and the bit lines 98 laterally extend along the second horizontal direction (e.g., bit line direction) hd2.

A first semiconductor die (e.g., memory die) 1000 is provided by performing additional processing steps on the exemplary structure. Specifically, additional metal interconnect structures 168 included in additional interconnect level dielectric layers 160 are formed. In an illustrative example, the additional interconnect level dielectric layers 160 can include a via level dielectric layer, a second line level dielectric layer, a second via level dielectric layer, and a metallic pad structure level dielectric layer 140. The metal interconnect structures 168 can include first metal via structures included in the first via level dielectric layer, second metal line structures included within the second line level dielectric layer, second metal via structures included in the second via level dielectric layer, and first bonding structures 178 (such as metallic pad structures) included in the metallic pad structure level dielectric layer 140. While the present disclosure is described using an example in which the additional interconnect level dielectric layers 160 include the first via level dielectric layer, the second line level dielectric layer, the second via level dielectric layer, and the metallic pad structure level dielectric layer, embodiments are expressly contemplated herein in which the additional interconnect level dielectric layers 160 include a different number and/or different combinations of dielectric material layers. The first semiconductor die 1000 may be a memory die that includes a three-dimensional array of memory elements. Electrical connection paths can be provided by each combination of a first bonding structure 178 and a respective set of metal interconnect structures.

Figure 13:
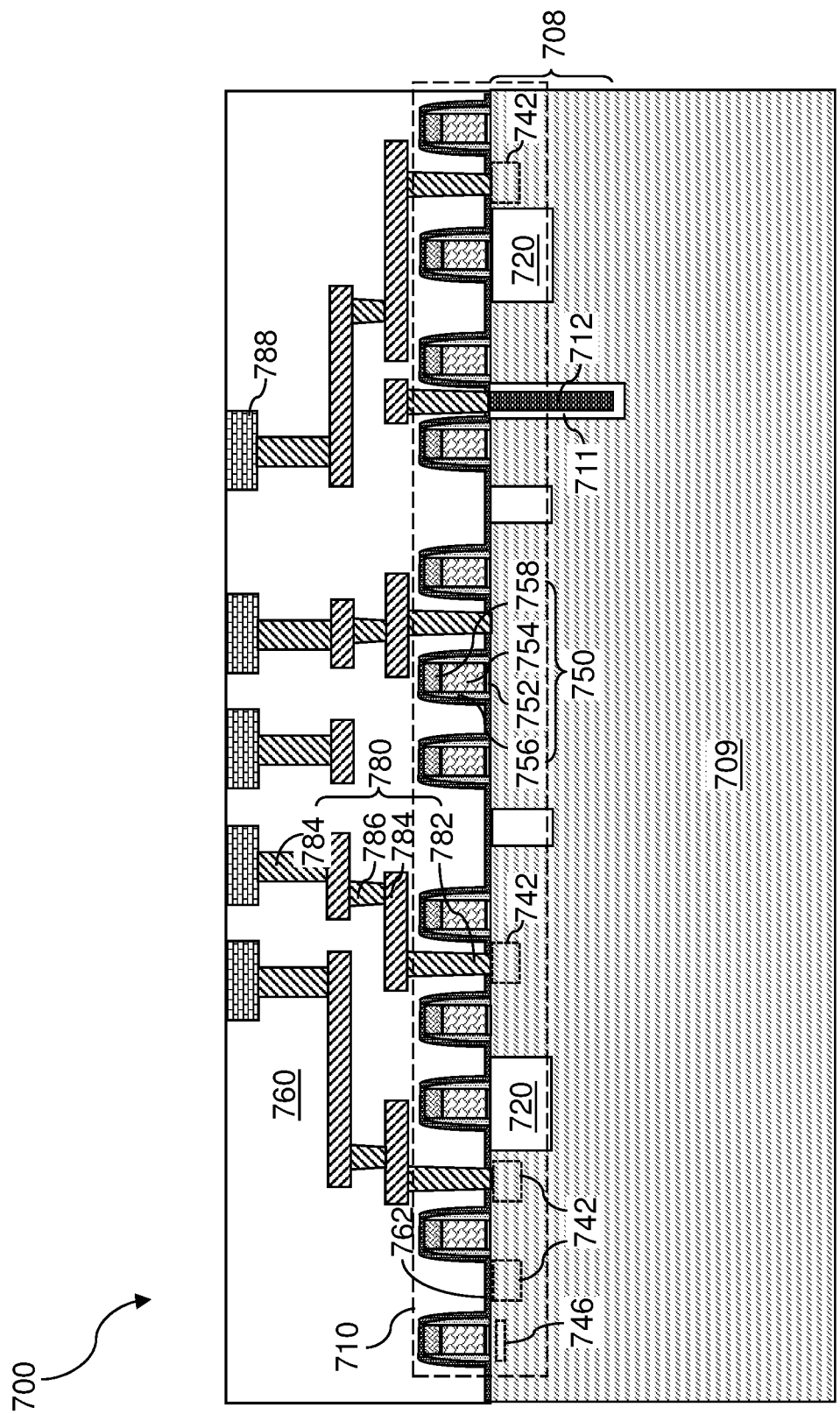
FIG. 13 is a schematic vertical cross-sectional view of a second semiconductor die according to an embodiment of the present disclosure.

Referring to FIG. 13, a second semiconductor die 700 can be provided, which can be a logic die including various semiconductor devices 710. In one embodiment, the second semiconductor die 700 comprises a peripheral (e.g., driver) circuitry containing peripheral devices configured to control operation of the three-dimensional array of memory elements in the first semiconductor die 1000. The peripheral circuitry can include a word line driver that drives the electrically conductive layers (e.g., word lines) 46 within the first semiconductor die 1000, a bit line driver that drives the bit lines 98 in the first semiconductor die 1000, a word line decoder circuitry that decodes the addresses for the electrically conductive layers 46, a bit line decoder circuitry that decodes the addresses for the bit lines 98, a sense amplifier circuitry that senses the states of memory elements within the memory stack structures 55 in the first semiconductor die 1000, a power supply/distribution circuitry that provides power to the first semiconductor die 1000, a data buffer and/or latch, and/or any other semiconductor circuitry that can be used to operate the array of memory stack structures 58 in the first semiconductor die 1000.

The second semiconductor die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. In one embodiment, combinations of a through-substrate insulating liner 711 and a through-substrate connection via structure 712 may be formed in an upper portion of the substrate semiconductor layer 709.

Shallow trench isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the first semiconductor die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and second bonding structures 788 (such as metallic pad structures) that may be configured to function as bonding pads. Generally, the second semiconductor die 700 comprises second bonding structures 788 that overlie, and are electrically connected to, the semiconductor devices 710.

Figure 14A:
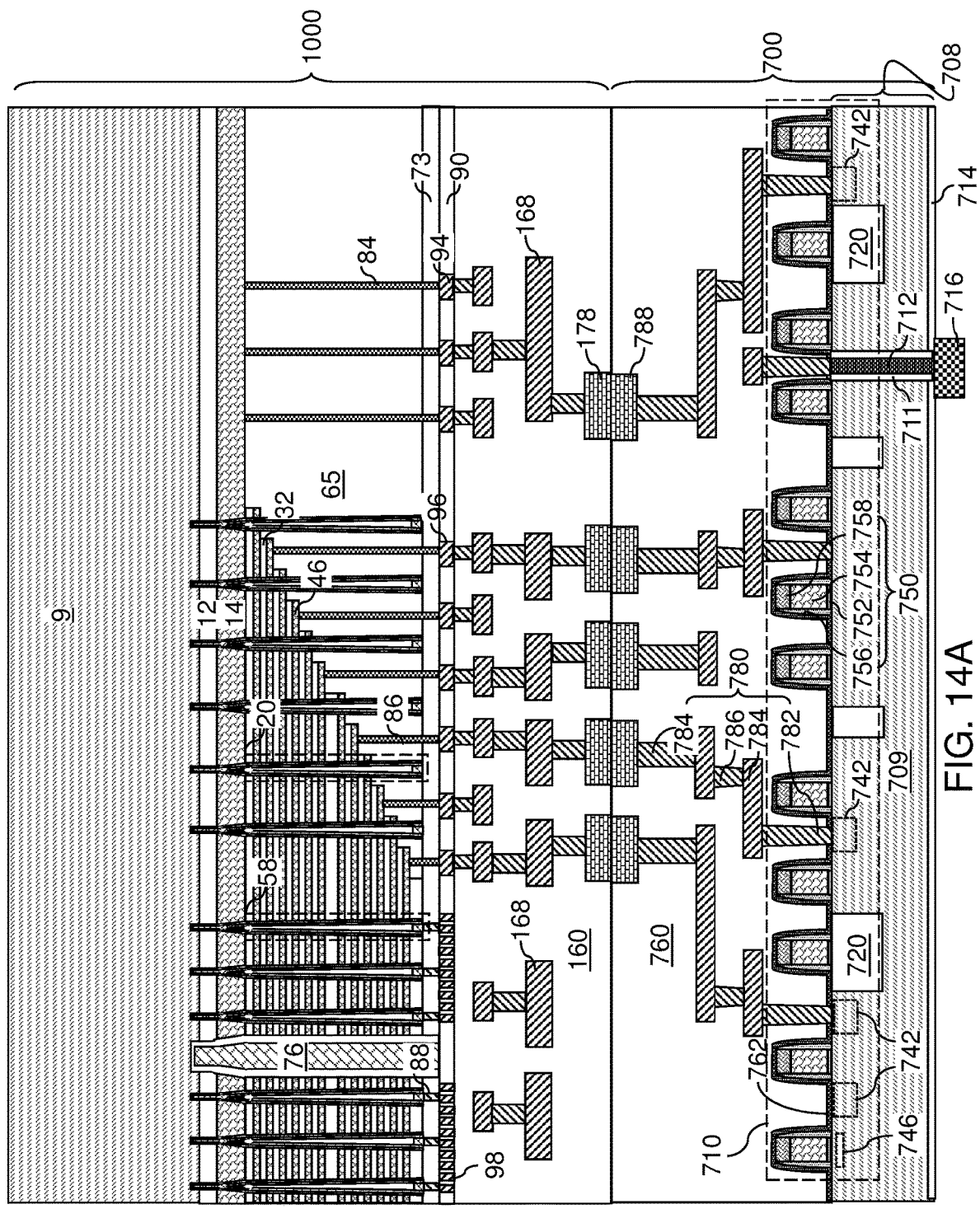
FIG. 14A is a schematic vertical cross-sectional view of a first exemplary bonded assembly of the first semiconductor die and the second semiconductor die according to an embodiment of the present disclosure.
Figure 14B:
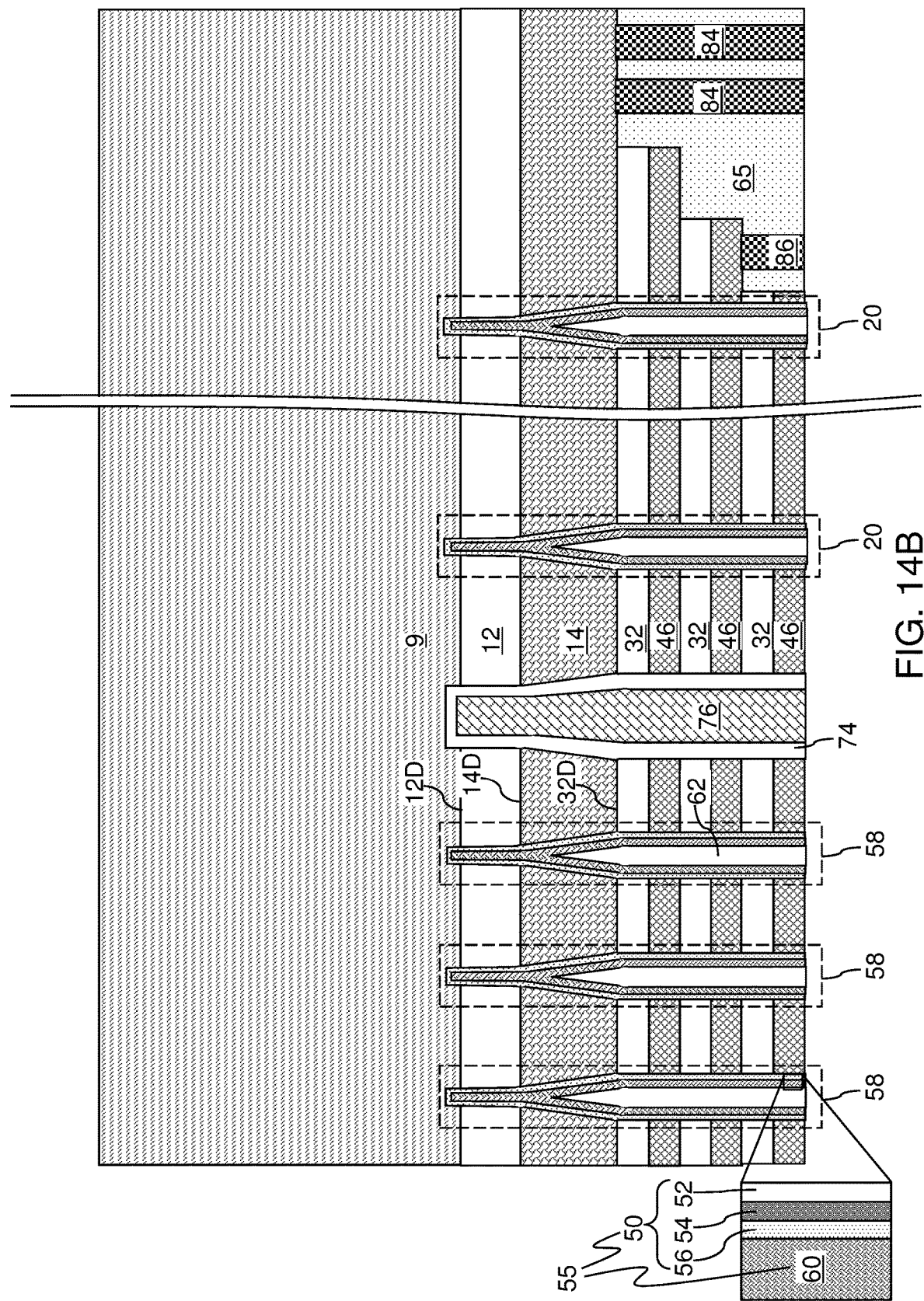
FIG. 14B is a magnified view of a region of the first exemplary bonded assembly of FIG. 14A.

Referring to FIGS. 14A and 14B, the first semiconductor die 1000 and the second semiconductor die 700 are positioned such that the second bonding structures 788 of the second semiconductor die 700 face the first bonding structures 178 of the first semiconductor die 1000. In one embodiment, the first semiconductor die 1000 and the second semiconductor die 700 can be designed such that the pattern of the second bonding structures 788 of the second semiconductor die 700 is the mirror pattern of the pattern of the first bonding structures 178 of the first semiconductor die 1000. The first semiconductor die 1000 and the second semiconductor die 700 can be bonded to each other by metal-to-metal bonding. Alternatively, an array of solder material portions may be used to bond the first semiconductor die 1000 and the second semiconductor die 700 through the array of solder material portions (such as solder balls).

In the case of metal-to-metal bonding, facing pairs of a first bonding structure 178 of the first semiconductor die 1000 and a second bonding structure 788 of the second semiconductor die 700 can brought to direct contact with each other, and can be subjected to an elevated temperature to induce material diffusion across the interfaces between adjoined pairs of metallic pad structures (178, 788). The interdiffusion of the metallic material can induce bonding between each adjoined pairs of metallic pad structures (178, 788). In addition, the logic-side dielectric layers 760 and the interconnect level dielectric layers 160 can include a dielectric material (such as a silicate glass material) that can be bonded to each other. In this case, physically exposed surfaces of the logic-side dielectric layers 760 and the interconnect level dielectric layers 160 can be brought to direct contact with each other and can be subjected to thermal annealing to provide additional bonding.

In case an array of solder material portions is used to provide bonding between the first semiconductor die 1000 and the second semiconductor die 700, a solder material portion (such as a solder ball) can be applied to each of the first bonding structures 178 of the first semiconductor die 1000, and/or to each of the second bonding structures 788 of the second semiconductor die 700. The first semiconductor die 1000 and the second semiconductor die 700 can be bonded to each other through an array of solder material portions by reflowing the solder material portions while each solder material portion is contacted by a respective pair of a first bonding structure 178 of the first semiconductor die 1000 and a second bonding structure 788 of the second semiconductor die 700.

Generally, a second semiconductor die 700 can be bonded to a first semiconductor die 1000. The first semiconductor die 1000 comprises an array of memory stack structures 55, and the logic die 1000 comprises a complementary metal oxide semiconductor (CMOS) circuit that includes a peripheral circuitry electrically coupled to nodes of the array of memory stack structures 55 through a subset of metal interconnect structures 168 included within the first semiconductor die 1000. The first semiconductor die 1000 includes the semiconductor material layer 14, and is attached to the carrier substrate 9.

Optionally, the substrate semiconductor layer (e.g., the silicon wafer) 709 of the second semiconductor die 700 can be thinned from the backside. For example, a combination of grinding, polishing, and/or chemical etching may be employed to remove portions of the substrate semiconductor layer 709 that are distal from the interface between the first semiconductor die 1000 and the second semiconductor die 700. Surfaces of the through-substrate contact via structures 712 can be physically exposed after thinning the substrate semiconductor layer 709. A backside insulating layer 714 can be formed on the backside surface of the logic die substrate 708 (as thinned after the thinning process). Laterally-insulated through-substrate via structures (711, 712) can vertically extend through the logic die substrate 708 to provide electrical contact to various input nodes and output nodes of the periphery circuitry in the second semiconductor die 700. Each laterally-insulated through-substrate via structure (711, 712) includes a through-substrate connection via structure 712 and a through-substrate insulating liner 711 that laterally surrounds the through-substrate conductive via structure 712. Logic-side bonding pads 716 (which is also referred to as front bonding pads) can be formed on surface portions of the laterally-insulated through-substrate via structures (711, 712). Generally, a semiconductor die is provided, which includes semiconductor devices 710 located on a semiconductor substrate (such as the substrate semiconductor layer 709). The second bonding structures 788 overlie, and are electrically connected to, the semiconductor devices 710, and laterally-insulated through-substrate via structures (711, 712) can extend through the logic-side substrate 708. Alternatively, the substrate semiconductor layer (e.g., the silicon wafer) 709 of the second semiconductor die 700 may be retained in the device and the logic-side bonding pads 716 and the laterally-insulated through-substrate via structures (711, 712) are omitted.

The first exemplary bonded assembly of the first semiconductor die 1000 and the second semiconductor die 700 may comprise a first exemplary bonded assembly of a memory die and a logic die. Within the first exemplary bonded assembly, the semiconductor material layer 14 is located on a distal surface 32D of the alternating stack of the insulating layers 32 and the electrically conductive layers 46, as shown in FIG. 14B. As used herein, a distal surface of an element within a first exemplary bonded assembly of two semiconductor dies refers to a surface of the element that is distal from the interface between the two semiconductor dies such as the interface between the first semiconductor die 1000 and the second semiconductor die 700. The semiconductor material layer 14 is more distal from the second semiconductor die 700 (i.e., the logic die) than the alternating stack (32, 46) is from the second semiconductor die 700. The dielectric spacer layer 12 located on a distal surface 14D of the semiconductor material layer 14. The carrier substrate 9 is located on a distal surface 12D of the dielectric spacer layer 12. Memory openings 49 (filled with the memory opening fill structures 58) vertically extend through the alternating stack (32, 46), through the semiconductor material layer 14, and through the dielectric spacer layer 12, and may extend into a proximal portion of the carrier substrate 9. Memory opening fill structures 58 are located in the memory openings 49, and comprise a respective vertical semiconductor channel 60 and a respective memory film 50.

Figure 15:
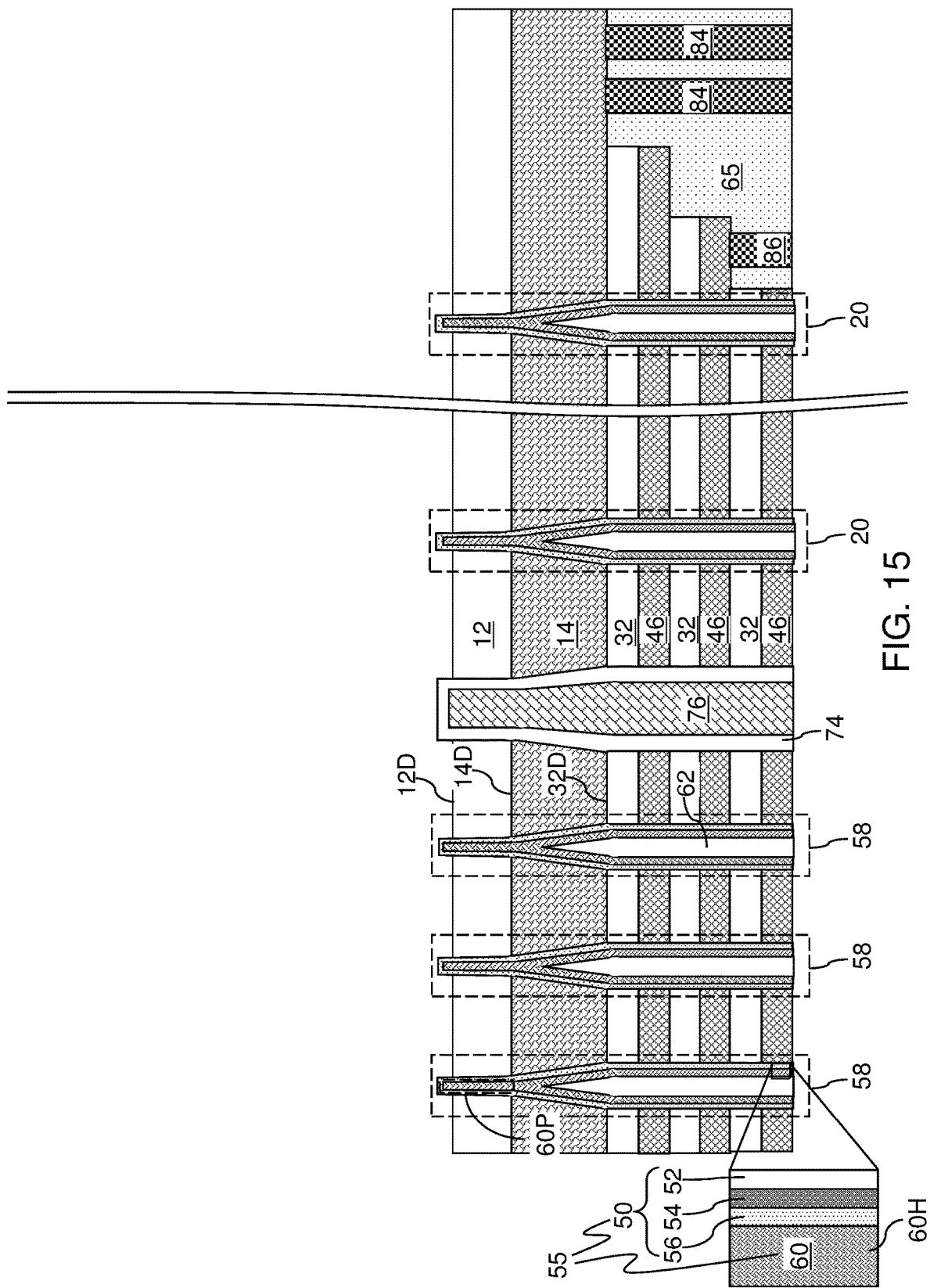
FIG. 15 is a schematic vertical cross-sectional view of the first exemplary bonded assembly after removal of the carrier substrate according to an embodiment of the present disclosure.

Referring to FIG. 15, the carrier substrate 9 may be removed while retaining the dielectric spacer layer 12, the memory opening fill structures 58, and the backside insulating spacers 74. For example, if the carrier substrate 9 comprises a semiconductor substrate (such as a commercially available silicon wafer), a grinding process may be performed to remove a predominant portion of the carrier substrate 9 from the backside, a polishing process may be performed to remove a proximal portion of the carrier substrate 9 that is proximal to the interface between the first semiconductor die 1000 and the second semiconductor die 700, and an isotropic wet etch process employing an etchant that etches the semiconductor material of the carrier substrate 9 selective to the dielectric material of the dielectric spacer layer 12 to remove remaining portions of the semiconductor material of the carrier substrate 9. In an illustrative example, the wet etch process may employ KOH as an etchant. Portions of the memory opening fill structures 58 may protrude from the exposed distal surface 12D of the dielectric spacer layer 12.

Figure 16:
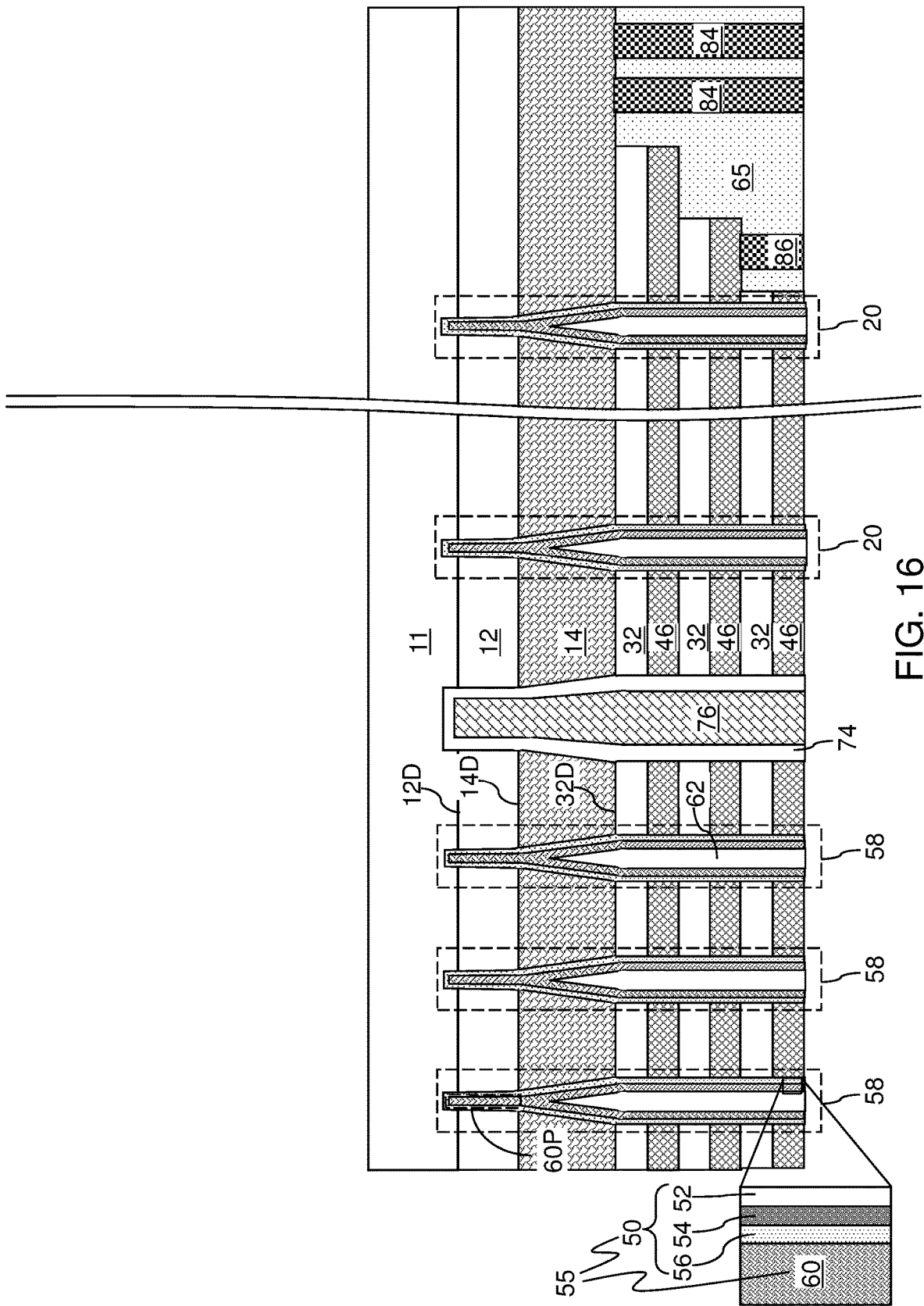
FIG. 16 is a schematic vertical cross-sectional view of the first exemplary bonded assembly after formation of a spin-on-glass layer according to an embodiment of the present disclosure.

Referring to FIG. 16, an optional planarization dielectric layer 11 may be formed on the physically exposed distal surface 12D of the dielectric spacer layer 12. The dielectric layer 11 comprises a self-planarizing dielectric material such as a flowable oxide (FOX) (e.g., spin-on-glass), spin-on-carbon or photoresist. Alternatively, a non-self planarizing material, such as a silicon oxide deposited from an organic source (e.g., TEOS) by CVD (e.g., low pressure CVD, atmospheric pressure CVD or plasma enhanced CVD) may be used. Thus, the physically exposed top surface of the dielectric layer 11 may be planar. The thickness of the dielectric layer 11 may be in a range from 50 nm to 300 nm, although lesser and greater thicknesses may also be employed.

Figure 17:
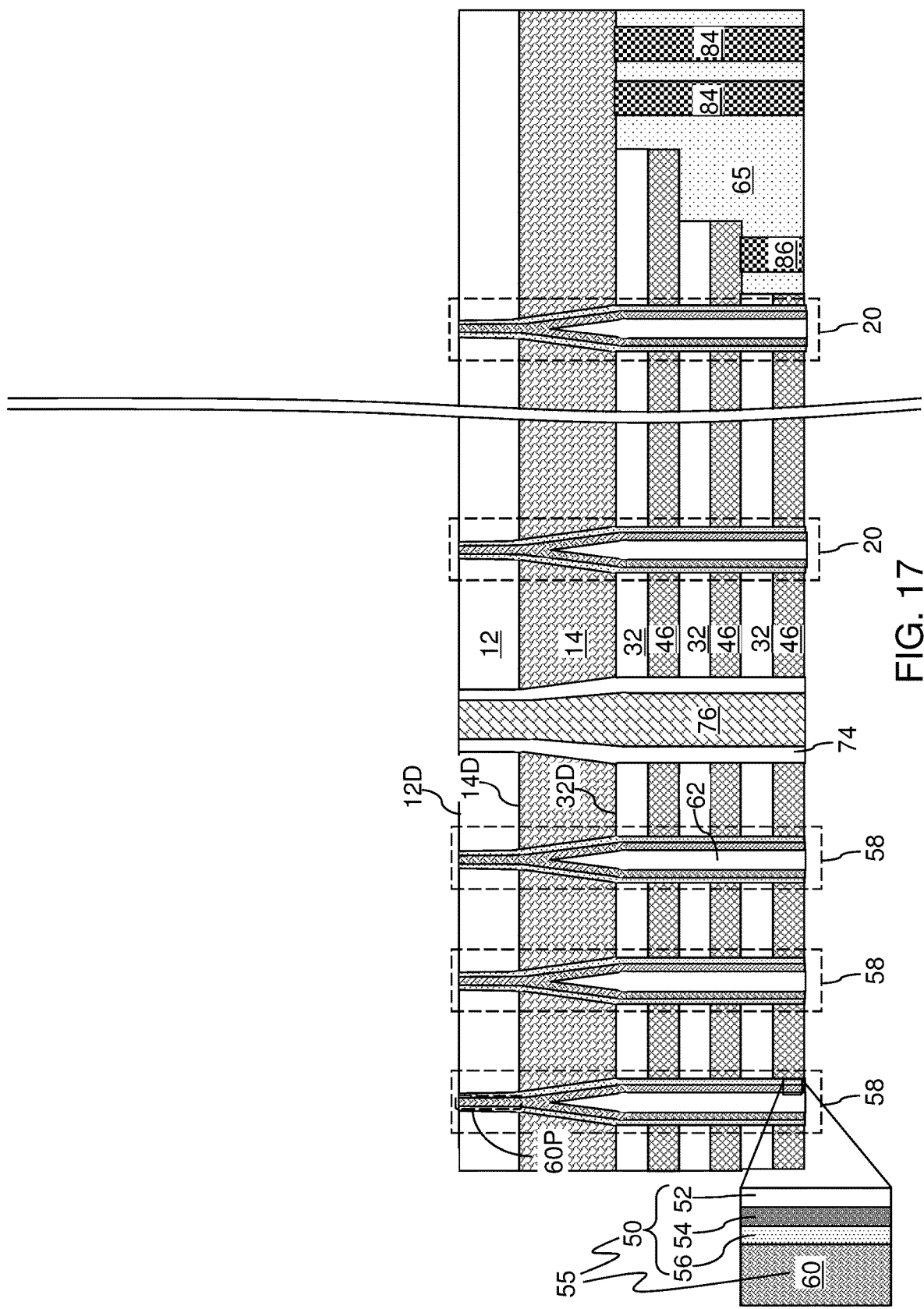
FIG. 17 is a schematic vertical cross-sectional view of the first exemplary bonded assembly after polishing the spin-on-glass layer according to an embodiment of the present disclosure.

Referring to FIG. 17, a non-selective planarization process may be performed to remove material portions that overlie the horizontal plane including the distal surface 12D of the dielectric spacer layer 12. The non-selective planarization process may employ a chemical mechanical polishing process, or a non-selective recess etch process that indiscriminately etches materials of the dielectric layer 11, the protruding portions of the memory opening fill structures 58 (e.g., the memory films 50 and the vertical semiconductor channels 60), the backside insulating spacers 74, and the backside trench via structures 76. The dielectric layer 11 may be entirely removed. Portions of the memory films 50, the vertical semiconductor channels 60, the backside insulating spacers 74, and the backside trench via structures 76 that overlie the horizontal plane including the distal surface 12D of the dielectric spacer layer 12 can be removed in by the non-selective planarization process. A distal end surface of each of the vertical semiconductor channels 60 can be physically exposed. Specifically, the solid semiconductor (e.g., silicon) pillar portion 60P of the vertical semiconductor channels 60 is exposed in the distal surface 12D of the dielectric spacer layer 12.

Figure 18:
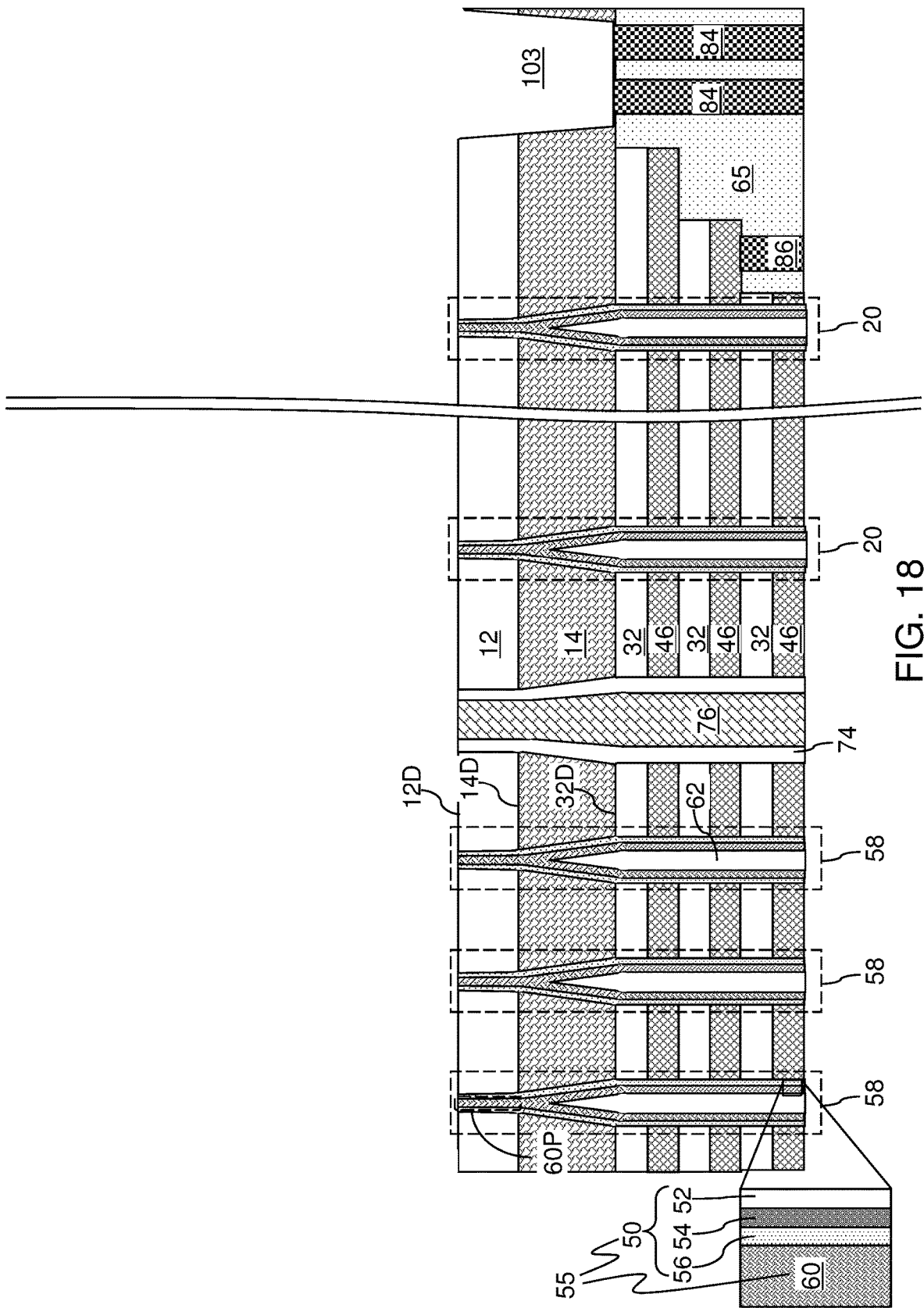
FIG. 18 is a schematic vertical cross-sectional view of the first exemplary bonded assembly after formation of a contact recess region according to an embodiment of the present disclosure.

Referring to FIG. 18, a photoresist layer (not shown) can be applied over the dielectric spacer layer 12, and can be lithographically patterned to form openings in areas that overlie the pass-through via structures 84. An etch process, such as an anisotropic etch process, can be performed to etch through unmasked portions of the dielectric spacer layer 12 and the semiconductor material layer 14. A contact recess region 103 vertically extending through the dielectric spacer layer 12 and the semiconductor material layer 14 can be formed over each pass-through via structure 84. A and a surface of the at least one pass-through via structure 84 can be physically exposed at the bottom of each contact recess region 103. The photoresists layer can be subsequently removed, for example, by ashing.

Figure 19A:
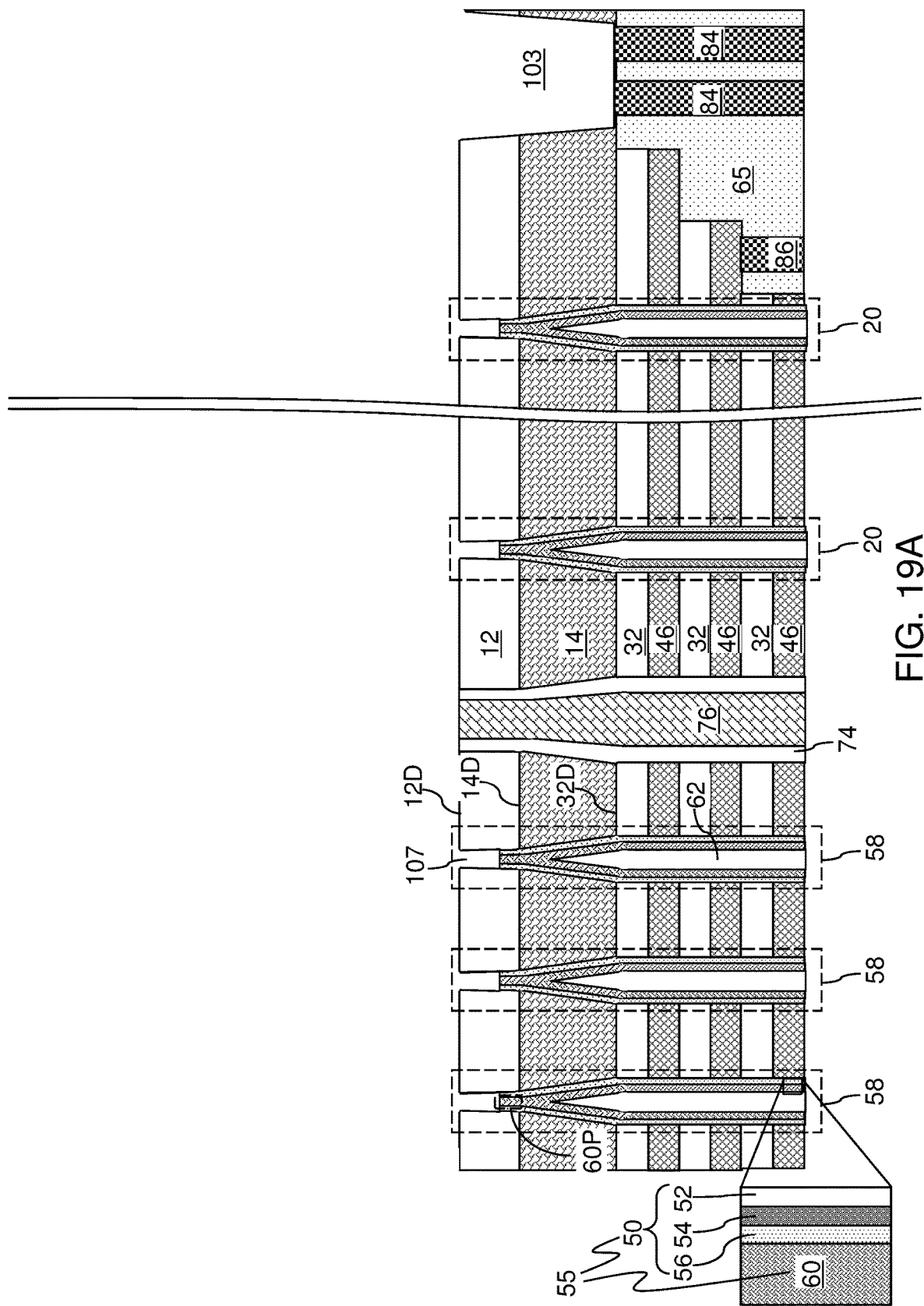
FIG. 19A is a schematic vertical cross-sectional view of the first exemplary bonded assembly after vertically recessing pillar portions of the vertical semiconductor channels according to an embodiment of the present disclosure.

Referring to FIG. 19A, portions of the vertical semiconductor channels 60 and the memory films 50 that are embedded within the dielectric spacer layer 12 may be removed. For example, a recess etch process may be performed.

A sequence of isotropic recess etch processes may be performed to remove portions of the memory films 50 that are located around the pillar cavities 107. In other words, distal portions of the memory films 50, which are more distal from the second semiconductor die 700 than the recessed end surfaces of the pillar portions 60P of the vertical semiconductor channels 60 are from the second semiconductor die 700, are removed by the sequence of isotropic etch processes. The sequence of isotropic etch processes may comprise a first isotropic etch process that etches the material of the tunneling dielectric layers 56, a second isotropic etch process that etches the material of the charge storage layers 54, and the third isotropic etch process that etches the material of the blocking dielectric layers 52. A cylindrical surface segment of the dielectric spacer layer 12 can be physically exposed around each pillar cavity 107.

The semiconductor recess etch process may have an etch chemistry that etches the semiconductor material of the vertical semiconductor channels 60 selective to the material of the dielectric spacer layer 12. The semiconductor recess etch process may comprise an isotropic etch process such as a wet etch process, or may comprise an anisotropic etch process. For example, the semiconductor recess etch process may comprise a wet etch process using hot trimethyl-2 hydroxyethyl ammonium hydroxide ("hot TMY") or tetramethyl ammonium hydroxide (TMAH). End surfaces of the pillar portions 60P of the vertical semiconductor channels 60 can be vertically recessed by the recess etch process. The recessed end surfaces of the pillar portions 60P of the vertical semiconductor channels 60 can be formed between the horizontal plane including the distal surface 12D of the dielectric spacer layer 12 and the horizontal plane including the proximal surface of the dielectric spacer layer 12 which contacts a distal surface 14D of the semiconductor material layer 14. Pillar cavities 107 can be formed in each volume from which the material of the pillar portions 60P of the vertical semiconductor channels 60 are removed. The surfaces of the solid semiconductor pillar portion 60P is exposed in the via cavities 107.

Figure 19B:
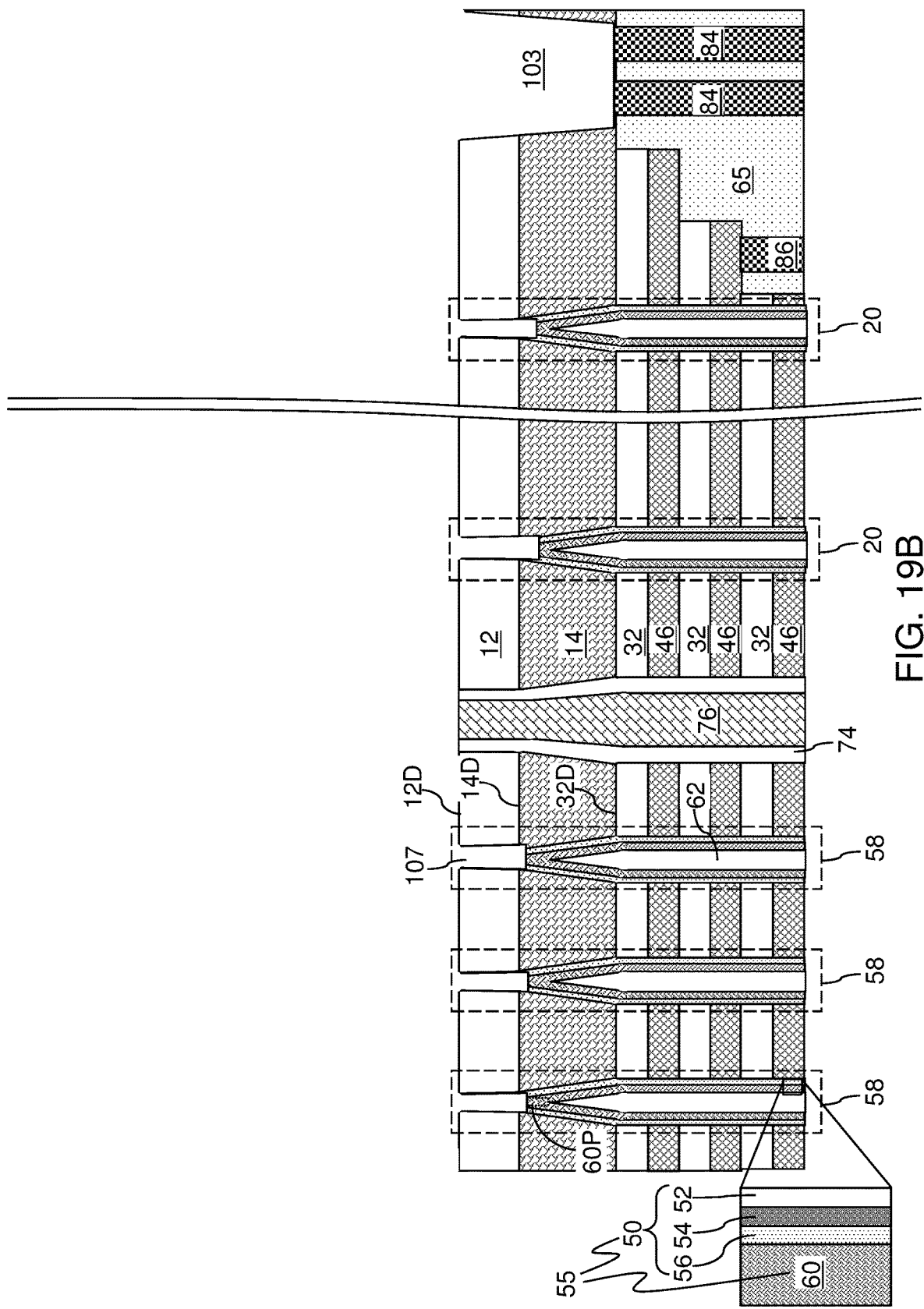
FIG. 19B is a schematic vertical cross-sectional view of a modified first exemplary bonded assembly after vertically recessing pillar portions of the vertical semiconductor channels according to an alternative embodiment of the present disclosure.

In an alternative embodiment shown in FIG. 19B, the semiconductor recess etch process is extended such that the recessed end surfaces of the pillar portions 60P of the vertical semiconductor channels 60 can be formed between the horizontal plane including the distal surface 14D of the semiconductor material layer 14 and the horizontal plane including the opposing proximal surface 14P of the semiconductor material layer 14. In this alternative embodiment, each pillar cavity 107 extends into the semiconductor material layer 14.

Figure 20:
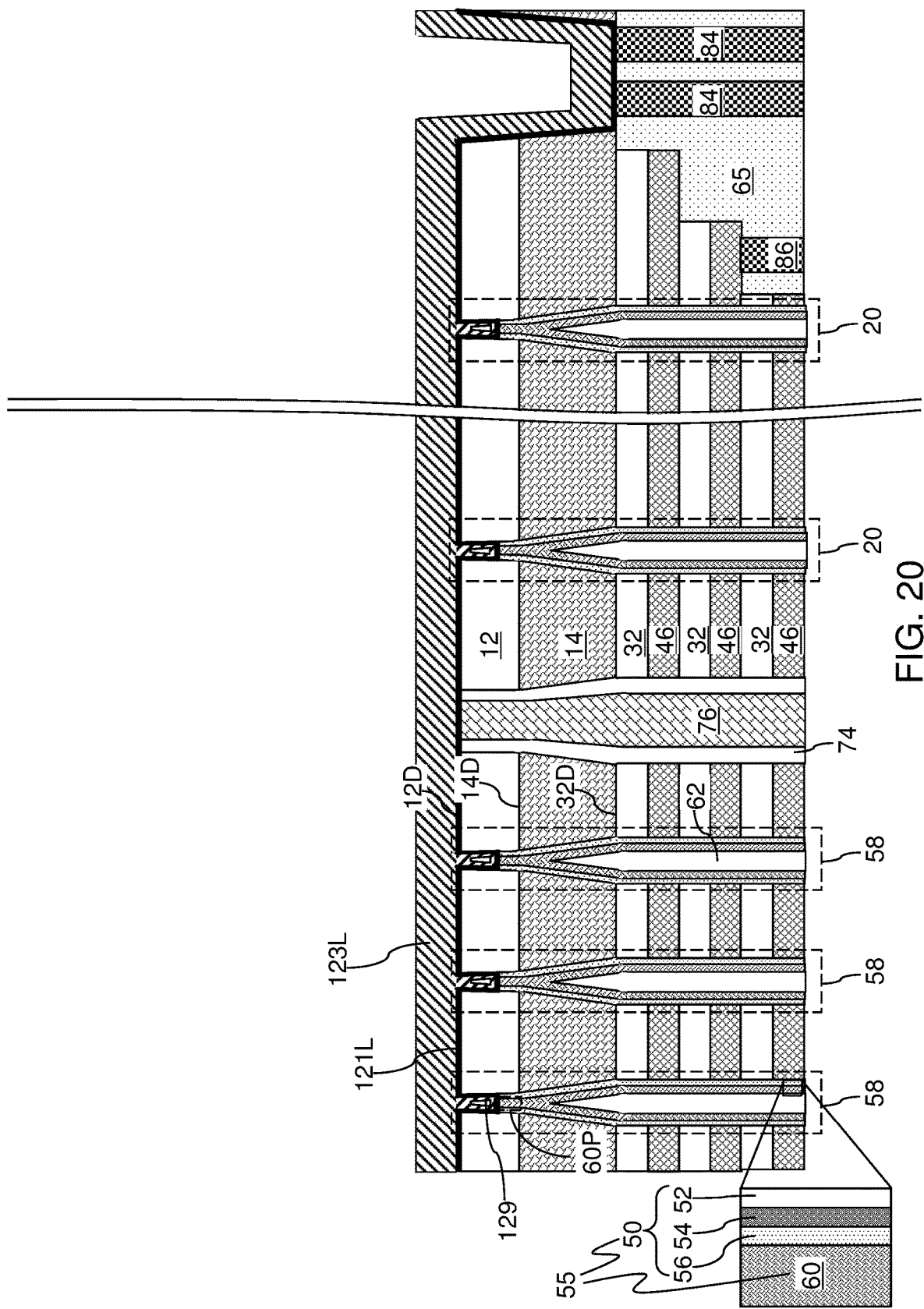
FIG. 20 is a vertical cross-sectional view of the first exemplary bonded assembly after deposition of at least one metallic material layer according to an embodiment of the present disclosure.

Referring to FIG. 20, at least one electrically conductive material layer can be deposited in the pillar cavities 107, in the contact recess regions 103, and over the distal surface 12D of the dielectric spacer layer 12. The at least one conductive material layer may comprise at least one metallic material layer (121L, 123L). In one embodiment, the at least one metallic material layer (121L, 123L) may comprise a metallic diffusion barrier liner 121L and a metallic fill material layer 123L. The metallic diffusion barrier liner 121L may comprise a metallic diffusion barrier material such as WN, TiN, TaN, MoN, TiC, TaC, WC, or a combination thereof. The thickness of a horizontally-extending portion of the metallic diffusion barrier liner 121L may be in a range from 1 nm to 10 nm, although lesser and greater thicknesses may also be employed. The metallic diffusion barrier liner 121L may be deposited by a conformal deposition process or a non-conformal deposition process. The metallic fill material layer 123L comprises at least one high-conductivity metal such as W, Ti, Ta, Mo, Ru, Co, Nb, Cu, Al, etc. The metallic fill material layer 123L may be deposited by physical vapor deposition, chemical vapor deposition, electroplating, electroless plating, etc. In one embodiment, voids 129 that are not filled with any of the at least one metallic material layer (121L, 123L) may be present within volumes of the pillar cavities 107. In this case, each void 129 may be encapsulated by a portion of the metallic diffusion barrier liner 121L, and may be located entirely between a horizontal plane including the distal surface 12 of the dielectric spacer layer 12 and a horizontal plane including end surfaces of the pillar portions 60P of the vertical semiconductor channels 60. The at least one metallic material layer (121L, 123L) can contact each end surface of the pillar portions 60P of the vertical semiconductor channels 60 and each end surface of the pass-through via structures 84. Alternatively, a heavily doped semiconductor material, such as heavily doped polysilicon may be used instead of or in addition to the at least one metallic material layer (121L, 123L).

Figure 21:
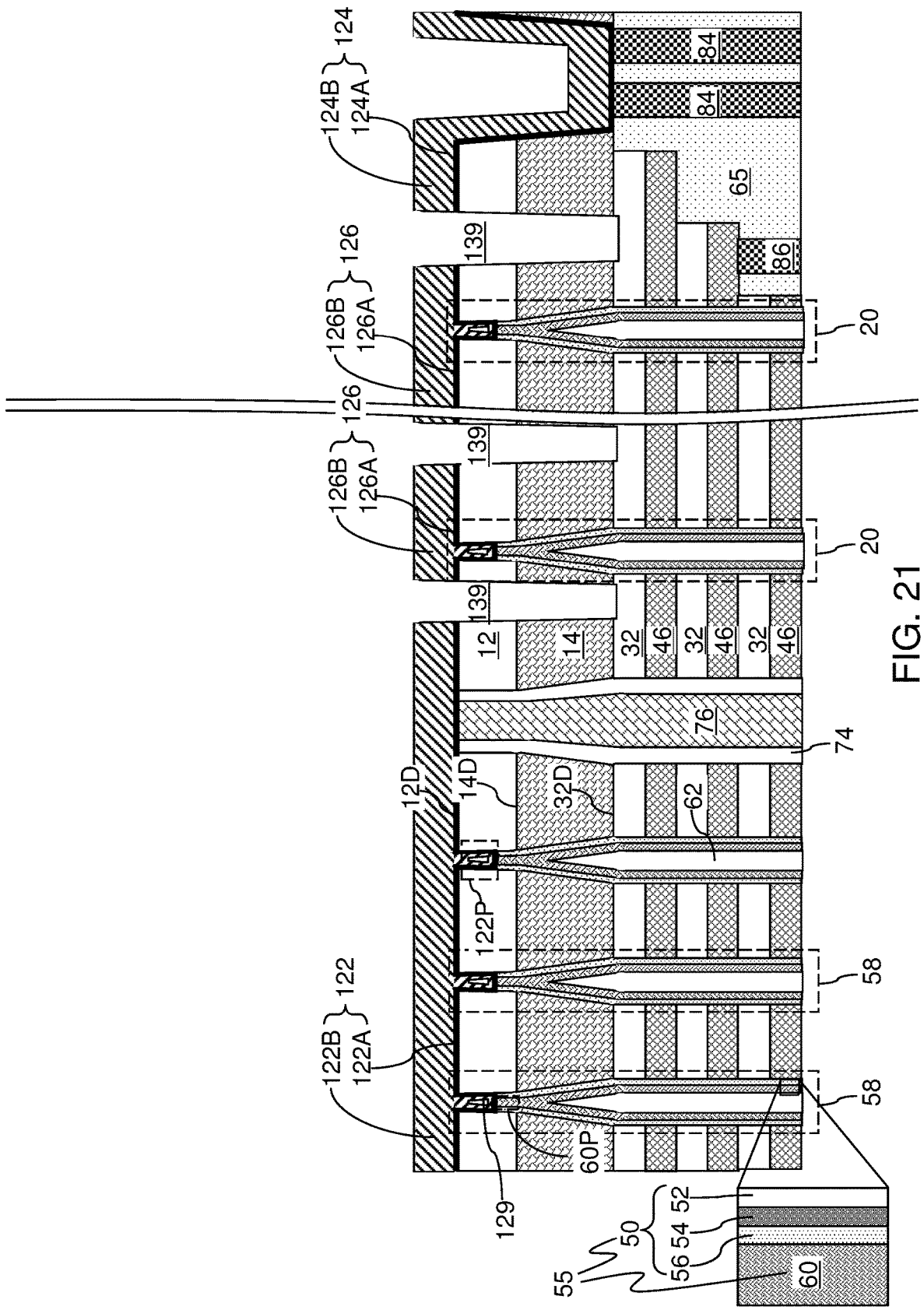
FIG. 21 is a vertical cross-sectional view of the first exemplary bonded assembly after formation of backside isolation trenches according to an embodiment of the present disclosure.

Referring to FIG. 21, a photoresist layer (not shown) may be applied over the top surface of the at least one metallic material layer (121L, 123L), and may be lithographically patterned to form discrete areas. An etch process, such as an anisotropic etch process, can be performed to transfer the pattern in the photoresist layer through the at least one metallic material layer (121L, 123L), the dielectric spacer layer 12, and the semiconductor material layer 14. The at least one metallic material layer (121L, 123L), the dielectric spacer layer 12, and the semiconductor material layer 14 can be divided into multiple discrete portions that are laterally spaced apart among one another by backside isolation trenches 139.

Patterned portions of the at least one metallic material layer (121L, 123L) comprise a source layer 122 that contacts end surfaces of the pillar portions 60P of the vertical semiconductor channels 60. Alternatively, the source layer 112 may comprise a heavily doped semiconductor material, such as heavily doped polysilicon, instead of or in addition to the at least one metallic material layer (121L, 123L). Generally, the source layer 122 comprises at least one electrically conductive material that is in direct contact with the distal surface 12D of the dielectric spacer layer 12 and in direct contact with distal end surfaces of the solid semiconductor pillar portions 60P of the vertical semiconductor channels 60. The source layer 122 may comprise a source metallic barrier liner 122A that is a patterned portion of the metallic diffusion barrier liner 121L, and a source metal layer 122B that is a patterned portion of the metallic fill material layer 123L.

Thus, by forming the tapered memory opening 49 at the step of FIGS. 3A and 3B, permits the solid semiconductor pillar portions 60P of the vertical semiconductor channels 60 to be formed. The source layer 122 physically contacts the solid semiconductor pillar portions 60P, which provides a good electrical contact. If the solid semiconductor pillar portions 60P were omitted, then the source layer 122 would have to contact only the cylindrical edge and/or inner surface of the vertical semiconductor channel 60 which surrounds the dielectric core 62, which degrades the quality of the electrical contact between the source and the channel. The embodiments of the present disclosure provide an improved electrical contact between vertical semiconductor channels 60 and the source layer 122 by ensuring at least a minimum contact area between them.

Further, patterned portions of the at least one metallic material layer (121L, 123L) comprise a metallic contact plate 124 that contacts end surfaces of a respective one of the pass-through via structures 84. The metallic contact plate 124 may comprise a contact metallic barrier liner 124A that is a patterned portion of the metallic diffusion barrier liner 121L, and a contact metal layer 124B that is a patterned portion of the metallic fill material layer 123L. Optionally, patterned portions of the at least one metallic material layer (121L, 123L) may comprise dummy metallic plates 126 that contact end surfaces of a respective one of the support pillar structures 20. The dummy metal plates 126 may comprise a dummy metallic barrier liner 126A that is a patterned portion of the metallic diffusion barrier liner 121L, and a dummy metal layer 126B that is a patterned portion of the metallic fill material layer 123L. The dummy metal plates 126 may be laterally spaced from each other to minimize the effect of leakage currents. The dummy metal plates 126 are electrically inactive components which are not connected to an external voltage source, and are electrically floating.

In one embodiment, the dielectric spacer layer 12 is more distal from the second semiconductor die 700 than any portion of the dielectric cores 62 of the memory opening fill structures 58 is from the second semiconductor die 700, i.e., more distal from the second semiconductor die 700 than the most distal portions of the dielectric cores 62 of the memory opening fill structures 58. In one embodiment, each of the dielectric cores 62 has a respective conical portion embedded within the semiconductor material layer 14, and the respective conical portion has a respective apex that is more proximal to the second semiconductor die 700 than the dielectric spacer layer 12 is to the second semiconductor die 700. In other words, tips of the conical portions of the dielectric cores 62 are located between the horizontal plane including the distal surface 14D of the semiconductor material layer 14 and the horizontal plane including the proximal surface of the semiconductor material layer 14 that contacts the alternating stack (32, 46).

In one embodiment, each of the memory openings 49 has a sidewall including a sidewall segment of the semiconductor material layer 14 and a sidewall segment of the dielectric spacer layer 12. The sidewall segment of the semiconductor material layer 14 has a greater taper angle relative to a vertical direction than the sidewall segment of the dielectric spacer layer 12. Each of the memory opening fill structures 58 can have a tapered-segment-containing vertical cross-sectional profile such that each of the memory opening fill structures 58 has a lesser lateral dimension within a horizontal plane including an interface between the semiconductor material layer 14 and the dielectric spacer layer 12 than within a horizontal plane including an interface between the semiconductor material layer 14 and the alternating stack (32, 46).

In one embodiment, each of the vertical semiconductor channels 60 comprises a pillar portion 60P having a respective end surface located between a horizontal plane including the distal surface 14D of the semiconductor material layer 14 and a horizontal plane including the distal surface 12D of the dielectric spacer layer 12. In one embodiment, the source layer 122 comprises vertically-protruding source portions 122P vertically extending into the pillar cavities 107 in the dielectric spacer layer 12 and having contact surfaces contacting the end surfaces of the pillar portions 60P of the vertical semiconductor channels 60. In one embodiment, each of the contact surfaces of the vertically-protruding source portions 122P has a respective periphery that coincides with a periphery of a respective one of the end surfaces of the pillar portions 60P of the vertical semiconductor channels 60, and contacting a cylindrical surface of a respective pillar cavity 107 through the dielectric material layer 12. In one embodiment, each of the vertically-protruding source portions 122P comprises a respective cylindrical sidewall having a proximal periphery (i.e., a periphery that is proximal to the interface between the first semiconductor die 1000 and the second semiconductor die 700) that coincides with a distal periphery of a sidewall of a respective one of the pillar portions 60P of the vertical semiconductor channels 60.

In one embodiment, the alternating stack (32, 46) comprises a staircase region in which lateral extents of the alternating stack (32, 46) decrease with a vertical distance from the dielectric spacer layer 12 and in which stepped surfaces of the alternating stack (32, 46) are present. The memory die 1000 comprises a stepped dielectric material portion 65 contacting the stepped surfaces. In one embodiment, the memory die comprises support pillar structures 20 that vertically extend through the stepped dielectric material portion 65, a respective portion of the alternating stack (32, 46), and the semiconductor material layer 14, and at least partly through the dielectric spacer layer 12.

Figure 22A:
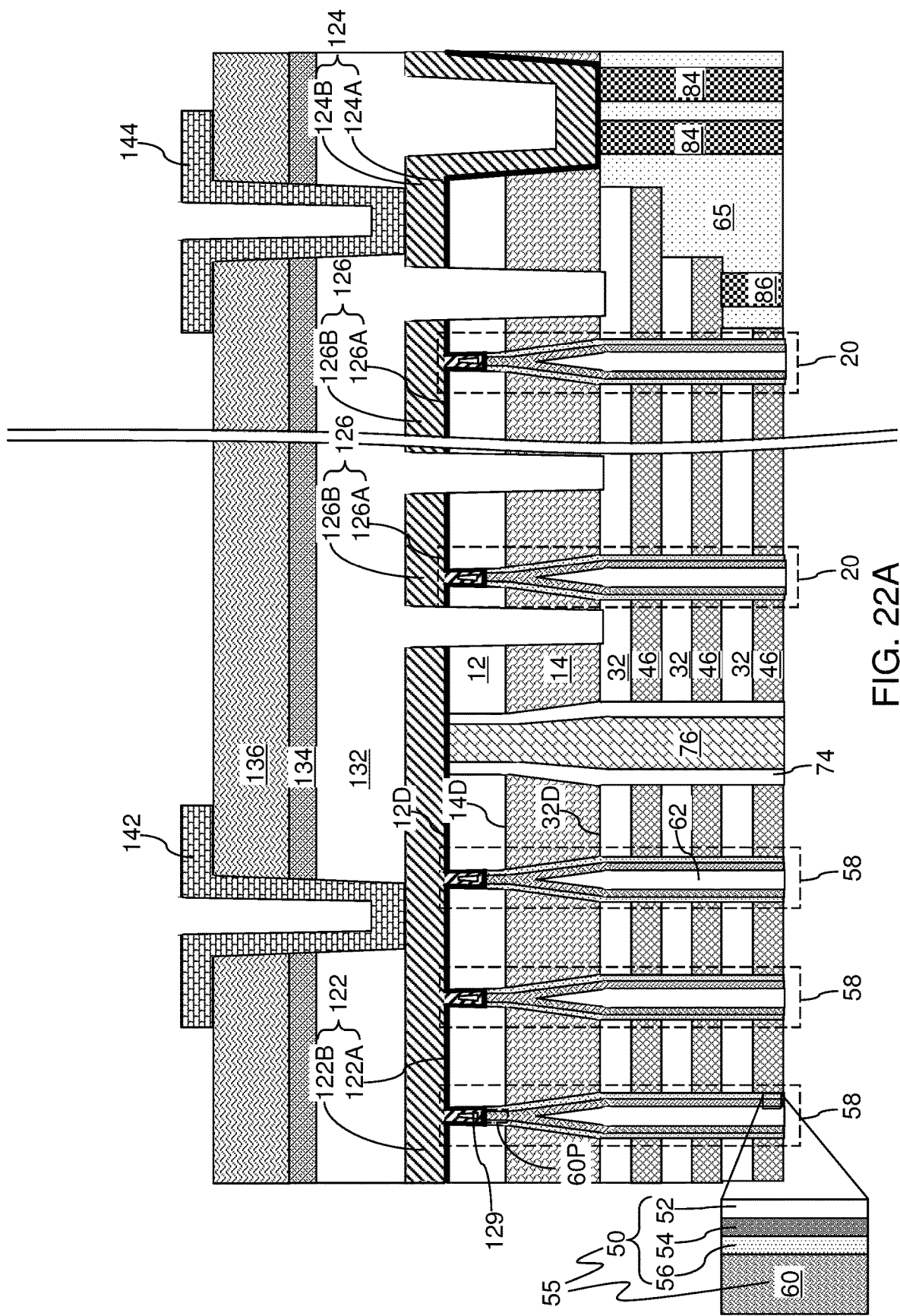
FIG. 22A is a vertical cross-sectional view of the first exemplary bonded assembly after formation of backside dielectric material layers and backsides bonding pads according to an embodiment of the present disclosure.

Referring to FIG. 22A, backside dielectric material layers (132, 134, 136) can be formed over the source layer 122 and the metallic contact plates 124. The backside dielectric material layers (132, 134, 136) may comprise, for example, a backside dielectric fill material layer 132 including a dielectric fill material, such as a silicon oxide, a backside dielectric passivation layer 134 that comprises a diffusion blocking dielectric material, such as a silicon nitride or silicon carbide nitride, and a polymer material layer 136 that includes a photosensitive polymer material such as polyimide. The polymer material layer 136 may be patterned with the discrete openings, for example, by lithographic exposure and development, and an etch process such as an anisotropic etch process can be performed to transfer the pattern of the openings in the polymer material layer 136 through the backside dielectric passivation layer 134 and the backside dielectric fill material layer 132.

At least one metallic material including on under bump metallurgy (UBM) material stack may be deposited in the openings through the backside dielectric material layers (132, 134, 136) directly on physically exposed surfaces of the source layer 122 and the metallic contact plates 124. The at least one metallic material can be subsequently patterned to form bonding pads (142, 144), which may comprise at least one source-side a bonding pad 142 and contact-connection bonding pads 144.

Generally, at least one backside dielectric material layer (132, 134, 136) can be formed in on the source layer 122, and a bonding pad (such as a source-side bonding pad 142) vertically extends through the at least one backside dielectric material layer (132, 134, 136) and contacts the source layer 122. A pass-through via structure 84 may vertically extend through the stepped dielectric material portion 65 to the peripheral devices 710 of the logic die 700, and an additional bonding pad vertically extending through the at least one backside dielectric material layer (132, 134, 136) and electrically connected to the pass-through via structure 84.

Figure 22B:
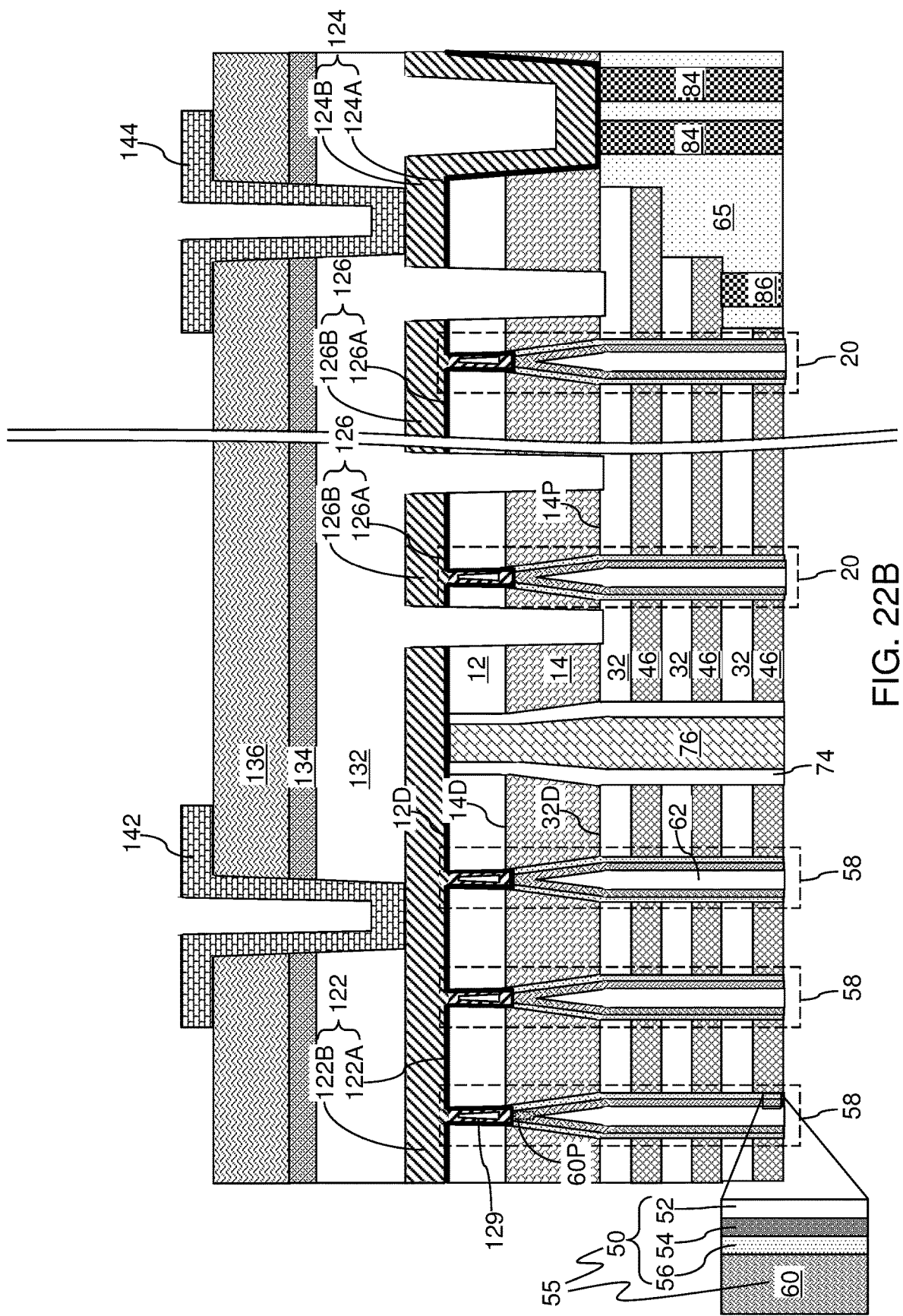
FIG. 22B is a vertical cross-sectional view of a modified first exemplary bonded assembly after formation of backside dielectric material layers and backsides bonding pads according to the alternative embodiment of the present disclosure.

Referring to FIG. 22B, in a modified first configuration of the exemplary structure, after the step of FIG. 19B is performed to extend the pillar cavities 107 into the semiconductor material layer, the steps of FIGS. 20, 21 and 22A are performed to deposit the source layer 122 into the pillar cavities 107. In the alternative embodiment of FIG. 22B, the junction between the solid semiconductor pillar portions 60P of the vertical semiconductor channels 60 and the source layer 122 is shifted down into a horizontal plane which extends through the semiconductor material layer 14. Thus, the source layer 122 comprises vertically-protruding source portions vertically extending into the semiconductor material layer 14 and having contact surfaces contacting the end surfaces of the pillar portions 60P of the vertical semiconductor channels 60.

Figure 23:
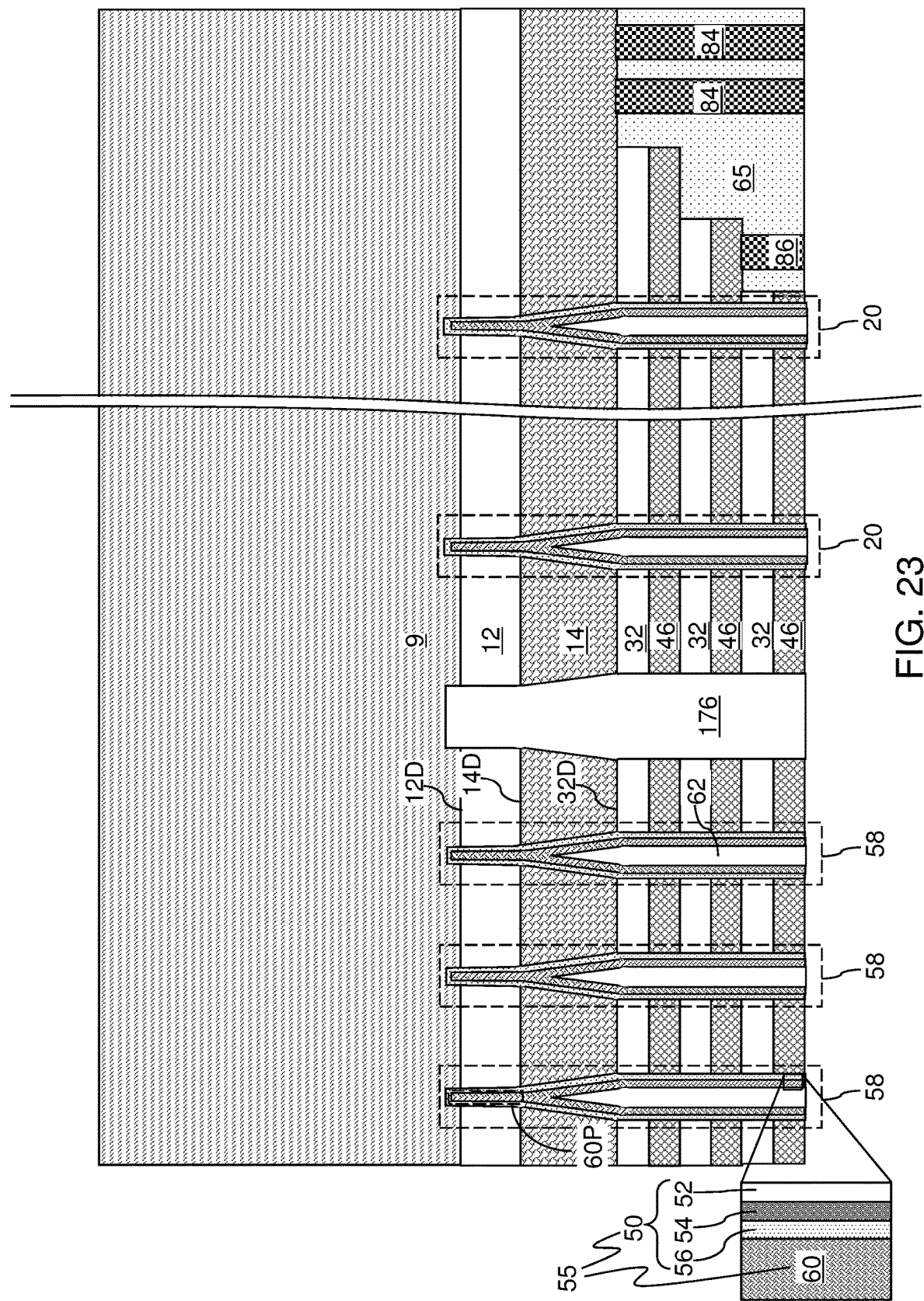
FIG. 23 is a vertical cross-sectional view of a first alternative configuration of the first exemplary structure at the processing steps of FIGS. 14A and 14B according to an embodiment of the present disclosure.

Referring to FIG. 23, a first alternative configuration of the first exemplary structure according to an embodiment of the present disclosure is illustrated at the processing steps of FIGS. 14A and 14B. The first alternative configuration of the first exemplary structure may be derived from the first exemplary structure described above by forming a dielectric backside trench fill structure 176 comprising a dielectric material in lieu of each combination of a backside insulating spacer 74 and a backside trench via structure 76 at the processing steps of FIG. 10.

Figure 24A:
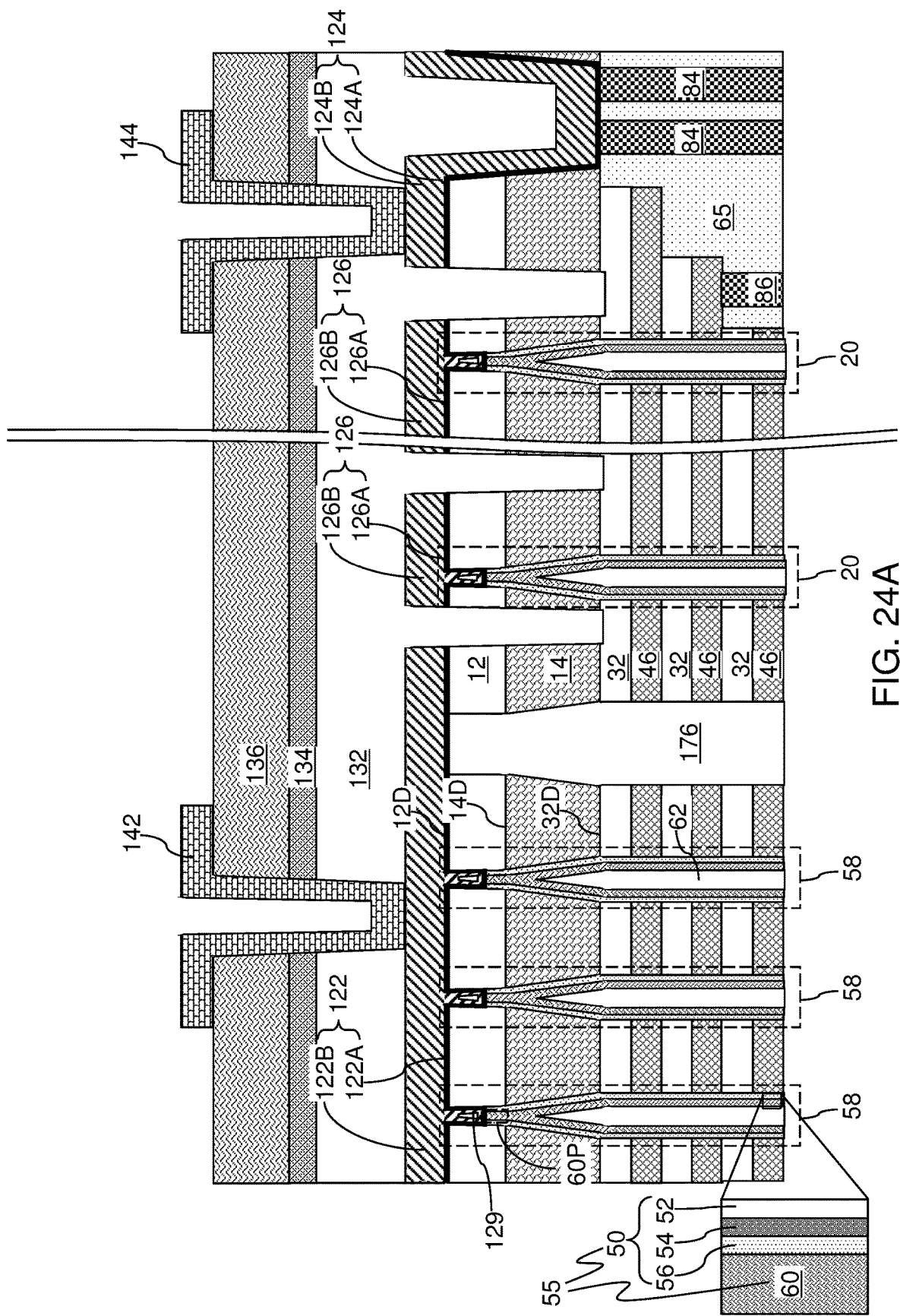
FIG. 24A is a vertical cross-sectional view of the first alternative configuration of the first exemplary structure after formation of backside bonding pads according to an embodiment of the present disclosure.

Referring to FIG. 24A, the processing steps of FIGS. 15-22 may be subsequently performed to provide the first alternative configuration of the exemplary structure.

Figure 24B:
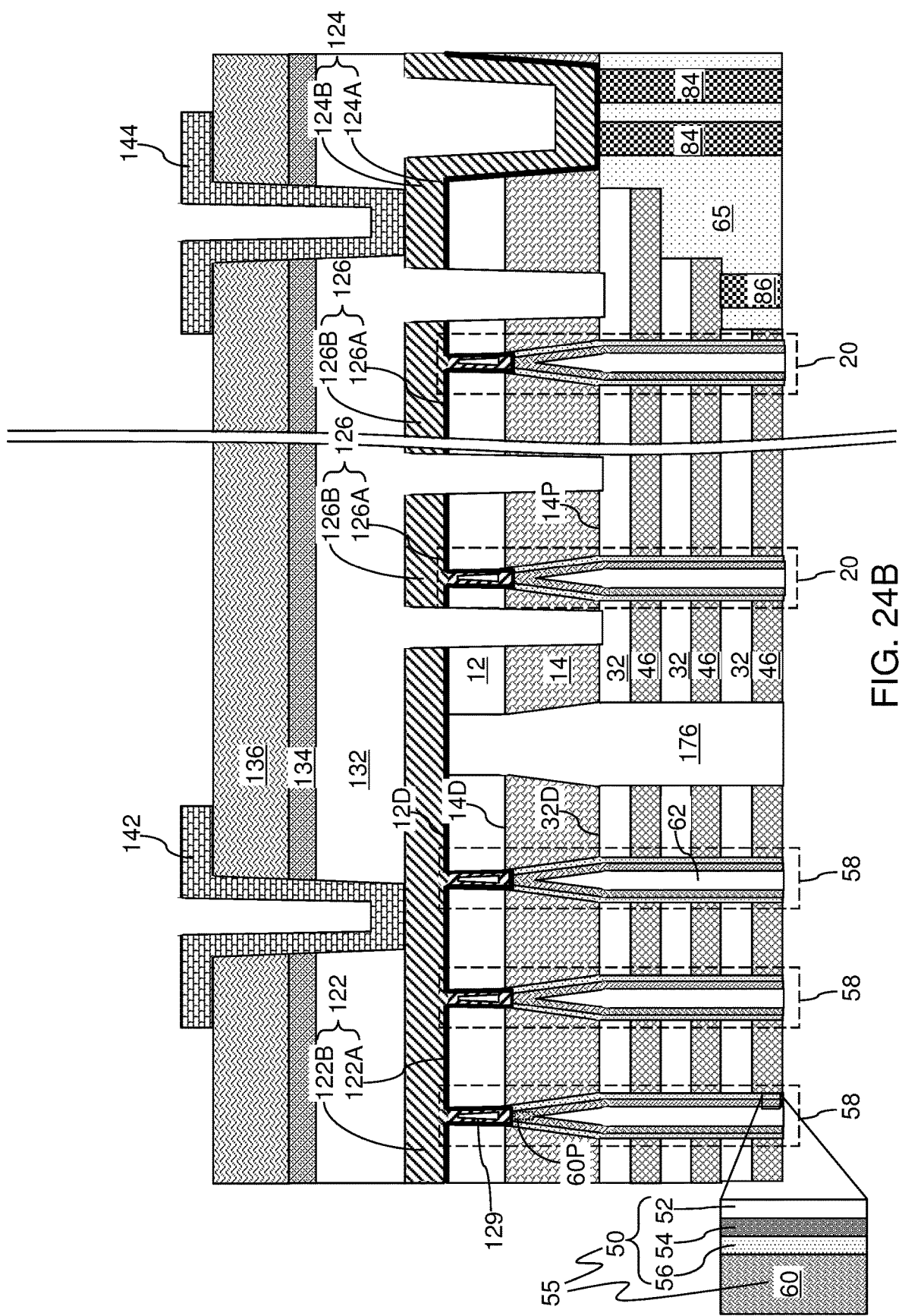
FIG. 24B is a vertical cross-sectional view of a modified first alternative configuration of the first exemplary structure after formation of backside bonding pads according to the alternative embodiment of the present disclosure.

Referring to FIG. 24B, in a modified first alternative configuration, the steps of FIGS. 19B, 20, 21 and 22B are performed to shift the junction between the solid semiconductor pillar portions 60P of the vertical semiconductor channels 60 and the source layer 122 into a horizontal plane which extends through the semiconductor material layer 14, according to the alternative embodiment. Thus, the source layer 122 comprises vertically-protruding source portions vertically extending into the semiconductor material layer 14 and having contact surfaces contacting the end surfaces of the pillar portions 60P of the vertical semiconductor channels 60.

Figure 25:
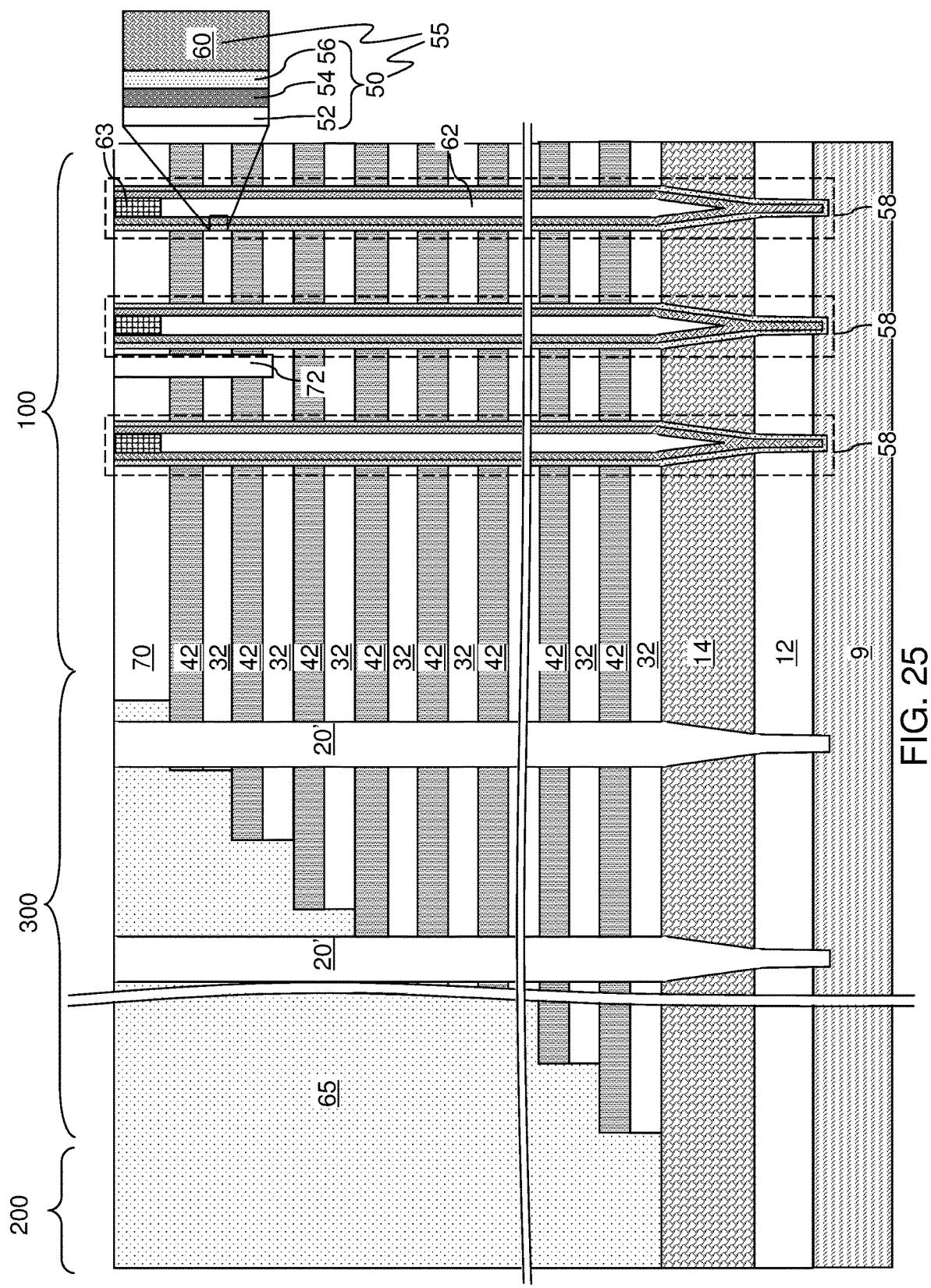
FIG. 25 is a vertical cross-sectional view of a second alternative configuration of the first exemplary structure at the processing steps of FIG. 6 according to an embodiment of the present disclosure.

Referring to FIG. 25, a second alternative configuration of the first exemplary structure according to an embodiment of the present disclosure is illustrated at the processing steps of FIG. 6. The second alternative configuration of the first exemplary structure can be derived from the first exemplary structure illustrated in FIG. 2 by forming the support openings 19 prior to, or after, formation of the memory openings 49 and the memory opening fill structures 58. In this case, the support openings 19 are filled with at least dielectric fill material such as silicon oxide to form support pillar structures 20' consisting essentially of the at least one dielectric fill material. In other words, formation of the memory openings 49 and the memory opening fill structures 58 can be effected by employing a separate set of processing steps than the set of processing steps are employed to form the support openings 19 and the support pillar structures 20'. Alternatively, the memory openings 49 and the support openings 19 may be formed at a same processing step employing an anisotropic etch process, and sacrificial fill material portions may be formed and is subsequently selectively removed to enables sequential formation of the memory opening fill structures 58 and the support pillar structures 20' in a forward order or in a reverse order.

Figure 26:
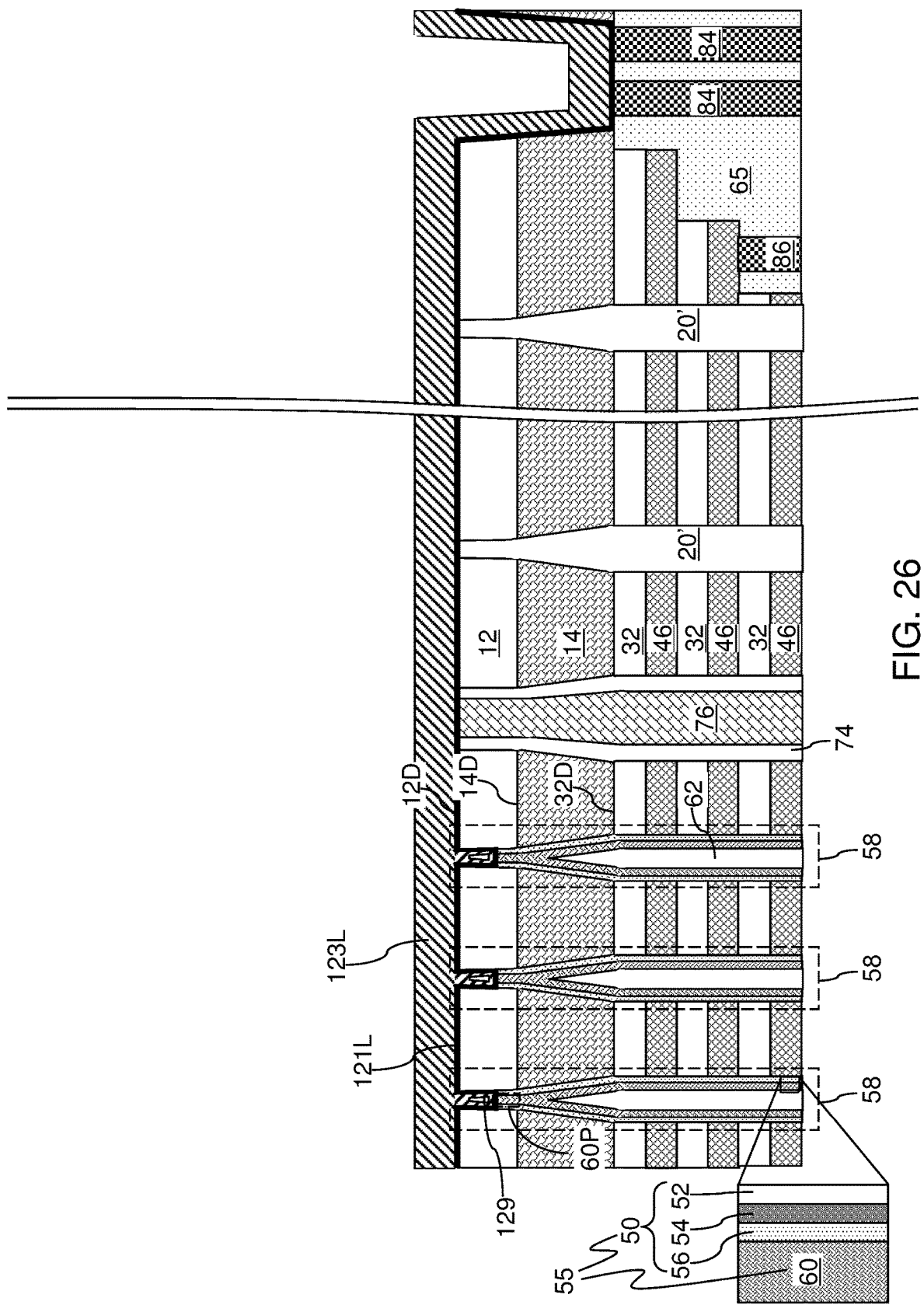
FIG. 26 is a vertical cross-sectional view of the second alternative configuration of the first exemplary structure after deposition of at least one metallic material layer according to an embodiment of the present disclosure.

Referring to FIG. 26, the processing steps of FIGS. 7A-20 can be subsequently performed to form the at least one metallic material layer (121L, 123L) on the distal surface 12D of the dielectric spacer layer 12.

Figure 27:
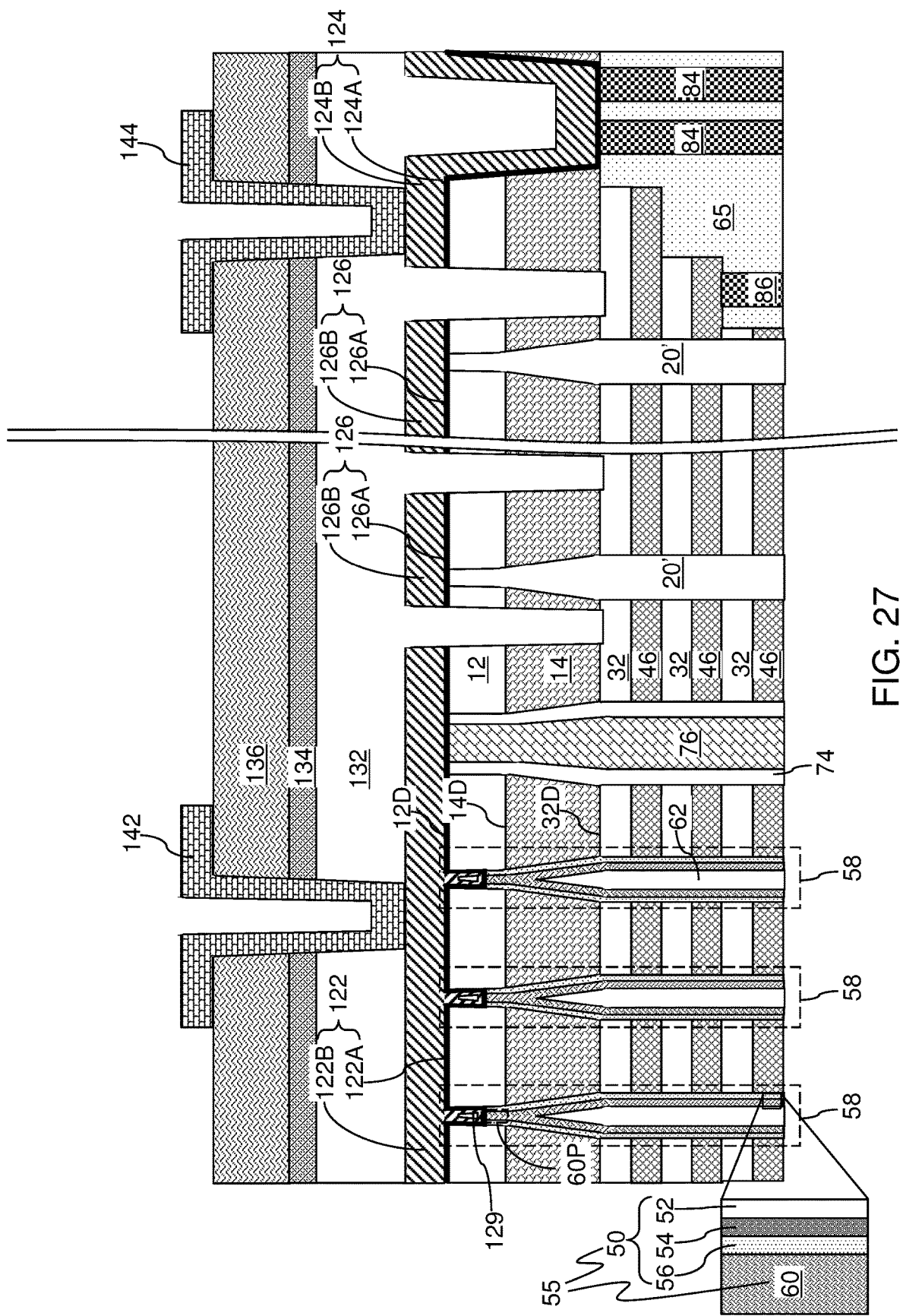
FIG. 27 is a vertical cross-sectional view of the second alternative configuration of the first exemplary structure after formation of backside bonding pads according to an embodiment of the present disclosure.

Referring to FIG. 27, the processing steps of FIGS. 21 and 22 may be subsequently performed to provide the second alternative configuration of the exemplary structure.

Figure 28:
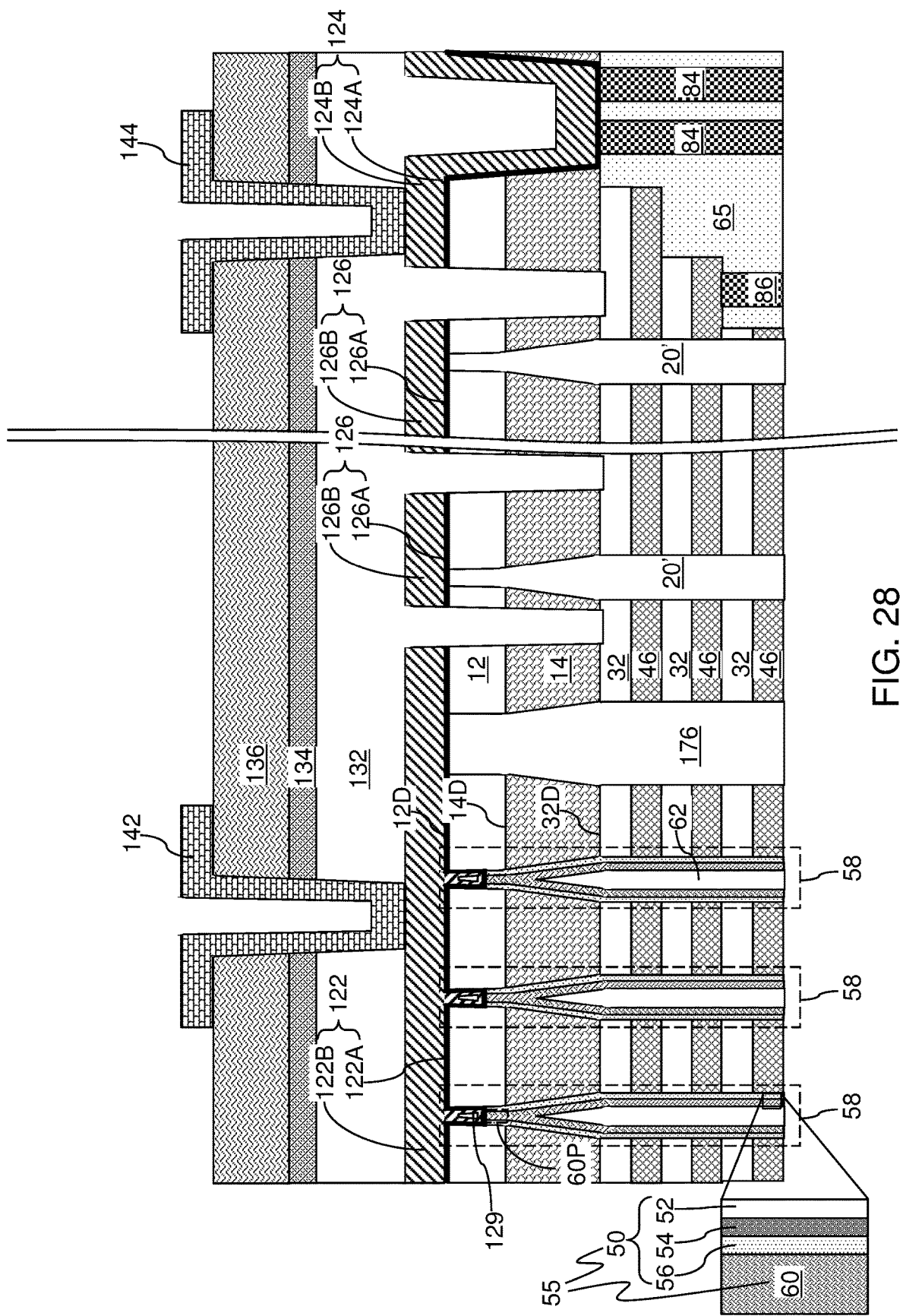
FIG. 28 is a vertical cross-sectional view of a third alternative configuration of the first exemplary structure after formation of backside bonding pads according to an embodiment of the present disclosure.

Referring to FIG. 28, a third alternative configuration of the first exemplary structure according to an embodiment of the present disclosure can be derived from the second alternative configuration of the first exemplary structure forming a dielectric backside trench fill structure 176 comprising a dielectric material in lieu of each combination of a backside insulating spacer 74 and a backside trench via structure 76 at the processing steps of FIG. 10.

Figure 29:
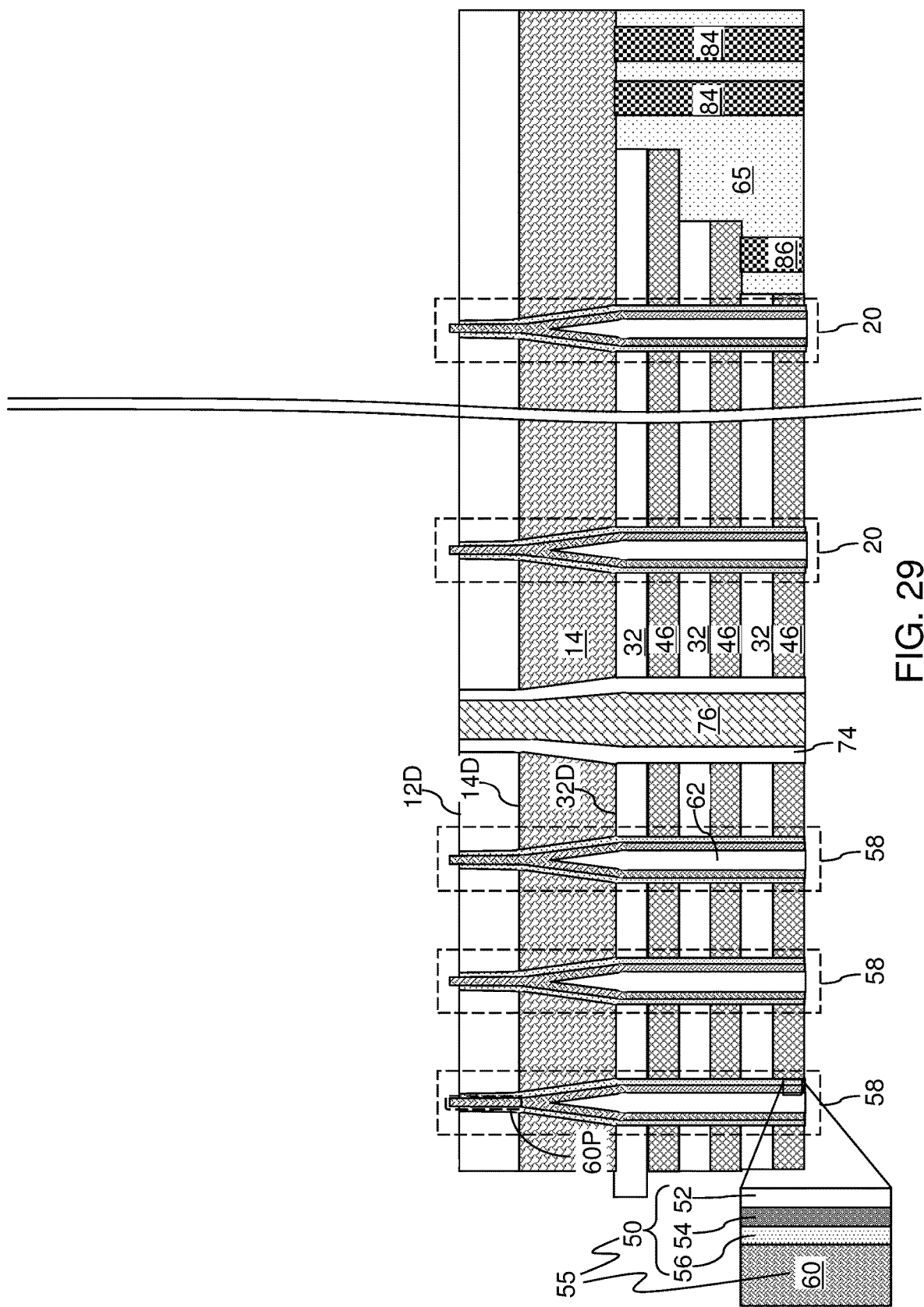
FIG. 29 is a vertical cross-sectional view of a fourth alternative configuration of the first exemplary structure after physically exposing pillar portions of the vertical semiconductor channels according to an embodiment of the present disclosure.

Referring to FIG. 29, a fourth alternative configuration of the first exemplary structure according to an embodiment of the present disclosure may be derived from the first exemplary structure illustrated in FIG. 15 by performing a sequence of isotropic etch processes to remove portions of the memory films 50 that protrude above the horizontal plane including the distal surface 12D of the dielectric spacer layer 12. In other words, distal portions of the memory films 50, which are more distal from the alternating stack (32, 46) than the distal surface 12D of the dielectric spacer layer 12 is from the alternating stack (32, 46), are removed by the sequence of isotropic etch processes. The sequence of isotropic etch processes may comprise a first isotropic etch process that etches the material of the blocking dielectric layers 52, a second isotropic etch process that etches the material of the charge storage layers 54, and the third isotropic etch process that etches the material of the tunneling dielectric layers 56. A cylindrical surface segment of each pillar portion 60P of the vertical semiconductor channels 60 can be physically exposed after the sequence of isotropic etch processes. Physically exposed end surfaces of the vertical semiconductor channels 60, i.e., physically exposed top surfaces of the pillar portions 60P of the vertical semiconductor channels 60, protrude out from the horizontal plane including the distal surface 12D of the dielectric spacer layer 12.

An optional ion implantation process may be used to doped the exposed pillar portions 60P with first or second conductivity type dopants. In this embodiment, the pillar portions 60P may have a higher doping concentration than the remaining hollow portions 60H of the vertical semiconductor channels 60.

An optional recrystallization process may be used to recrystallize the exposed pillar portions 60P. For example, the exposed pillar portions 60P may be irradiated with a laser, such as an excimer laser, to recrystallize the pillar portions 60. If the pillar portions 60P comprise amorphous silicon, then they may be recrystallized into polysilicon. If the pillar portions 60P comprise polysilicon, then they may be recrystallized into larger grain polysilicon. In this embodiment, the pillar portions 60P may comprise polysilicon having a larger average grain side than the remaining polysilicon hollow portions 60H of the vertical semiconductor channels 60. In one embodiment, both the ion implantation and recrystallization steps may be performed on the pillar portions 60. Alternatively, one or both of these steps may be omitted.

Figure 30:
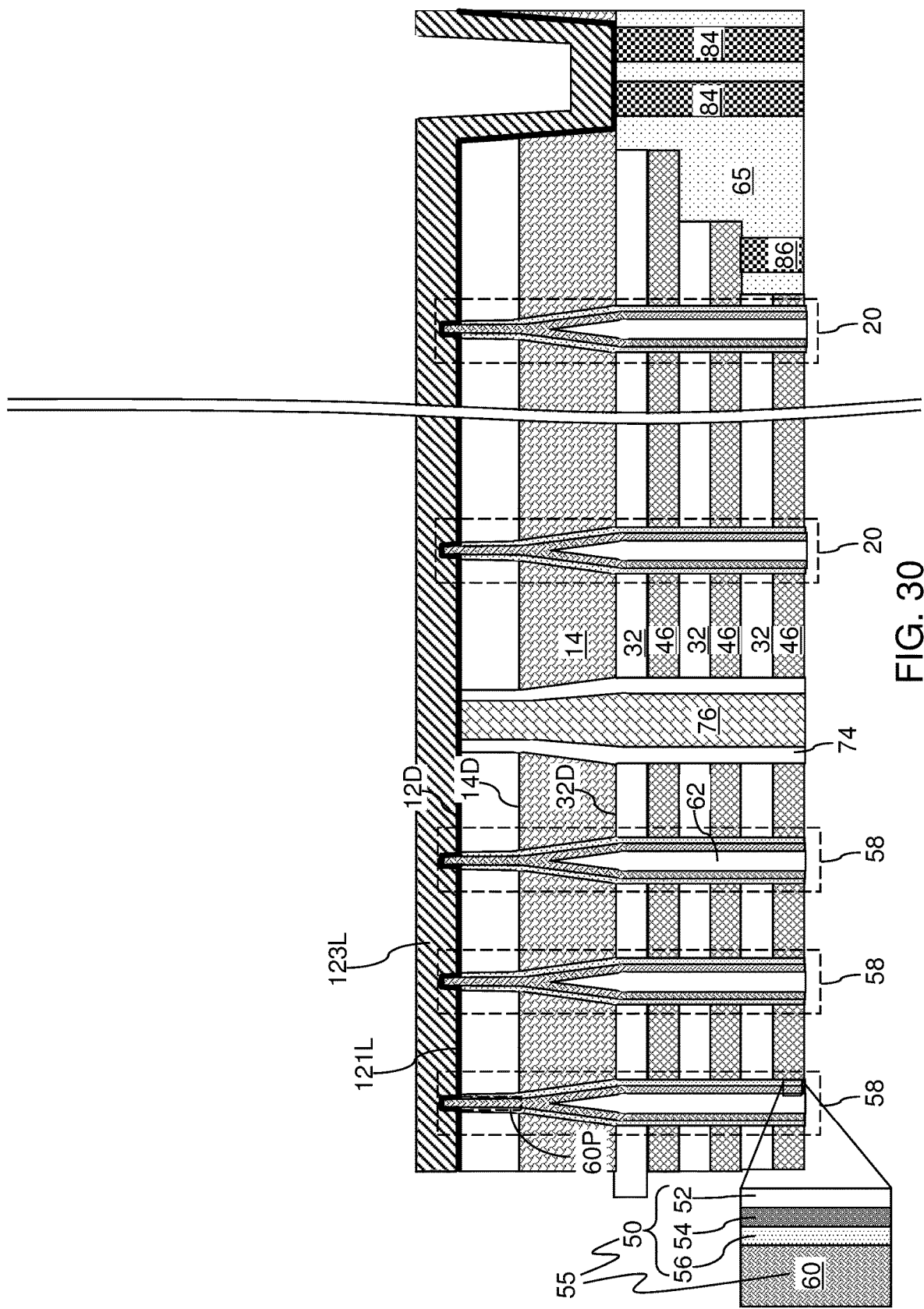
FIG. 30 is a vertical cross-sectional view of the fourth alternative configuration of the first exemplary structure after deposition of at least one metallic material layer according to an embodiment of the present disclosure.

Referring to FIG. 30, the processing steps of FIG. 18 can be performed to form contact recess regions 103. Subsequently, the processing steps of FIG. 20 can be performed to deposit at least one metallic material layer (121L, 123L) directly on physically exposed end surfaces and cylindrical surface segments of the protruding regions of the pillar portions 60P of the vertical semiconductor channels 60.

Figure 31:
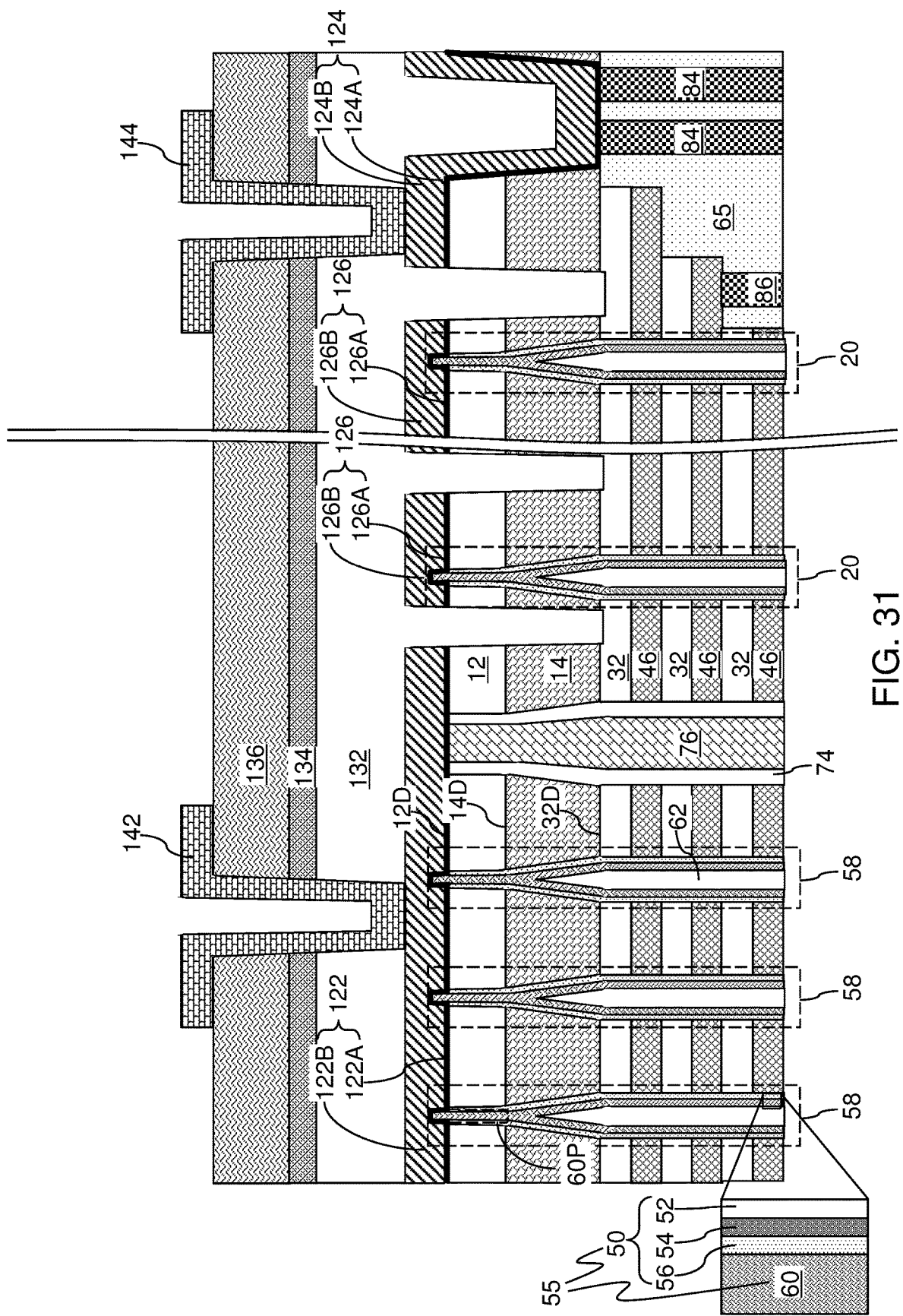
FIG. 31 is a vertical cross-sectional view of the fourth alternative configuration of the first exemplary structure after formation of backside bonding pads according to an embodiment of the present disclosure.

Referring to FIG. 31, the processing steps of FIGS. 21 and 22 can be performed to provide the fourth alternative configuration of the exemplary structure. Interfaces between the source layer 122 and the vertical semiconductor channels 60 comprise portions that are more distal from the alternating stack (32, 46) than the distal surface 12D of the dielectric spacer layer 12 is from the alternating stack (32, 46). In one embodiment, each of the vertical semiconductor channels 60 has a respective end surface contacting the source layer 122 and is more distal from the alternating stack (32, 46) than the distal surface 12D of the dielectric spacer layer 12 is form the alternating stack (32, 46). Further, each of the vertical semiconductor channels 60 may have a respective cylindrical surface that contacts cylindrical surface segments of the source layer 122 and is more distal from the alternating stack (32, 46) than the distal surface 12D of the dielectric spacer layer 12 is form the alternating stack (32, 46).

Figure 32:
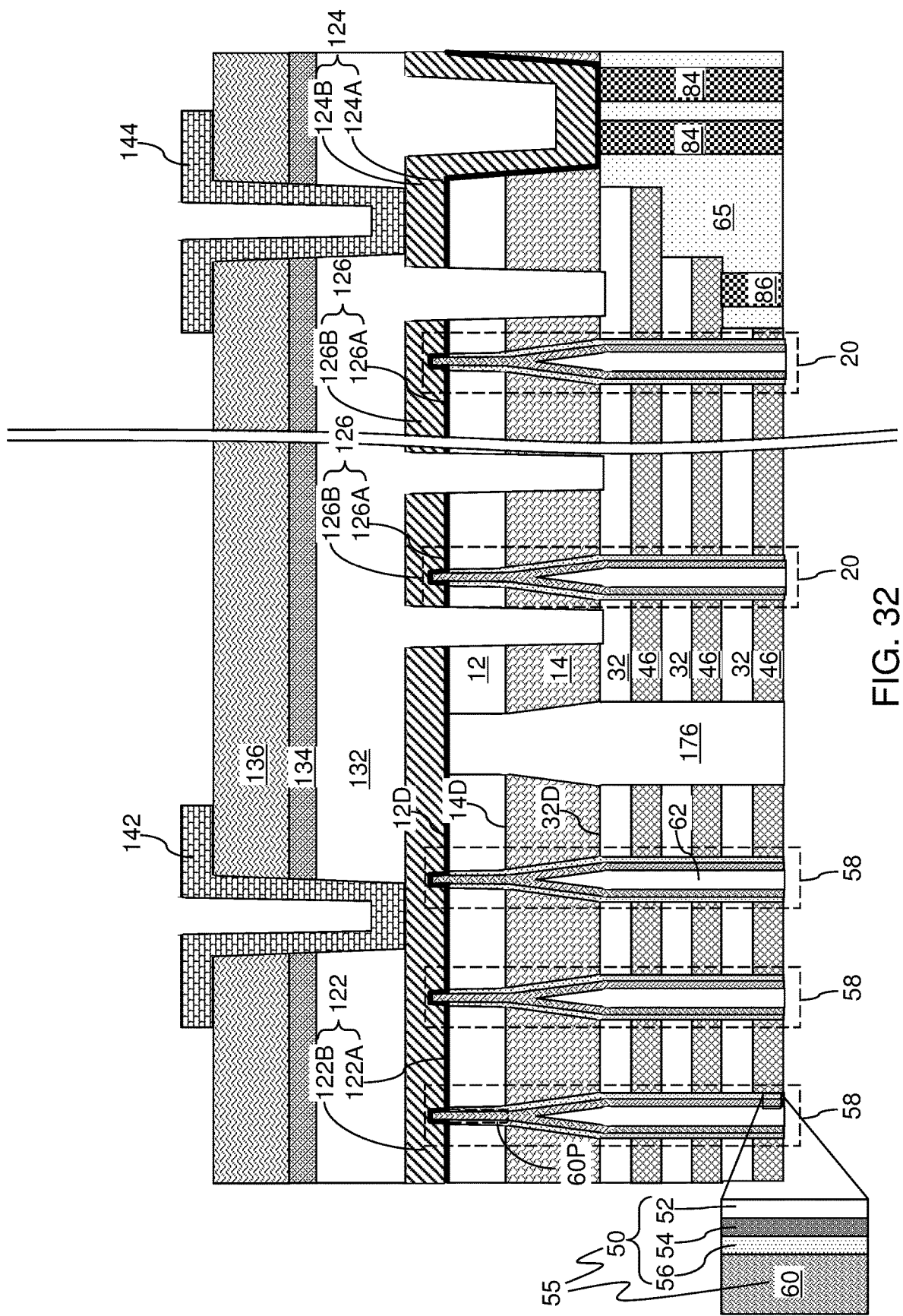
FIG. 32 is a vertical cross-sectional view of a fifth alternative configuration of the first exemplary structure after formation of backside bonding pads according to an embodiment of the present disclosure.

Referring to FIG. 32, a fifth alternative configuration of the exemplary according to an embodiment of the present disclosure can be derived from the fourth alternative configuration of the first exemplary structure by forming a dielectric backside trench fill structure 176 comprising a dielectric material in lieu of each combination of a backside insulating spacer 74 and a backside trench via structure 76 at the processing steps of FIG. 10.

Figure 33:
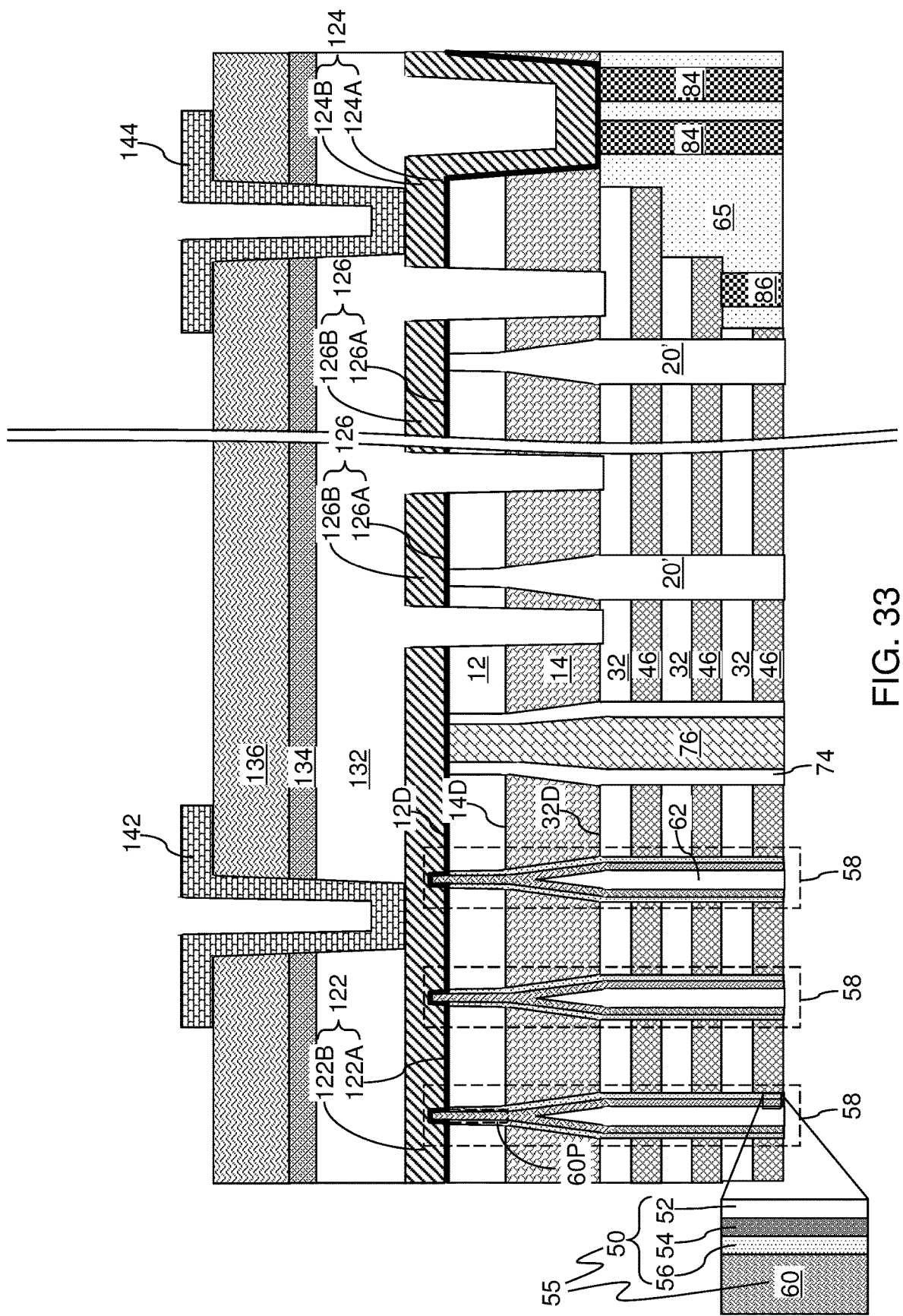
FIG. 33 is a vertical cross-sectional view of a sixth alternative configuration of the first exemplary structure after formation of backside bonding pads according to an embodiment of the present disclosure.

Referring to FIG. 33, a sixth alternative configuration of the first exemplary structure according to an embodiment of the present disclosure can be derived from the fourth alternative configuration of the first exemplary structure by forming dielectric support pillar structures 20' employing the methods described with reference to the second alternative configuration of the first exemplary structure in lieu of the support pillar structures 20 described with reference to the exemplary structure.

Figure 34:
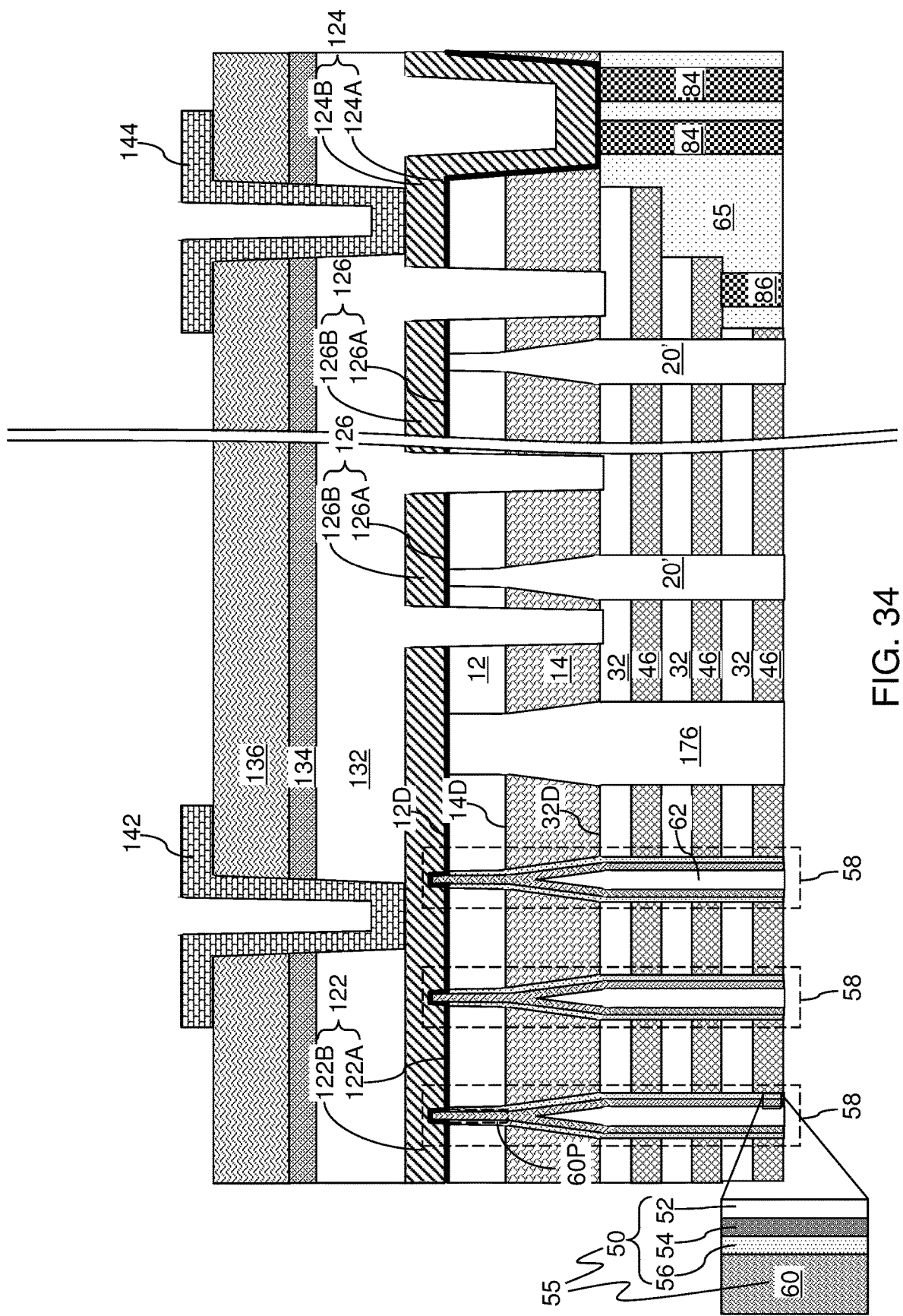
FIG. 34 is a vertical cross-sectional view of a seventh alternative configuration of the first exemplary structure after formation of backside bonding pads according to an embodiment of the present disclosure.

Referring to FIG. 34, a seventh alternative configuration of the first exemplary structure according to an embodiment of the present disclosure can be derived from the sixth alternative configuration of the first exemplary structure by forming a dielectric backside trench fill structure 176 comprising a dielectric material in lieu of each combination of a backside insulating spacer 74 and a backside trench via structure 76 at the processing steps of FIG. 10.

Figure 35:
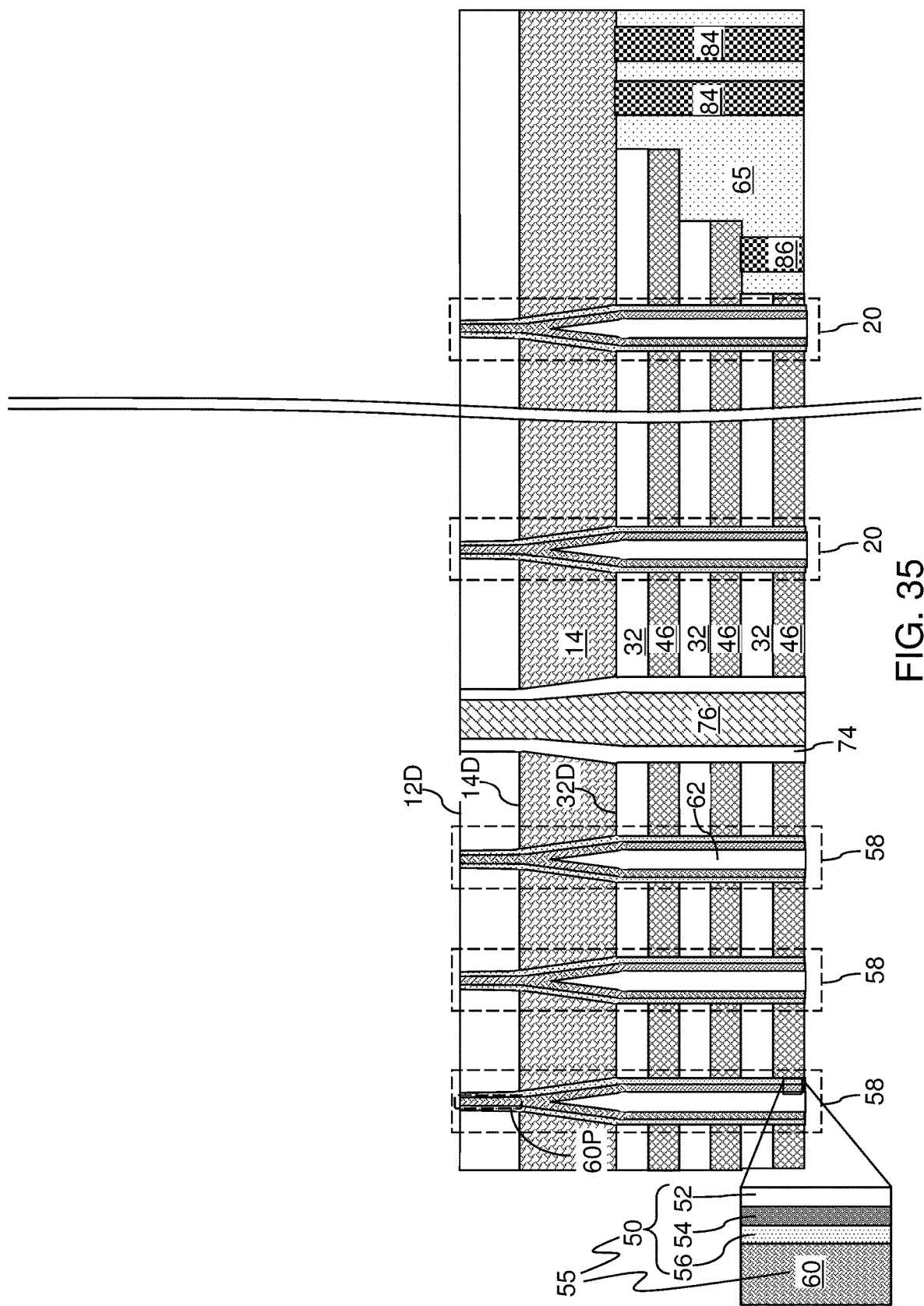
FIG. 35 is a vertical cross-sectional view of an eighth alternative configuration of the first exemplary structure after planarization of the distal surfaces of the memory opening fill structures and the support pillar structures according to an embodiment of the present disclosure.

Referring to FIG. 35, an eighth alternative configuration of the first exemplary structure according to an embodiment of the present disclosure may be the same as the first exemplary structure illustrated in FIG. 17. The carrier substrate 9 and end portions of the memory films 50 and the vertical semiconductor channels 60 are removed such that physically exposed end surfaces of the vertical semiconductor channels 60 are flush with a distal surface 12D of the dielectric spacer layer 12. In one embodiment, physically exposed end surfaces of the memory films 50 may be flush with (i.e., in the same horizontal plane as) the distal surface 12D of the dielectric spacer layer 12.

Optionally, a sacrificial dielectric layer (e.g., silicon oxide layer) may be formed over the distal surface 12D of the dielectric spacer layer 12 and the exposed pillar portions 60P. Subsequently, the above described ion implantation and/or recrystallization processes may optionally be performed on the pillar portions through the sacrificial dielectric layer. The sacrificial dielectric layer is then removed by selective etching or non-selective etch back.

Figure 36:
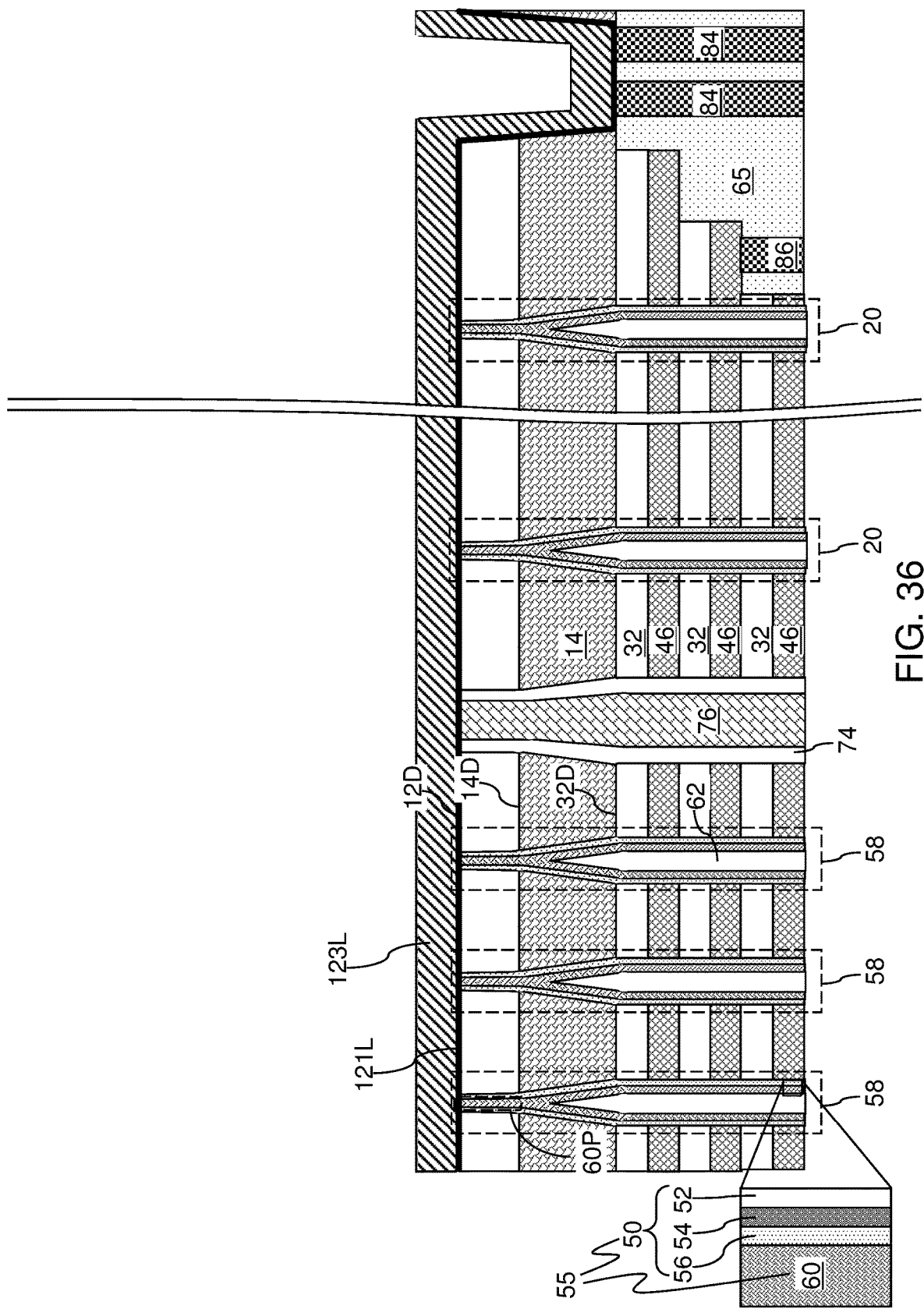
FIG. 36 is a vertical cross-sectional view of the eighth alternative configuration of the first exemplary structure after deposition of at least one metallic material layer according to an embodiment of the present disclosure.

Referring to FIG. 36, the processing steps of FIG. 18 can be performed to form contact recess regions 103. Subsequently, the processing steps of FIG. 20 can be performed to deposit at least one metallic material layer (121L, 123L) directly on physically exposed end surfaces and cylindrical surface segments of the protruding regions of the pillar portions 60P of the vertical semiconductor channels 60.

Figure 37:
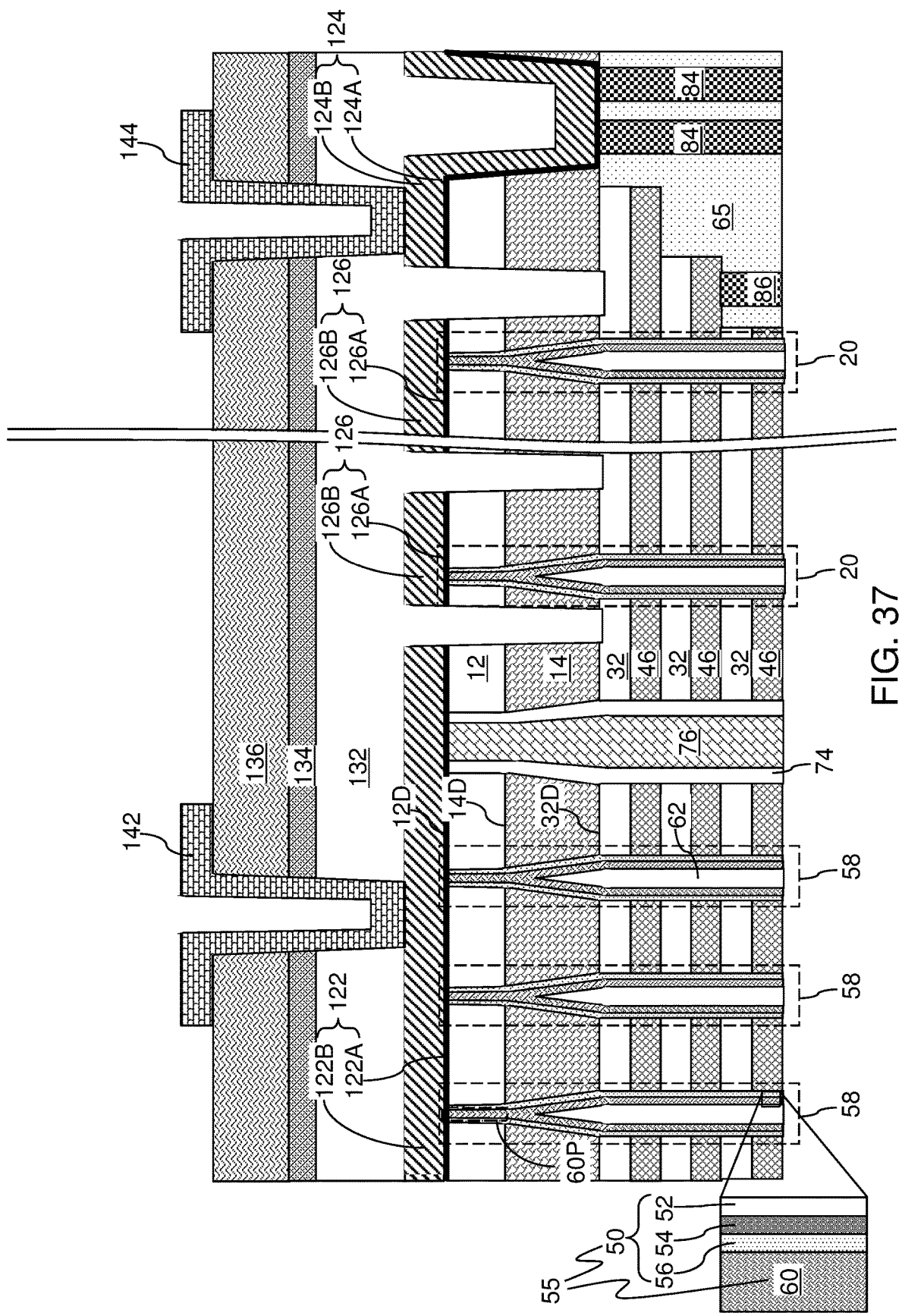
FIG. 37 is a vertical cross-sectional view of the eighth alternative configuration of the first exemplary structure after formation of backside bonding pads according to an embodiment of the present disclosure.

Referring to FIG. 37, the processing steps of FIGS. 21 and 22 can be performed to provide the eighth alternative configuration of the exemplary structure. Interfaces between the source layer 122 and the vertical semiconductor channels 60 may be flush (i.e., the same horizontal plane) with the distal surface 12D of the dielectric spacer layer 12. In one embodiment, each of the vertical semiconductor channels 60 has a respective end surface contacting the source layer 122 and is located within the same horizontal plane as the distal surface 12D of the dielectric spacer layer 12. In one embodiment, interfaces between the source layer 122 and the vertical semiconductor channels 60 are located entirely within the horizontal plane including the distal surface 12D of the dielectric spacer layer 12.

Figure 38:
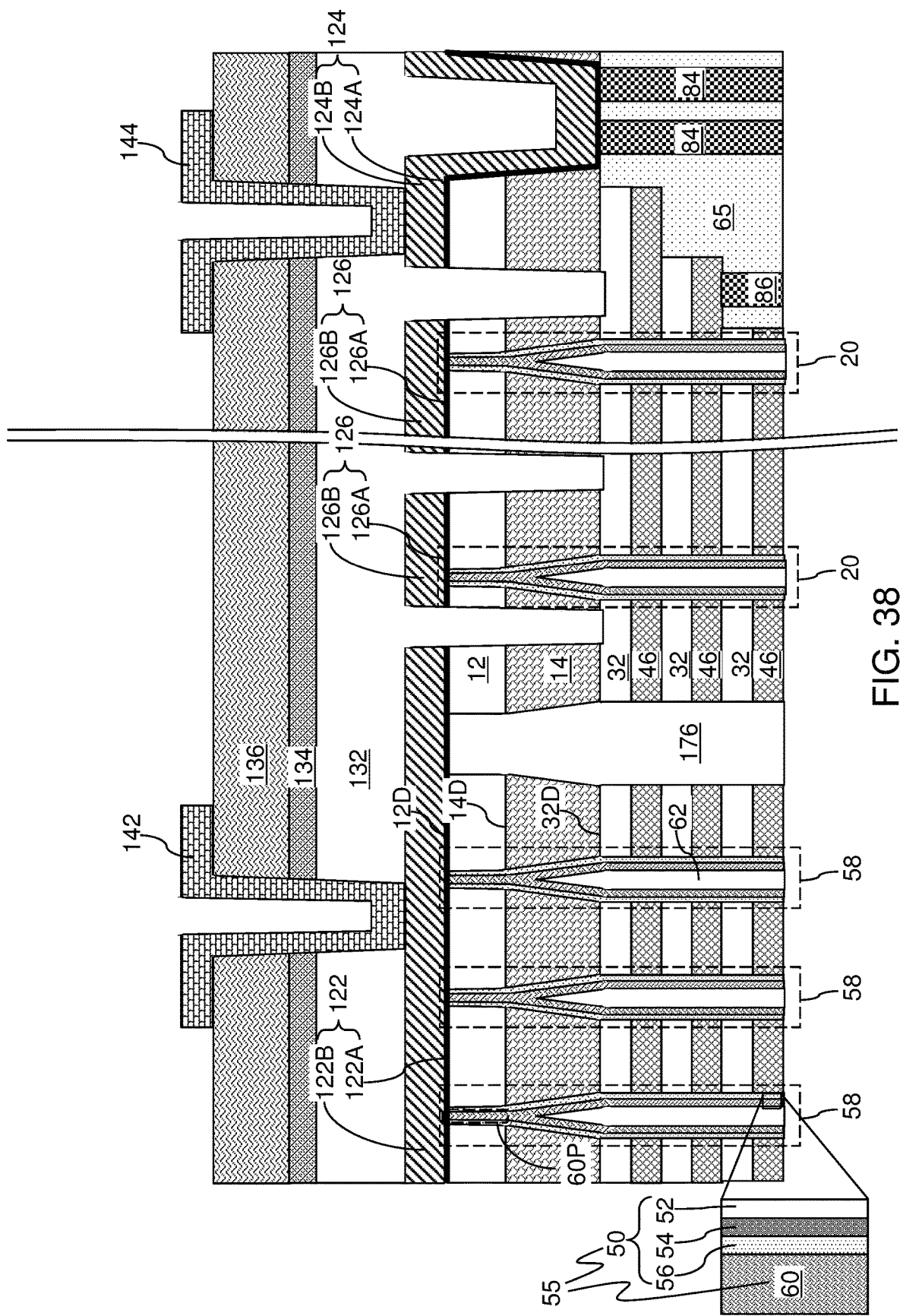
FIG. 38 is a vertical cross-sectional view of the ninth alternative configuration of the first exemplary structure after formation of backside bonding pads according to an embodiment of the present disclosure.

Referring to FIG. 38, a ninth alternative configuration of the exemplary according to an embodiment of the present disclosure can be derived from the eighth alternative configuration of the first exemplary structure by forming a dielectric backside trench fill structure 176 comprising a dielectric material in lieu of each combination of a backside insulating spacer 74 and a backside trench via structure 76 at the processing steps of FIG. 10.

Figure 39:
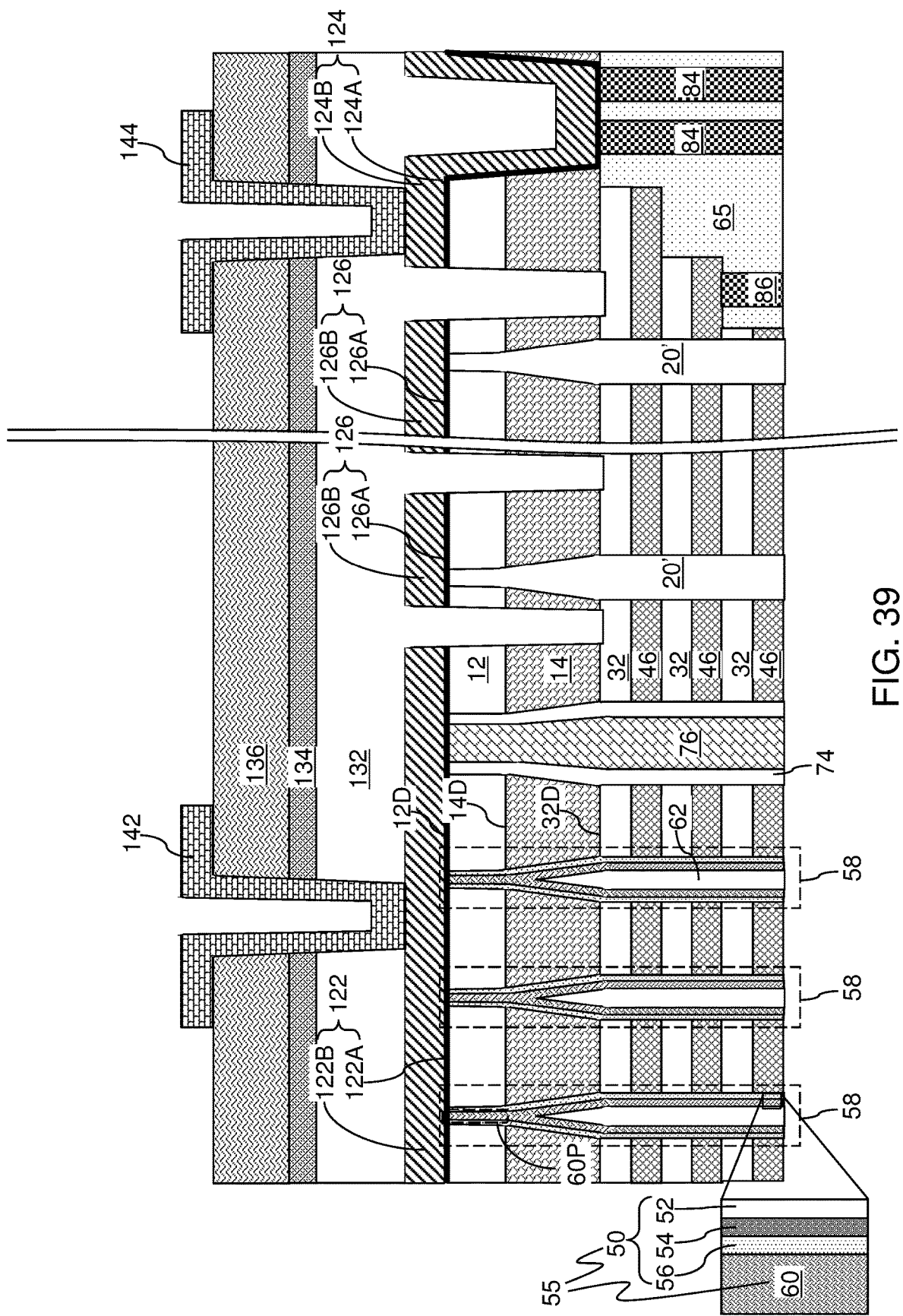
FIG. 39 is a vertical cross-sectional view of the tenth alternative configuration of the first exemplary structure after formation of backside bonding pads according to an embodiment of the present disclosure.

Referring to FIG. 39, a tenth alternative configuration of the first exemplary structure according to an embodiment of the present disclosure can be derived if from the eighth alternative configuration of the first exemplary structure by forming the dielectric support pillar structures 20' employing the methods described with reference to the second alternative configuration of the first exemplary structure in lieu of the support pillar structures 20 described with reference to the exemplary structure.

Figure 40:
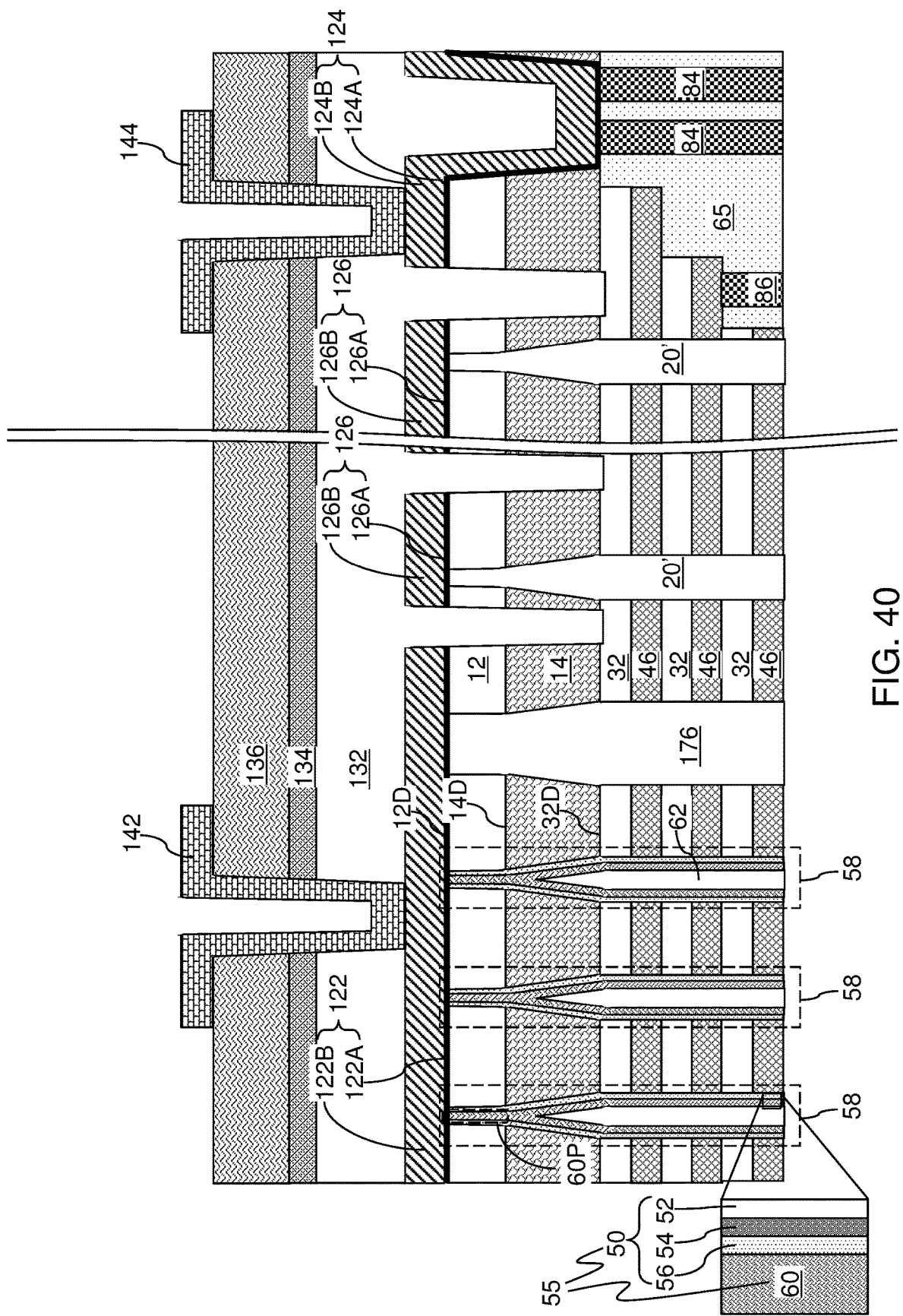
FIG. 40 is a vertical cross-sectional view of the eleventh alternative configuration of the first exemplary structure after formation of backside bonding pads according to an embodiment of the present disclosure.

Referring to FIG. 40, an eleventh alternative configuration of the first exemplary structure according to an embodiment of the present disclosure can be derived from the tenth alternative configuration of the first exemplary structure by forming a dielectric backside trench fill structure 176 comprising a dielectric material in lieu of each combination of a backside insulating spacer 74 and a backside trench via structure 76 at the processing steps of FIG. 10.

Referring to all drawings and according to various embodiments of the present disclosure, a semiconductor structure comprises: a memory die (such as a first semiconductor die 1000) bonded to a logic die (such as a second semiconductor die 700), the memory die comprising: an alternating stack of insulating layers 32 and electrically conductive layers 46; a semiconductor material layer 14 located over a distal surface 32D of the alternating stack (32, 46), wherein the semiconductor material layer 14 is more distal from the logic die than the alternating stack (32, 46) is from the logic die; a dielectric spacer layer 12 located over a distal surface 14D of the semiconductor material layer 14; memory openings 49 vertically extending through the alternating stack (32, 46), through the semiconductor material layer 14, and at least partly through the dielectric spacer layer 12; memory opening fill structures 58 located in the memory openings 49 wherein each of the memory opening fill structures 58 comprises a dielectric core 62, a vertical semiconductor channel 60 having a hollow portion 60H which surrounds the dielectric core 62 and a pillar portion 62P which does not surround the dielectric core 62, and a memory film 50; and a source layer 122 located over a distal surface 12D of the dielectric spacer layer 12 and contacting the pillar portions 60P of the vertical semiconductor channels 60.

In one embodiment, the pillar portion 60P has a higher dopant concentration than the hollow portion 60H. In another embodiment, the pillar portion 60P has a larger grain size than the hollow portion 60H.

In one embodiment, each of the memory openings 49 has a tapered-segment-containing vertical cross-sectional profile such that each of the memory openings 49 has a lesser lateral dimension within a horizontal plane including an interface between the semiconductor material layer 14 and the dielectric spacer layer 12 than within a horizontal plane including an interface between the semiconductor material layer 14 and the alternating stack (32, 46).

In one embodiment, the dielectric spacer layer 12 is more distal from the logic die than any portion of the dielectric cores 62 of the memory opening fill structures 58 is from the logic die. In one embodiment, each of the dielectric cores 62 has a respective conical portion embedded within the semiconductor material layer 14; and the respective conical portion has a respective apex that is more proximal to the logic die than the dielectric spacer layer 12 is to the logic die.

In one embodiment, each of the memory openings 49 has a sidewall including a sidewall segment of the semiconductor material layer 14 and a sidewall segment of the dielectric spacer layer 12; and the sidewall segment of the semiconductor material layer 14 has a greater taper angle relative to a vertical direction than the sidewall segment of the dielectric spacer layer 12.

In one embodiment shown in FIGS. 22A and 24A, the pillar portions 60P of the vertical semiconductor channels 60 have a respective end surface located between a horizontal plane including the distal surface 14D of the semiconductor material layer 14 and a horizontal plane including the distal surface 12D of the dielectric spacer layer 12; and the source layer 122 comprises vertically-protruding source portions vertically extending into the dielectric spacer layer 12 and having contact surfaces contacting the end surfaces of the pillar portions 60P of the vertical semiconductor channels 60. In one embodiment, each of the contact surfaces of the vertically-protruding source portions has a respective periphery that coincides with a periphery of a respective one of the end surfaces of the pillar portions 60P of the vertical semiconductor channels 60. In one embodiment, each of the vertically-protruding source portions comprises a respective cylindrical sidewall having a proximal periphery that coincides with a distal periphery of a sidewall of a respective one of the pillar portions 60P of the vertical semiconductor channels 60.

In the alternative embodiment shown in FIGS. 22B and 24B, the pillar portions 60P of the vertical semiconductor channels 60 have a respective end surface located between a horizontal plane including the distal surface 14D of the semiconductor material layer 14 and a horizontal plane including an opposing proximal surface 14P of the semiconductor material layer 14; and the source layer 122 comprises vertically-protruding source portions vertically extending into the semiconductor material layer 14 and having contact surfaces contacting the end surfaces of the pillar portions 60P of the vertical semiconductor channels 60.

In the second embodiment, each of the pillar portions 60P of the vertical semiconductor channels 60 has a respective end surface contacting the source layer 122 and located within a horizontal plane that includes the distal surface of the dielectric spacer layer 12 (or is more distal from the alternating stack (32, 46) than the distal surface of the dielectric spacer layer 12 is form the alternating stack (32, 46)).

In one embodiment, the logic die 700 contains peripheral semiconductor devices 710 configured to control operation of a three-dimensional array of memory elements (e.g., portions of the memory films 50 in the NAND strings) located in the memory die 1000.

In one embodiment, the alternating stack (32, 46) comprises a staircase region in which lateral extents of the alternating stack (32, 46) decrease with a vertical distance from the dielectric spacer layer 12 and in which stepped surfaces of the alternating stack (32, 46) are present; the memory die comprises a stepped dielectric material portion 65 contacting the stepped surfaces; and the memory die comprises support pillar structures (20, 20') that vertically extend through the stepped dielectric material portion 65, a respective portion of the alternating stack (32, 46), and the semiconductor material layer 14, and at least partly through the dielectric spacer layer 12.

In one embodiment, the semiconductor structure comprises: at least one backside dielectric material layer (132, 134, 136) located on the source layer 122; a bonding pad 142 vertically extending through the at least one backside dielectric material layer (132, 134, 136) and contacting the source layer 122; a pass-through via structure 84 that vertically extends through the stepped dielectric material portion 65; and an additional bonding pad 144 vertically extending through the at least one backside dielectric material layer (132, 134, 136) and electrically connected to the pass-through via structure 84.

Figure 41:
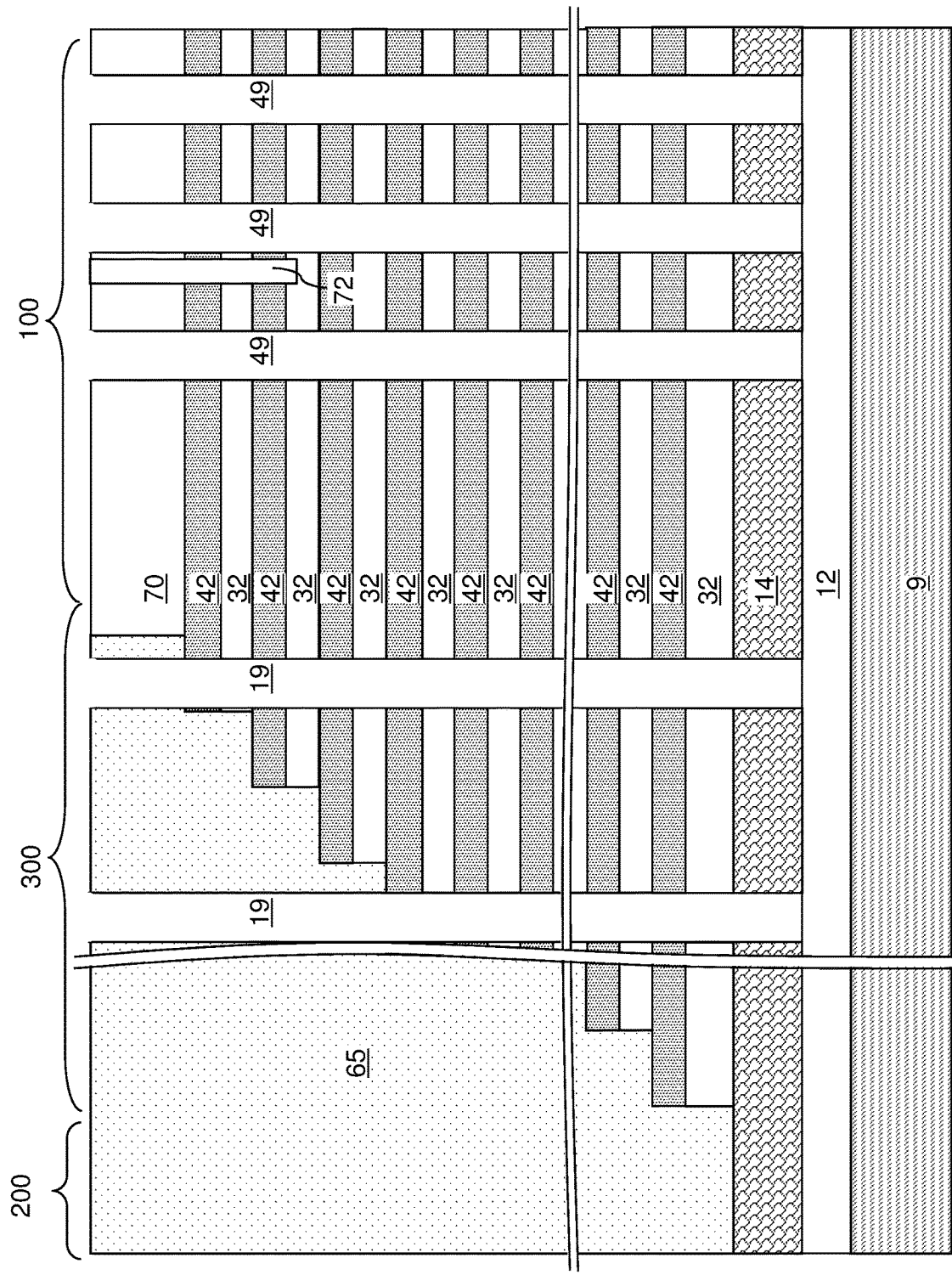
FIG. 41 is a schematic vertical cross-sectional view of a second exemplary structure after formation of a dielectric spacer layer, a semiconductor material layer, an alternating stack of insulating layers and sacrificial material layers, stepped surfaces, a stepped dielectric material portion, and memory opening and support openings over a carrier substrate according to an embodiment of the present disclosure.

Referring to FIG. 41, a second exemplary structure according to an embodiment of the present disclosure may be derived from the first exemplary structure illustrated in FIG. 2 by forming memory openings 49 and support openings through the insulating cap layer 70, the alternating stack (32, 42), the dielectric material portion 65, and the semiconductor material layer 14. The layout of the memory openings 49 and the support openings 19 in a plan view may be the same as in the first exemplary structure illustrated in FIGS. 3A and 3B. A patterned photoresist layer (not shown) may be employed as an etch mask. The anisotropic etch process employed to form the memory openings 49 and the support openings 19 of FIG. 41 may comprise a first anisotropic etch step that etches materials of the insulating cap layer 70, the alternating stack (32, 42), and the stepped dielectric material portion 65 selective to the semiconductor material of the semiconductor material layer 14, and a second anisotropic etch step that etches the material of the semiconductor material layer 14 selective to the material of the dielectric spacer layer 12. According to an aspect of the present disclosure, each of the memory openings 49 and the support openings 19 may have a respective straight sidewall that vertically extends from a horizontal plane including the top surface of the insulating cap layer 70 to a top surface of the dielectric spacer layer 12. An etch mask layer (such as the patterned photoresists layer) that is employed as an etch mask for the anisotropic etch process can be subsequently removed, for example, by ashing.

Figure 42:
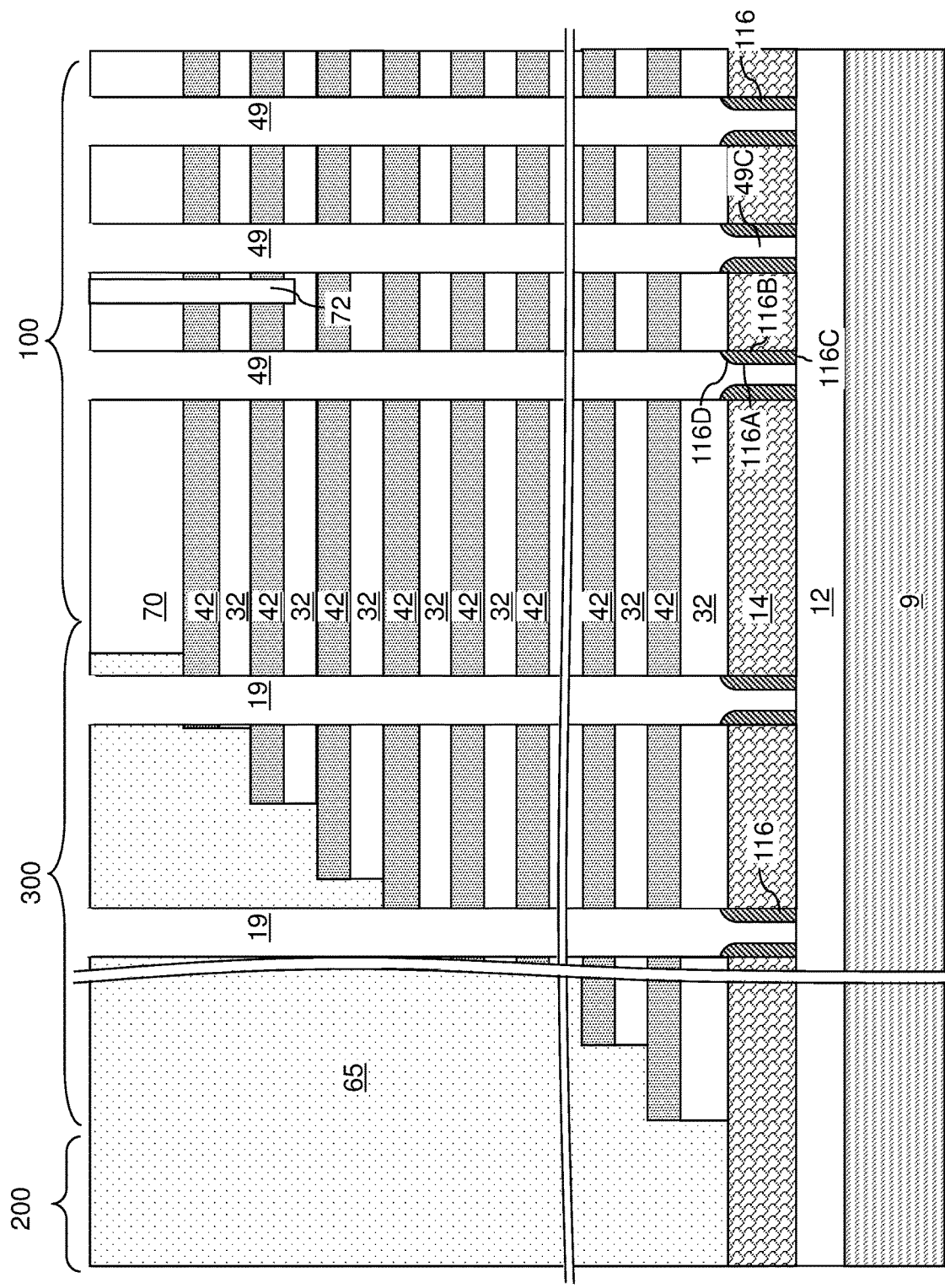
FIG. 42 is a schematic vertical cross-sectional view of the second exemplary structure after formation of tubular spacers according to an embodiment of the present disclosure.

Referring to FIG. 42 and according to an aspect of the present disclosure, a selective growth process can be performed to grow a semiconductor material or an electrically conductive material (such as a metal material) from physically exposed surfaces of the semiconductor material layer 14. The selective growth process may comprise a selective atomic layer deposition (ALD) process or a selective chemical vapor deposition (CVD) process in which a reactant gas and an etchant gas are concurrently or alternately flowed into a processing chamber. Generally, the nucleation rate of the decomposition products of the reactant gas on a physically exposed surface depends on the characteristics of the physically exposed surface.

Semiconductor surfaces such as physically exposed cylindrical surfaces of the semiconductor material layer 14 around the memory openings 49 and the support openings 19 provide a higher nucleation rate than dielectric surfaces such as surfaces of the alternating stack (32, 42), the insulating cap layer 70, and the stepped dielectric material portion 65. During the selective CVD growth process, the flow rate of the etchant gas is selected such that the etch rate for the decomposition products of the reactant gas is greater than that nucleation rate of the decomposition products on dielectric surfaces, and is less than the new creation rate of the decomposition products on semiconductor surfaces. In this case, the decomposition products of the reactant gas accumulates only on semiconductor surfaces, and does not accumulate on dielectric surfaces.

The semiconductor material or the conductive material that grows from the physically exposed semiconductor surfaces of the semiconductor material layer 14 constitutes tubular spacers 116 having a respective tubular configuration. The duration of the selective growth process can be selected such that the lateral thickness, i.e., the lateral distance between an inner cylindrical sidewall and an outer cylindrical sidewall, of each tubular spacer 116 is less than the radius (in case of opening having a circular horizontal cross-sectional shapes) or the minor axis (in case of openings having an elliptical horizontal cross-sectional shapes) of each memory opening 49 and each support opening 19. In other words, the duration of the tubular spacer 116 growth process is less than the time it takes the tubular spacers 116 to completely fill the entire width of the memory openings 49, and there is a cavity 49C remaining between the inner sidewall(s) 116A of the tubular spacers 116 in each memory opening 49. The cavity 49C has a narrower width than the width of the memory opening 49.

In one embodiment, each tubular spacer 116 comprises a cylindrical outer sidewall 116B, the cylindrical inner sidewall 116A that is laterally offset inward from the cylindrical outer sidewall 116B by a uniform lateral offset distance (i.e., the lateral thickness), a planar annular surface 116C contacting the dielectric spacer layer 12 and connecting a bottom periphery of the cylindrical inner sidewall 116A to a bottom periphery of the cylindrical outer sidewall 116B, and a convex annular surface 116D connecting a top periphery of the cylindrical inner sidewall 116A to a top periphery of the cylindrical outer sidewall 116B. Alternatively, the convex annular surface 116D may be replaced by at least one faceted surface segment in case faceting occurs growth of the semiconductor material or the conductive material of the tubular spacers 116.

The lateral thickness of the tubular spacers 116, as measured between an inner cylindrical sidewall 116A and an outer cylindrical sidewall 116B, may be in a range from 20% to 90%, such as from 30% to 80%, and/or from 40% to 70%, of the radius or the minor axis of the bottom region of the memory openings 49 and the support openings 19. In an illustrative example, the radius or the minor axis of the horizontal cross-sectional shape at a bottom region of each of the memory openings 49 and the support openings 19 may be in a range from 15 nm to 100 nm, such as from 20 nm to 80 nm, and the lateral thickness of the tubular spacers 116 may be in a range from 5 nm to 80 nm, such as from 10 nm to 40 nm, although lesser and greater lateral thicknesses may also be employed.

In case the tubular spacers 116 comprise a semiconductor material, then the tubular spacers 116 may comprise, and/or may consist essentially of, amorphous silicon, polysilicon, a silicon germanium alloy, or a compound semiconductor material. The semiconductor material of the tubular spacers 116 may or may not be doped. For example, if the semiconductor material layer 14 comprises a doped silicon layer of a second conductivity type (e.g., n-type), then the tubular spacers 116 may also comprise doped silicon of the second conductivity type. In case the tubular spacers 116 comprise a conductive material, then tubular spacers 116 may comprise, and/or may consist essentially of an elemental metal (such as W, Ti, Ta, Mo, Ru, Co), or a metal-semiconductor alloy (such as a metal silicide) that is formed by selective growth of a metal and subsequent anneal to cause reaction between the metal and the semiconductor material in the semiconductor material layer 14. In case the selectively deposited material of the tubular spacers 116 does not react with the semiconductor material in the semiconductor material layer 14, then the cylindrical outer surfaces 116B of the tubular spacers 116 may be vertically coincident with an overlying cylindrical sidewall of a respective memory opening 49 or a respective support opening 19. A surface segment of the dielectric spacer layer 12 is a physically exposed underneath each cavity 49C (e.g., a cylindrical cavity which is a portion of a respective memory opening 49 or a support opening 19) that is laterally surrounded by a respective tubular spacer 116.

Figure 43:
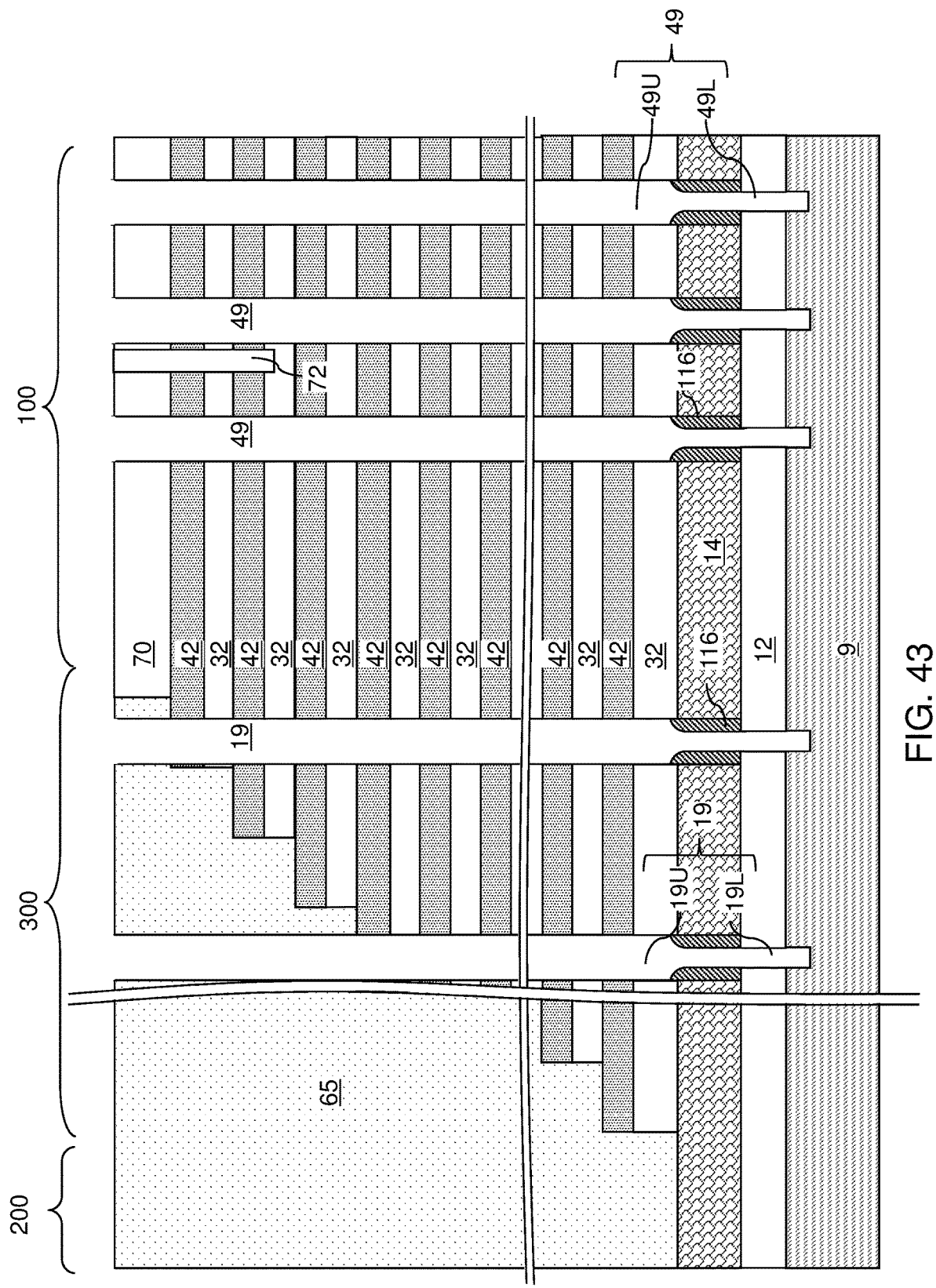
FIG. 43 is a schematic vertical cross-sectional view of the second exemplary structure after vertically extending the memory openings and the support openings according to an embodiment of the present disclosure.

Referring to FIG. 43, an extension etch process can be performed to etch the material of the dielectric spacer layer 12 selective to the material of the tubular spacers 116. The extension etch process may comprise an anisotropic etch process. Each of the memory openings 49 and the support openings 19 may be vertically extended through the dielectric spacer layer 12 underneath a respective cavity 49C that is laterally surrounded by a respective tubular spacer 116. In one embodiment, top portions of the carrier substrate 9 may be collaterally etched during a terminal portion of the extension etch process. Generally, the extension etch process may anisotropically etch portions of the dielectric spacer layer 12 that are not masked by the tubular spacers 116, the alternating stack (32, 42), or the stepped dielectric material portion 65 after formation of the tubular spacer 116. A bottom end portion of each of the memory openings 49 and the support openings 19 is vertically extended through the dielectric spacer layer 12. Each of the memory openings 49 and the support openings 19 may have a respective upper portion (49U, 19U) located over the horizontal plane including a top surface of the semiconductor material layer 14, and the respective lower portion (49L, 19L) located under the horizontal plane including the top surface of the semiconductor material layer 14. The lower portion has a smaller area and a smaller width (e.g., diameter) than the upper portion. The lower portion may comprise a cylindrical cavity having a uniform horizontal cross-sectional shape and vertically-extending from a top edge of an inner cylindrical sidewall 116A of a tubular spacer 116 to a periphery of a bottommost surface of a respective memory opening 49 or a respective support opening 19.

Figure 44:
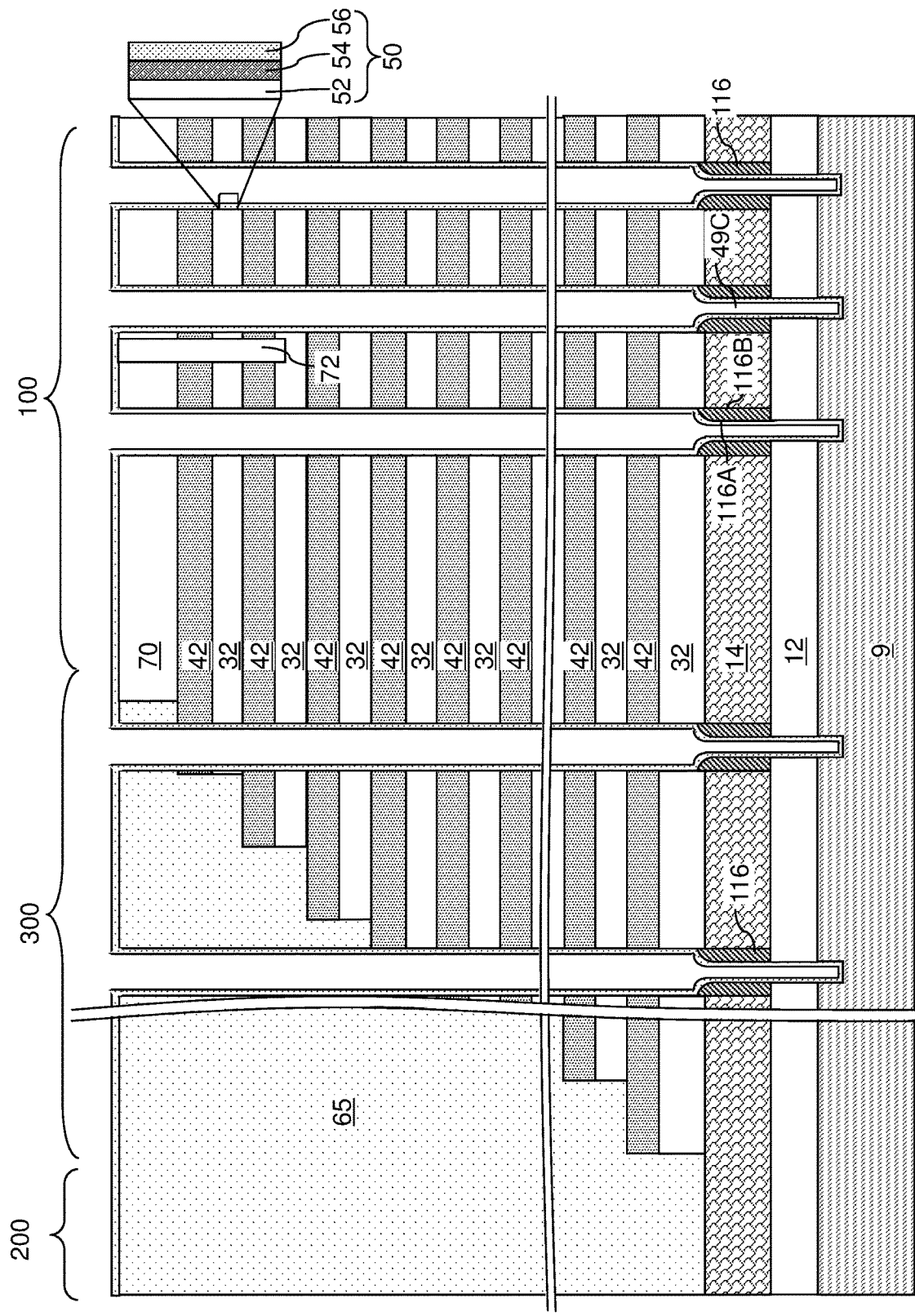
FIG. 44 is a schematic vertical cross-sectional view of the second exemplary structure after formation of a memory film according to an embodiment of the present disclosure.

Referring to FIG. 44, a memory film 50 is conformally deposited directly on a physically exposed surfaces of the carrier substrate 9, physically exposed cylindrical sidewalls of the dielectric spacer layer 12, physically exposed inner sidewalls of the tubular spacers 116, physically exposed sidewalls of the insulating layers 32 and the spacer material layers 42, and a physically exposed as surfaces of the insulating cap layer 70 and the stepped dielectric material portion 65. Thus, memory film 50 is deposited into the memory openings 49 and the support openings 19 as described above with reference to FIG. 4. The memory film 50 can be deposited in an outer portion of each cylindrical cavity 49C that is laterally surrounded by a respective tubular spacer 116. In one embodiment, the memory film 50 comprises a stack of layers including the blocking dielectric layer 52, the charge storage layer 54, the tunneling dielectric layer 56. In one embodiment, each component layer within the memory film 50 may have the same material composition and the same thickness range as in the first exemplary structure described with reference to FIG. 4.

In one embodiment, each tubular spacer 116 may have the outer sidewall 116B that is vertically coincident with and is adjoined to an outer sidewall of a memory film 50 located in a same memory opening 49 or located in a same support opening 19. The cylindrical inner sidewall 116A contacts the outer sidewall of the memory film 50.

Figure 45:
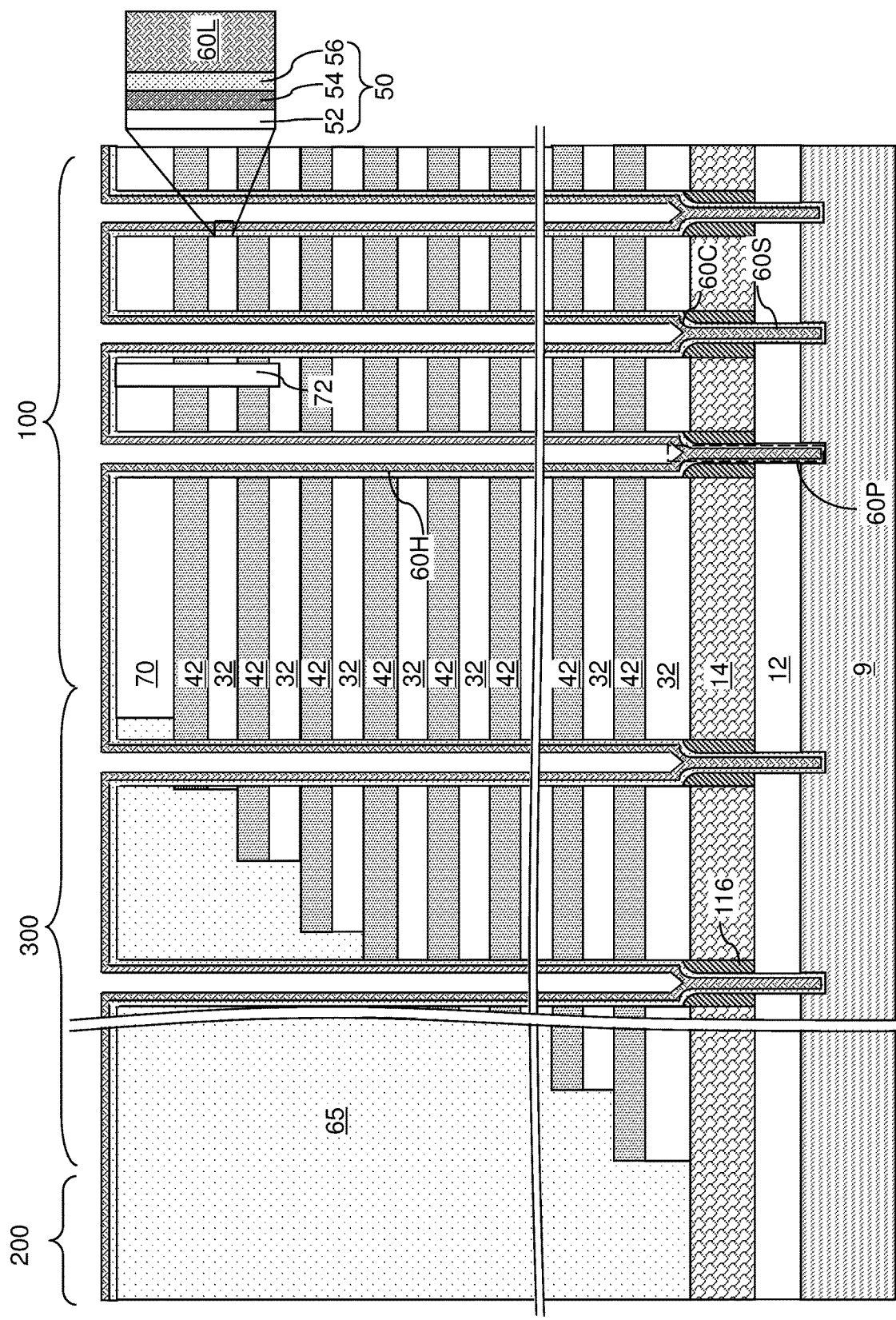
FIG. 45 is a schematic vertical cross-sectional view of the second exemplary structure after formation of a semiconductor channel material layer according to an embodiment of the present disclosure.

Referring to FIG. 45, a semiconductor channel material layer 60L can be formed on the memory film 50. In one embodiment, the semiconductor channel material layer 60L may have the same material composition and the same thickness range as in the first exemplary structure described with reference to FIG. 4. Each portion of the semiconductor channel material layer 60L that is deposited in a memory opening 49 or in a support opening 19 comprises a respective pillar portion 60P that is formed in a lower portion of the memory opening 49 or the support openings 19, and a respective hollow portion 60H that is formed in an upper portion of the memory opening 49 or the support opening 19. The semiconductor channel material layer 60L is formed in, and fills, an inner portion of each cylindrical cavity that is laterally surrounded by a respective tubular spacer 116. Each pillar portion 60P vertically extends through an opening (e.g., the cavity 49C) in a respective tubular spacer 116. In one embodiment, each pillar portion 60P comprises a straight cylindrical surface segment 60S and an annular concave surface segment 60C connecting an edge of the straight cylindrical surface segment and a bottom edge of an outer sidewall of an overlying hollow portion 60H of the semiconductor channel material layer 60L. In one embodiment, the straight cylindrical surface segment vertically extends through the semiconductor material layer 14 and through the dielectric spacer layer 12.

Figure 46:
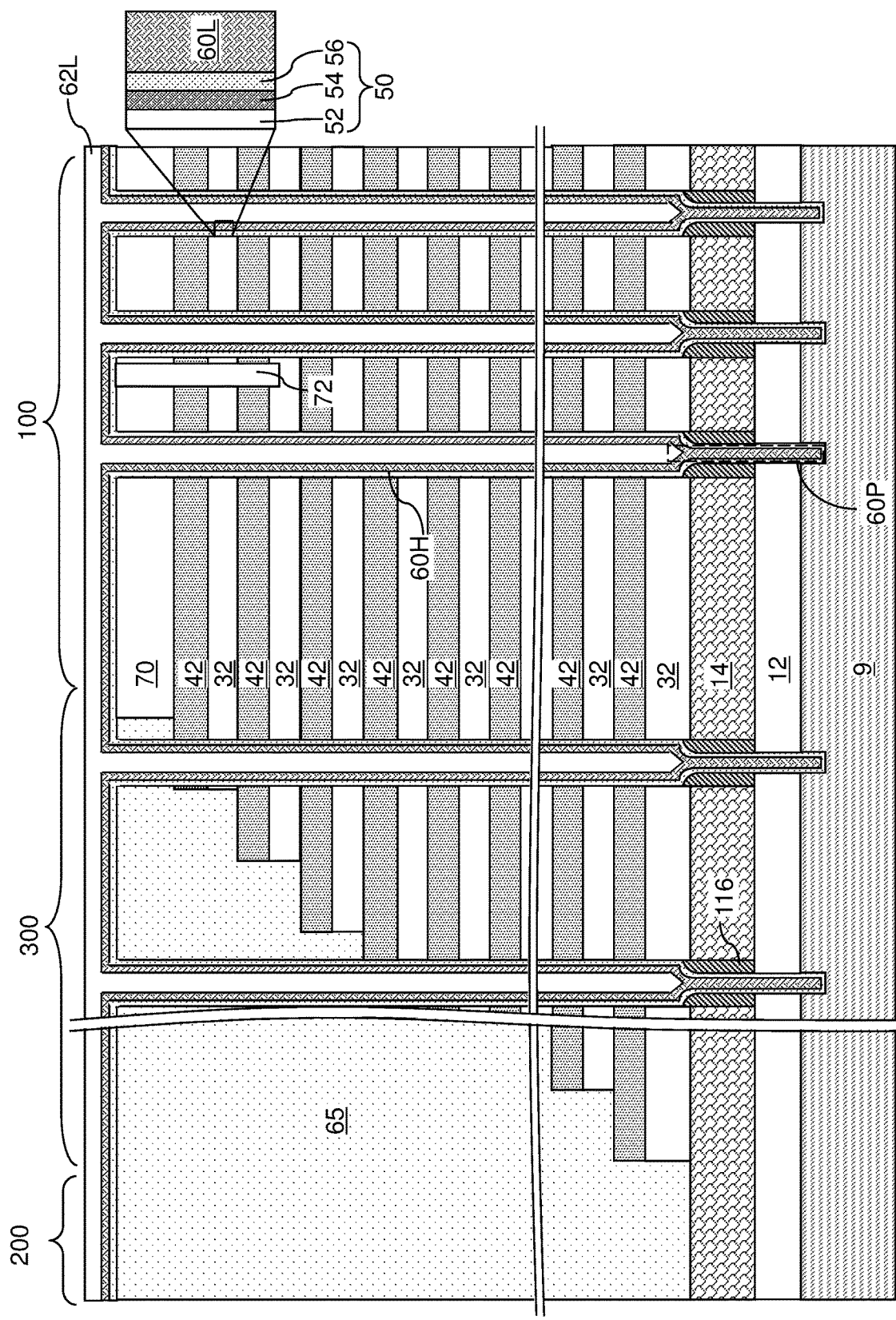
FIG. 46 is a schematic vertical cross-sectional view of the second exemplary structure after formation of a dielectric core material layer according to an embodiment of the present disclosure.

Referring to FIG. 46, a dielectric core layer 62L can be deposited in the elongated empty volumes within the memory openings 49 and the support openings 19. The dielectric core layer 62L includes a dielectric material, such as silicon oxide or organosilicate glass. The dielectric core layer 62L can be deposited by a conformal deposition method such as low pressure chemical vapor deposition (LPCVD), atomic layer deposition (ALD), or by a self-planarizing deposition process, such as spin coating.

Figure 47:
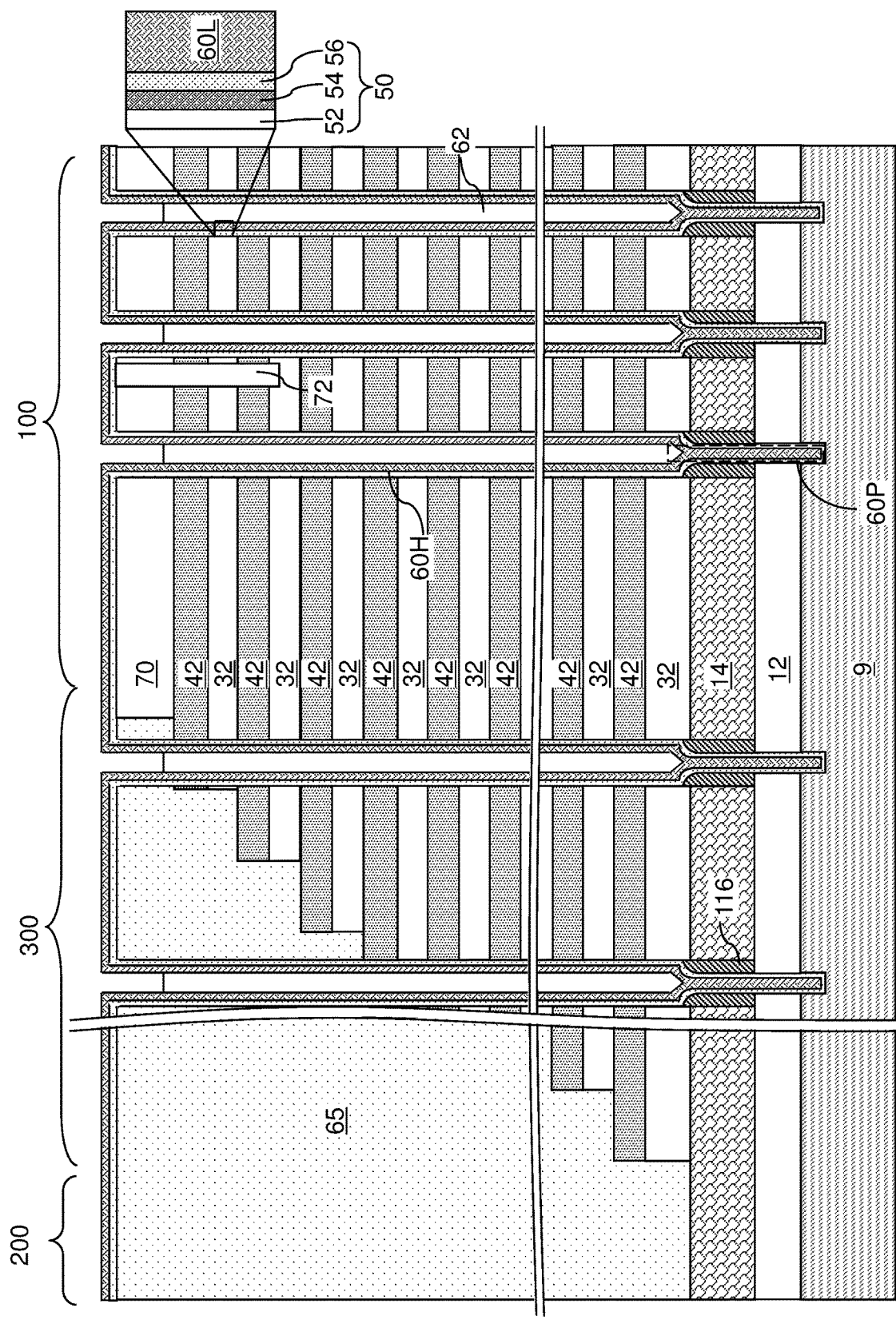
FIG. 47 is a schematic vertical cross-sectional view of the second exemplary structure after formation of dielectric cores according to an embodiment of the present disclosure.

Referring to FIG. 47, the dielectric core layer 62L can be recessed selective to the material of the semiconductor channel material layer 60L, for example, by a recess etch. The material of the dielectric core layer 62L is vertically recessed below the horizontal plane core layer 62L constitutes a dielectric core 62.

Figure 48:
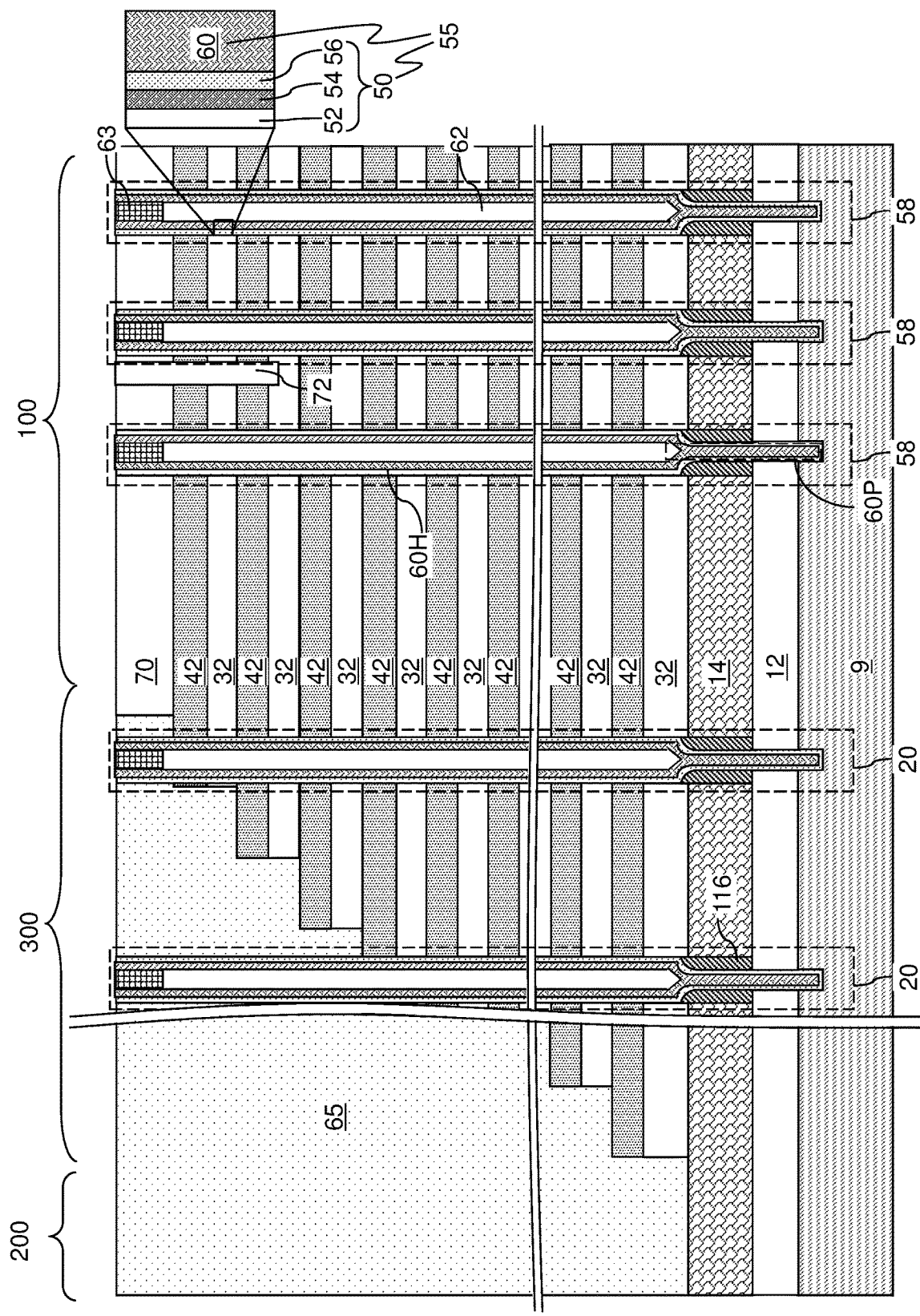
FIG. 48 is a schematic vertical cross-sectional view of the second exemplary structure after formation of memory opening fill structures and support pillar structures according to an embodiment of the present disclosure.

Referring to FIG. 48, a semiconductor material having a doping of a second conductivity type can be deposited in the recess regions that overlie the dielectric cores 62. The second conductivity type that is the opposite of the first conductivity type. For example, if the first conductivity type is p-type, the second conductivity type is n-type, and vice versa. The atomic concentration of dopants of the second conductivity type in the deposited semiconductor material can be in a range from $5.0 \times 10^{18}/cm^3$ to $2.0 \times 10^{21}/cm^3$, although lesser and greater atomic concentrations can also be used. The doped semiconductor material can be, for example, doped poly silicon.

Portions of the deposited semiconductor material, the semiconductor channel material layer 60L, and the memory film 50 that are located above the horizontal plane including the top surface of the insulating cap layer 70 can be removed by a planarization process. For example, a chemical mechanical polishing (CMP) process or a recess etch process may be employed to remove material portions that overlie the horizontal plane including the top surface of the insulating cap layer 70. Each remaining portion of the doped semiconductor material having a doping of the second conductivity type constitutes a drain region 63. Each drain region 63 can be formed at a distal end, i.e., a top end, of a vertical semiconductor channel 60 that is distal from the semiconductor material layer 14 and the dielectric spacer layer 12. Each remaining portion of the semiconductor channel material layer 60L that remains in a respective memory opening 49 or in a respective support opening 19 constitutes a vertical semiconductor channel 60. The memory film 50 is divided into a plurality of memory films 50 located within a respective one of the memory openings 49 and the support openings 19.

Electrical current can flow through each vertical semiconductor channel 60 when a vertical NAND string including the vertical semiconductor channel 60 is turned on. Within each memory opening 49, a tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitutes a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. Each combination of a memory film 50 and a vertical semiconductor channel 60 constitutes a memory stack structure 55.

Each memory stack structure 55 is a combination of a semiconductor channel 60, a tunneling dielectric layer 56, a plurality of memory elements comprising portions of the charge storage layer 54, and an optional blocking dielectric layer 52. Each combination of a tubular spacer 116, a memory stack structure 55, a dielectric core 62, and a drain region 63 within a memory opening 49 is herein referred to as a memory opening fill structure 58. Each combination of a tubular spacer 116, a memory film 50, a vertical semiconductor channel 60, a dielectric core 62, and a drain region 63 within each support opening 19 constitutes a support pillar structure 20.

An instance of a memory opening fill structure 58 can be formed within each memory opening 49. An instance of the support pillar structure 20 can be formed within each support opening 19. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the above embodiment is described using the configuration of FIG. 48 for the memory stack structure, the methods of the present disclosure can be applied to alternative memory stack structures including different layer stacks or structures for the memory film 50 and/or for the vertical semiconductor channel 60.

Generally, memory opening fill structures 58 are formed in the memory openings 49. Each of the memory stack structures 58 comprises a respective tubular spacer 116, a respective memory film 50 and a respective vertical semiconductor channel 60. According to an aspect of the present disclosure, each vertical semiconductor channel 60 includes a pillar portion 60P that vertically extends through the dielectric spacer layer 12 and has no hollow space inside. In one embodiment, each of the memory opening fill structures 58 comprises a respective dielectric core 62 that is laterally surrounded by the respective vertical semiconductor channel 60. The dielectric core 62 does not extend inside the pillar portion 60P, and the pillar portion 60P does not surround the dielectric core 62. Each vertical semiconductor channel 60 also includes a hollow portion 60H which surrounds the dielectric core 62.

In one embodiment, each vertical semiconductor channel 60 comprises a hollow portion 60H which laterally surrounds the dielectric core 62 and vertically extends through the alternating stack (32, 42), and a pillar portion 60P which vertically extends through the semiconductor material layer 14 and the dielectric spacer 12 and does not surround the dielectric core 62. Each vertical semiconductor channel 60 is formed in and fills an inner portion of a respective cavity 49C that is laterally surrounded by a respective tubular spacer 116. Each memory opening fill structure 58 is located in a respective memory opening 49. In one embodiment, each memory opening fill structure 58 comprises a tubular spacer 116 that is formed by selective deposition of a material on physically exposed surfaces of the semiconductor material layer 14 while suppressing growth of the material from physically exposed surfaces of the alternating stack (32, 42), a memory film 50 that is deposited on the tubular spacer 116 and on sidewalls of the alternating stack (32, 42), a vertical semiconductor channel 60 that is formed on the memory film 50, and a dielectric core 62 that is formed on the vertical semiconductor channel 60. The vertical semiconductor channel 60 has a hollow portion 60H which surrounds the dielectric core 62 and a pillar portion 60P which does not surround the dielectric core 62. The tubular spacer 116 laterally surrounds the pillar portion 60P, is laterally spaced from the pillar portion 60P by a cylindrical portion of the memory film 50, and contacts a cylindrical sidewall of the semiconductor material layer 14.

Figure 49A:
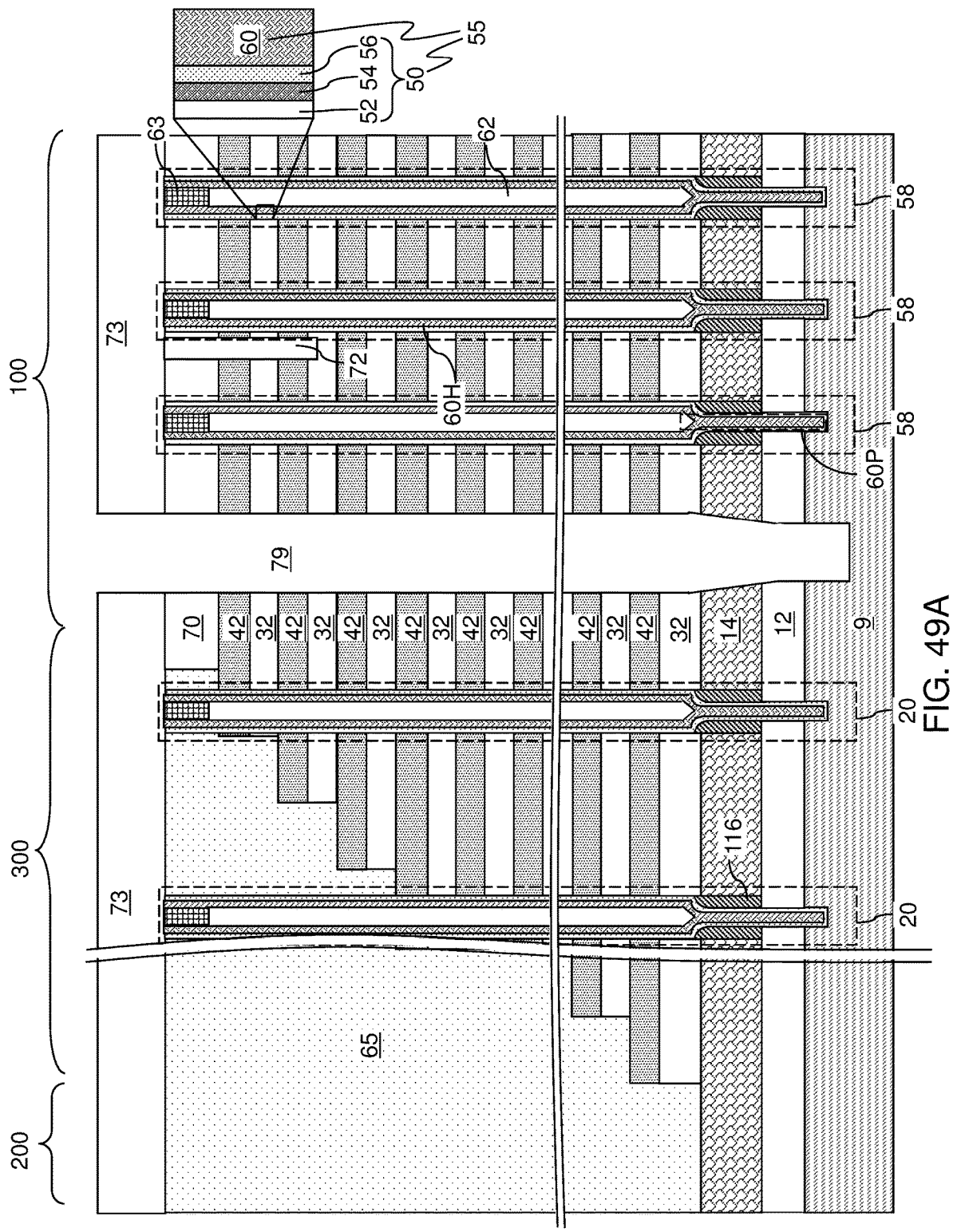
FIG. 49A is a schematic vertical cross-sectional view of the second exemplary structure after formation of a contact-level dielectric layer and backside trenches according to an embodiment of the present disclosure.
Figure 49B:
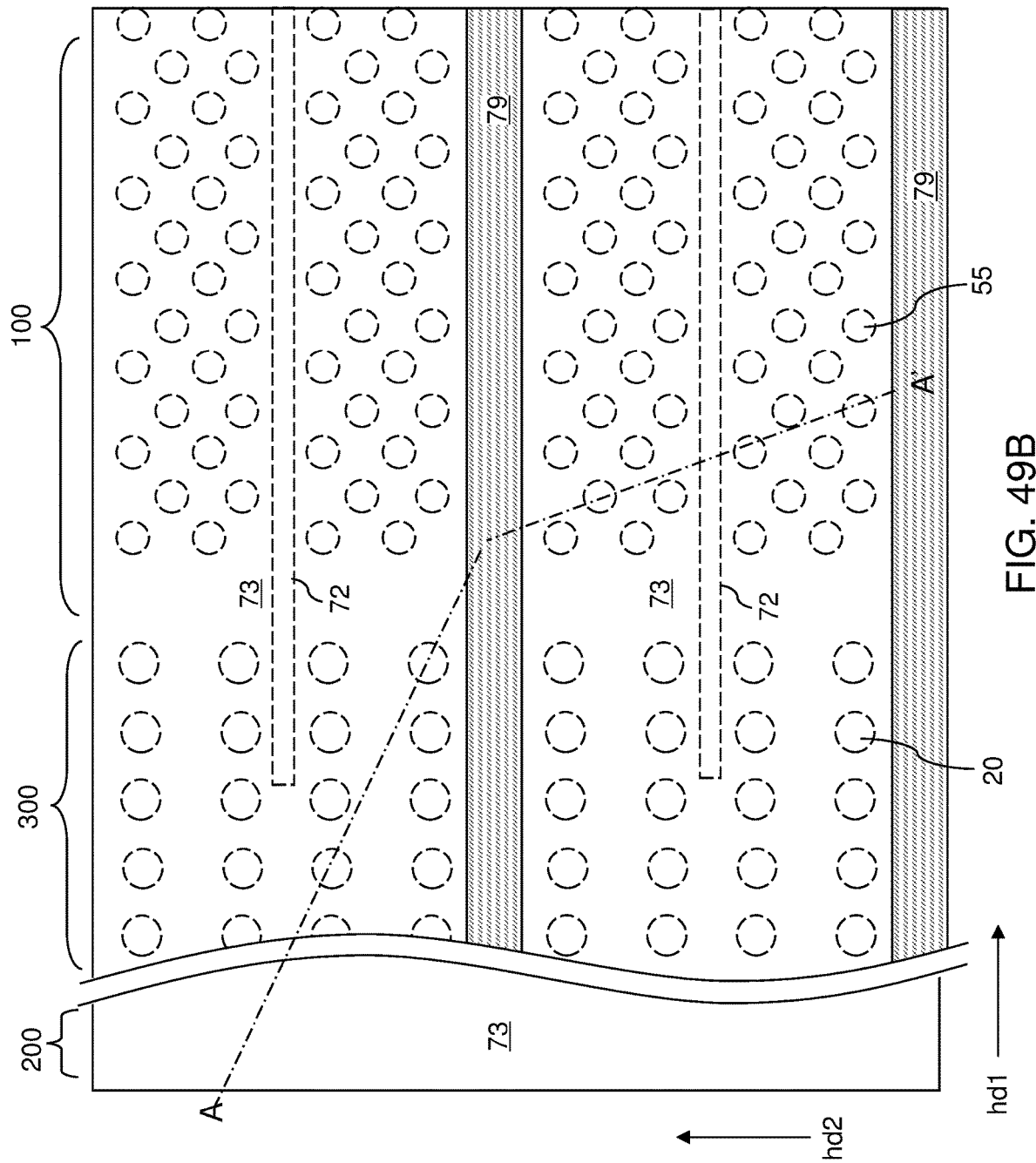
FIG. 49B is a partial see-through top-down view of the second exemplary structure of FIG. 49A. The vertical plane A-A' is the plane of the schematic vertical cross-sectional view of FIG. 49A.

Referring to FIGS. 49A and 49B, a contact-level dielectric layer 73 and backside trenches 79 may be formed by performing the processing steps described with reference to FIGS. 7A and 7B.

Figure 50A:
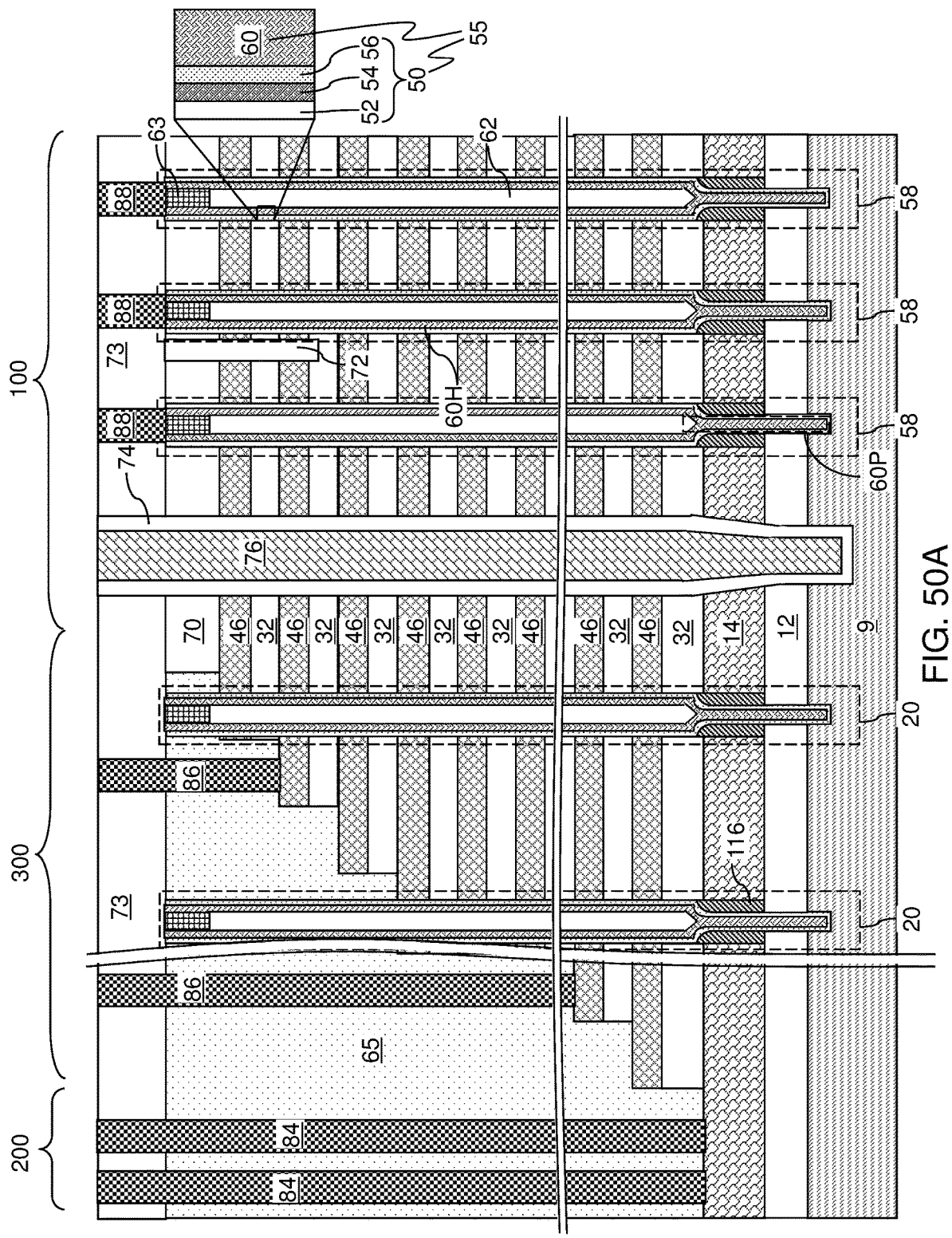
FIG. 50A is a schematic vertical cross-sectional view of the second exemplary structure after replacement of sacrificial material layers with electrically conductive layers and formation of backside trench fill structures and contact via structures according to an embodiment of the present disclosure.
Figure 50B:
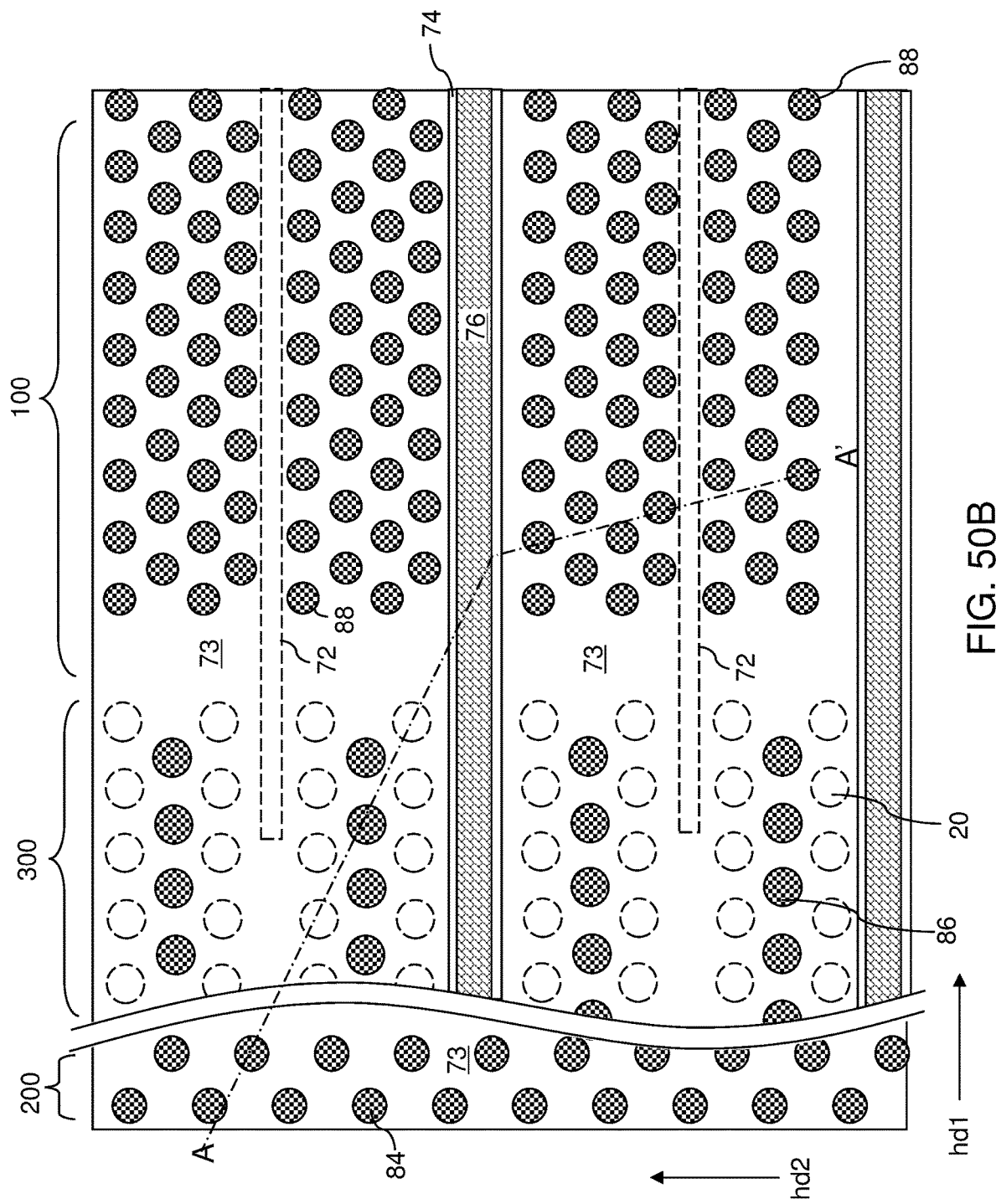
FIG. 50B is a top-down view of the second exemplary structure of FIG. 50A. The vertical plane A-A' is the plane of the schematic vertical cross-sectional view of FIG. 50A.

Referring to FIGS. 50A and 50B, the processing steps described with reference to FIG. 8 may be performed to form backside recesses 43 through removal of the sacrificial material layers 42 selective to the insulating layers 32. The processing steps described with reference to FIG. 9 may be performed to form electrically conductive layers 46 in the backside recesses 43. The processing steps described with reference to FIG. 10 may be performed to form backside insulating spacers 74 and backside trench fill structures 76. The processing steps described with reference to FIGS. 11A and 11B may be performed to form various contact via structures (88, 86, 84).

Figure 51A:
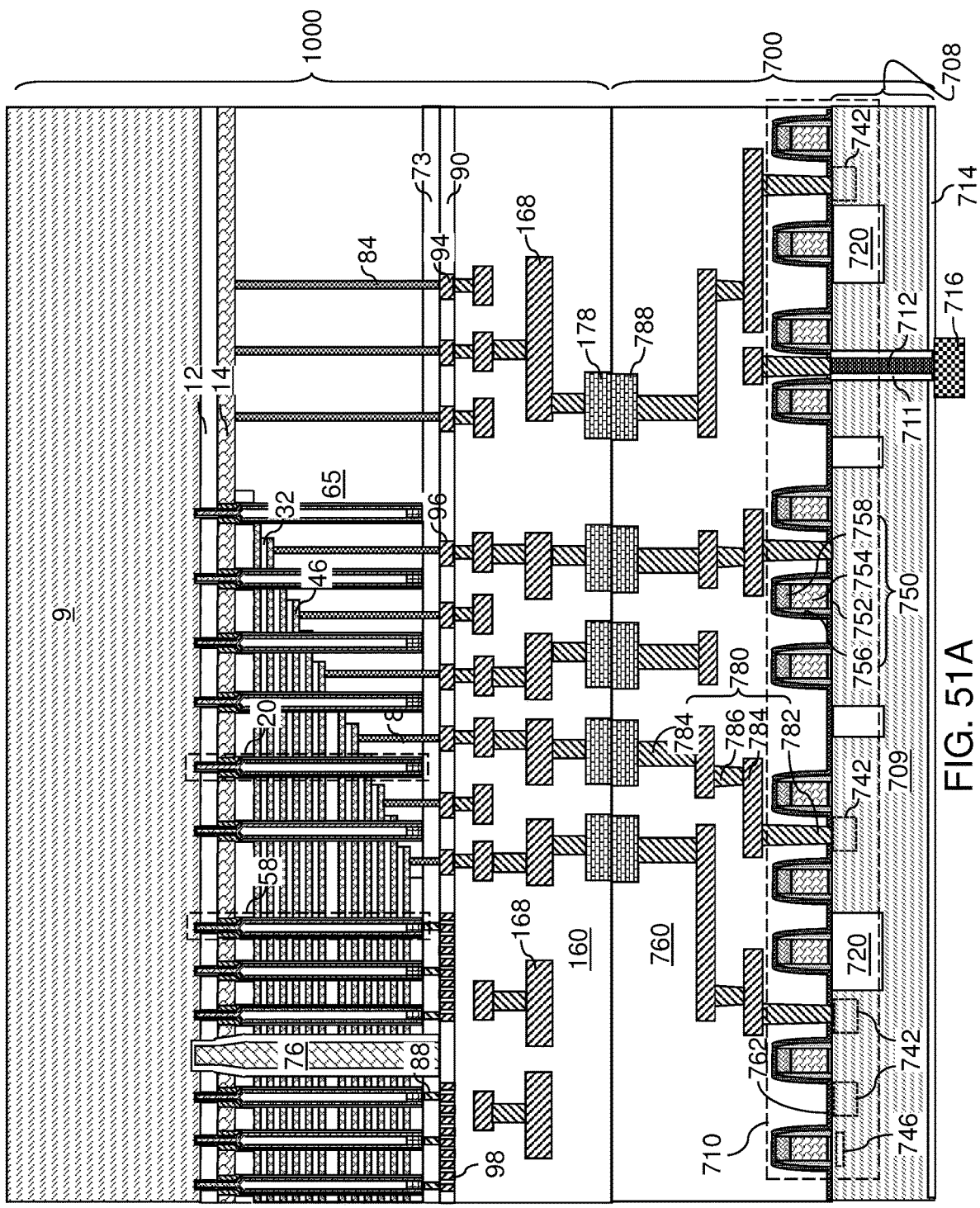
FIG. 51A is a schematic vertical cross-sectional view of a second exemplary bonded assembly of the first semiconductor die and the second semiconductor die according to an embodiment of the present disclosure.
Figure 51B:
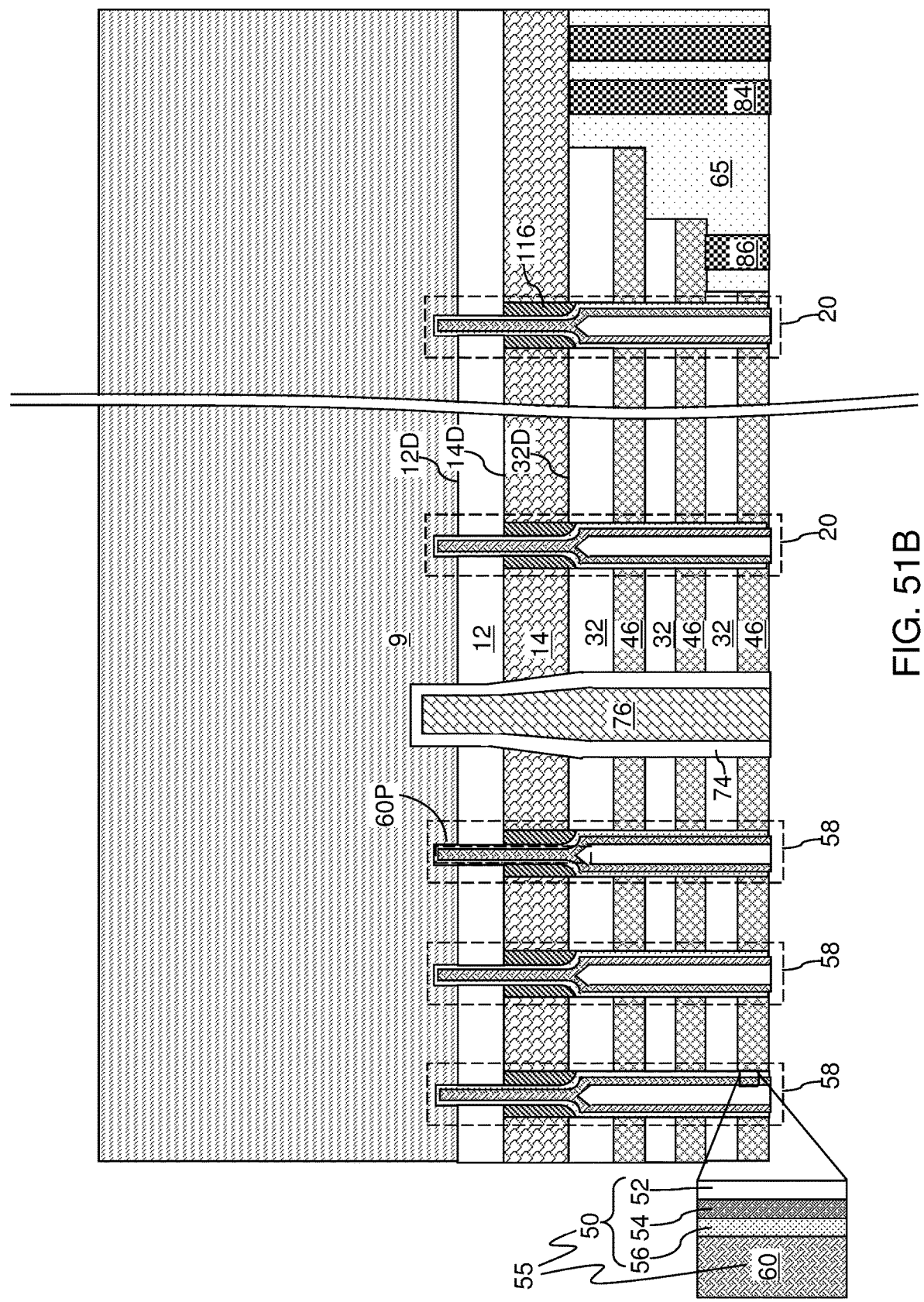
FIG. 51B is a magnified view of a region of the first exemplary bonded assembly of FIG. 51A.

Referring to FIGS. 51A and 51B, the processing steps of FIG. 12 may be performed to form a first line level dielectric layer 90, various metal line structures (98, 96, 94) including bit lines 98, additional metal interconnect structures 168 embedded within additional interconnect level dielectric layers 160, and first bonding structures 178. The bit lines 98 are electrically connected to the drain regions 63. The first bonding structures 178 can be formed over the bit line 98, and a subset of the first bonding structures 178 may be electrically connected to a respective one of the bit lines 98. These steps form the first semiconductor die 1000, which may be a memory die.

A second semiconductor die 700 can be subsequently provided, which may be a logic die including various semiconductor devices 710. For example, the second semiconductor die 700 may be the same as the second semiconductor die 700 described with reference to FIG. 13. In one embodiment, the logic die 700 comprises semiconductor devices 710 located on a semiconductor substrate (such as a logic-die substrate 708) and second bonding structures 788 that overlie, and are electrically connected to, the semiconductor devices 710. In one embodiment, the logic die 700 comprises peripheral devices configured to control operation of the electrically conductive layers 46 and the bit lines 98.

The first semiconductor die 1000 and the second semiconductor die 700 can be bonded to each other employing metal-to-metal bonding or hybrid bonding. For example, the first bonding structures 178 of the first semiconductor die 1000 may be bonded to the second bonding structures 788 of the second semiconductor die 700. The processing steps described with reference to FIGS. 14A and 14B may be employed to bond the first semiconductor die 1000 to the second semiconductor die 700. A bonded assembly of the memory die 1000 and the logic die 700 is formed.

Optionally, the substrate semiconductor layer (e.g., the silicon wafer) 709 of the second semiconductor die 700 can be thinned from the backside. For example, a combination of grinding, polishing, and/or chemical etching may be employed to remove portions of the substrate semiconductor layer 709 that are distal from the interface between the first semiconductor die 1000 and the second semiconductor die 700. Surfaces of the through-substrate contact via structures 712 can be physically exposed after thinning the substrate semiconductor layer 709. A backside insulating layer 714 can be formed on the backside surface of the logic die substrate 708 (as thinned after the thinning process). Laterally-insulated through-substrate via structures (711, 712) can vertically extend through the logic die substrate 708 to provide electrical contact to various input nodes and output nodes of the periphery circuitry in the second semiconductor die 700. Each laterally-insulated through-substrate via structure (711, 712) includes a through-substrate connection via structure 712 and a through-substrate insulating liner 711 that laterally surrounds the through-substrate conductive via structure 712. Logic-side bonding pads 716 (which is also referred to as front bonding pads) can be formed on surface portions of the laterally-insulated through-substrate via structures (711, 712). Generally, a semiconductor die is provided, which includes semiconductor devices 710 located on a semiconductor substrate (such as the substrate semiconductor layer 709). The second bonding structures 788 overlie and are electrically connected to the semiconductor devices 710, and laterally-insulated through-substrate via structures (711, 712) can extend through the logic-side substrate 708. Alternatively, the substrate semiconductor layer (e.g., the silicon wafer) 709 of the second semiconductor die 700 may be retained in the device and the logic-side bonding pads 716 and the laterally-insulated through-substrate via structures (711, 712) are omitted.

In the bonded assembly, the alternating stack (32, 46) may be more proximal to the logic die 700 than the semiconductor material layer 14 is to the logic die 700. In one embodiment, the logic die 700 contains peripheral semiconductor devices configured to control operation of the electrically conductive layers 46 and the vertical semiconductor channels 60. In one embodiment, the alternating stack (32, 46) comprises a staircase region in which lateral extents of the alternating stack (32, 46) decrease with a vertical distance from the dielectric spacer layer 12 and in which stepped surfaces of the alternating stack (32, 46) are present. The memory die 1000 comprises a stepped dielectric material portion 65 contacting the stepped surfaces. In one embodiment, the memory die 1000 comprises support pillar structures 20 that vertically extend through the stepped dielectric material portion 65, a respective portion of the alternating stack (32, 46), and the semiconductor material layer 14, and through the dielectric spacer layer 12.

Figure 52:
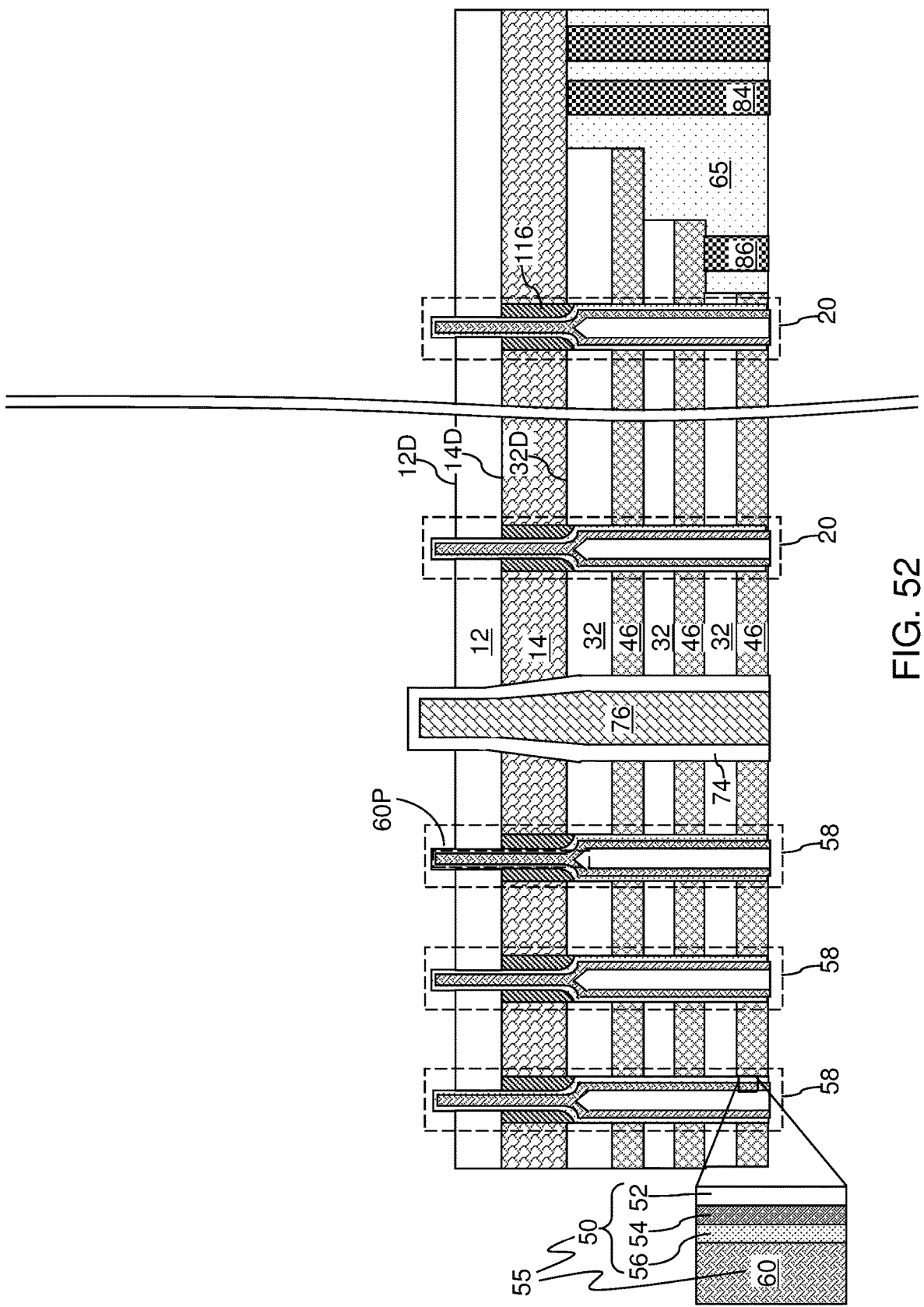
FIG. 52 is a schematic vertical cross-sectional view of the second exemplary bonded assembly after removal of the carrier substrate according to an embodiment of the present disclosure.

Referring to FIG. 52, the carrier substrate 9 may be removed while retaining the dielectric spacer layer 12, the memory opening fill structures 58, and the backside insulating spacers 74. For example, if the carrier substrate 9 comprises a semiconductor substrate (such as a commercially available silicon wafer), a grinding process may be performed to remove a predominant portion of the carrier substrate 9 from the backside, a polishing process may be performed to remove a proximal portion of the carrier substrate 9 that is proximal to the interface between the first semiconductor die 1000 and the second semiconductor die 700, and an isotropic wet etch process employing an etchant that etches the semiconductor material of the carrier substrate 9 selective to the dielectric material of the dielectric spacer layer 12 to remove remaining portions of the semiconductor material of the carrier substrate 9. In an illustrative example, the wet etch process may employ KOH as an etchant. Portions of the memory opening fill structures 58 may protrude from the exposed distal surface 12D of the dielectric spacer layer 12. A distal surface 14D of the semiconductor material layer 14 contacts a proximal surface of the dielectric spacer layer 12. A distal surface 32D of the alternating stack (32, 46) contacts a proximal surface of the semiconductor material layer 14. In the bonded assembly, the interface between the memory die 1000 and the logic die 700 is employed as a reference plane for determining distality or proximity of surfaces within the bonded assembly.

Figure 53:
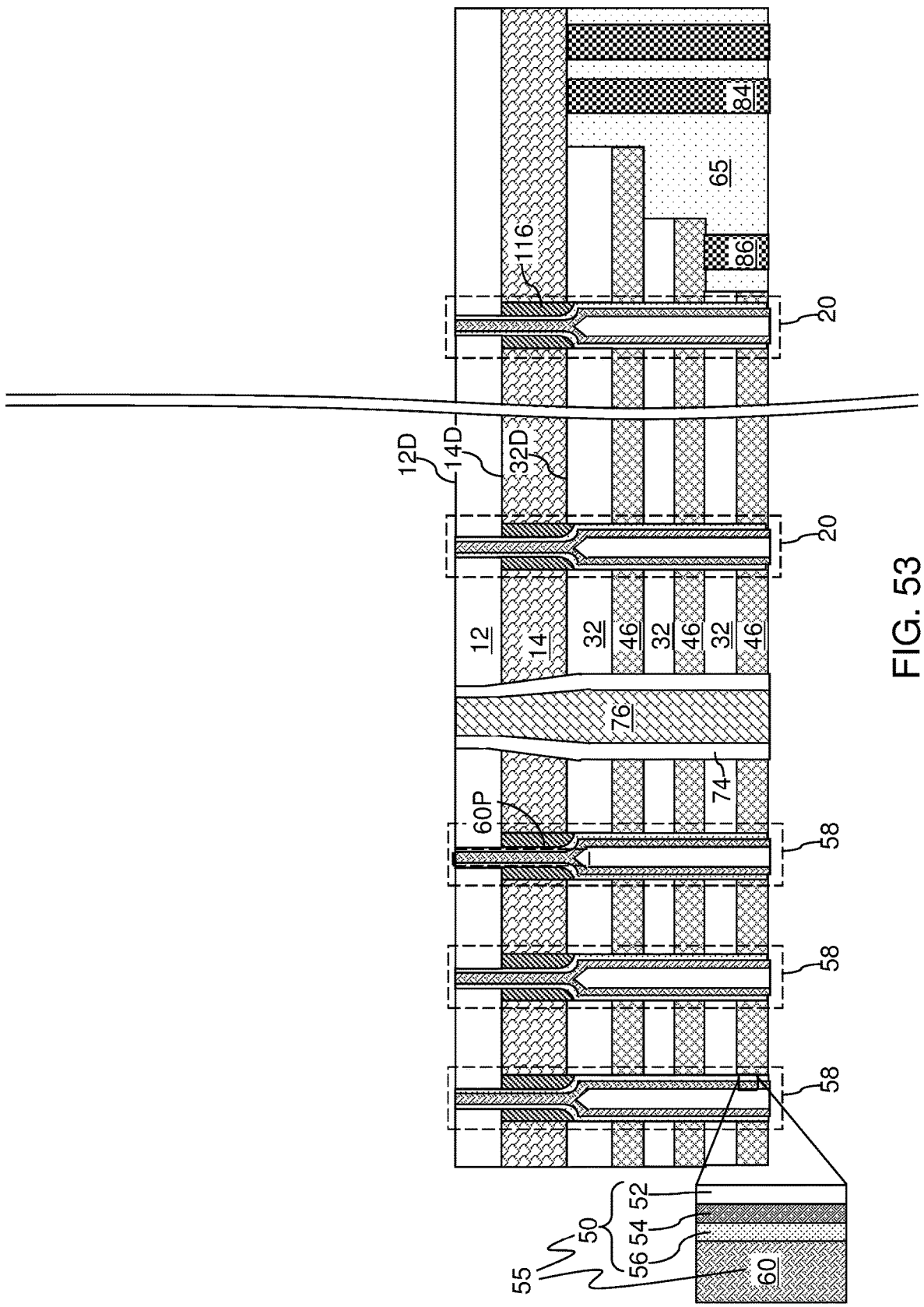
FIG. 53 is a schematic vertical cross-sectional view of the second exemplary bonded assembly after a planarization process according to an embodiment of the present disclosure.

Referring to FIG. 53, a non-selective planarization process may be performed to remove material portions that overlie the horizontal plane including the distal surface 12D of the dielectric spacer layer 12. The non-selective planarization process may employ a chemical mechanical polishing process. Portions of the memory films 50, the vertical semiconductor channels 60, the backside insulating spacers 74, and the backside trench via structures 76 that overlie the horizontal plane including the distal surface 12D of the dielectric spacer layer 12 can be removed in by the non-selective planarization process. A distal end surface of each of the vertical semiconductor channels 60 can be physically exposed. Specifically, planar end surfaces of the pillar portions 60P of the vertical semiconductor channels 60 can be physically exposed, which can be located within the horizontal plane including the top surface of the distal surface 12D of the dielectric spacer layer 12.

Figure 54:
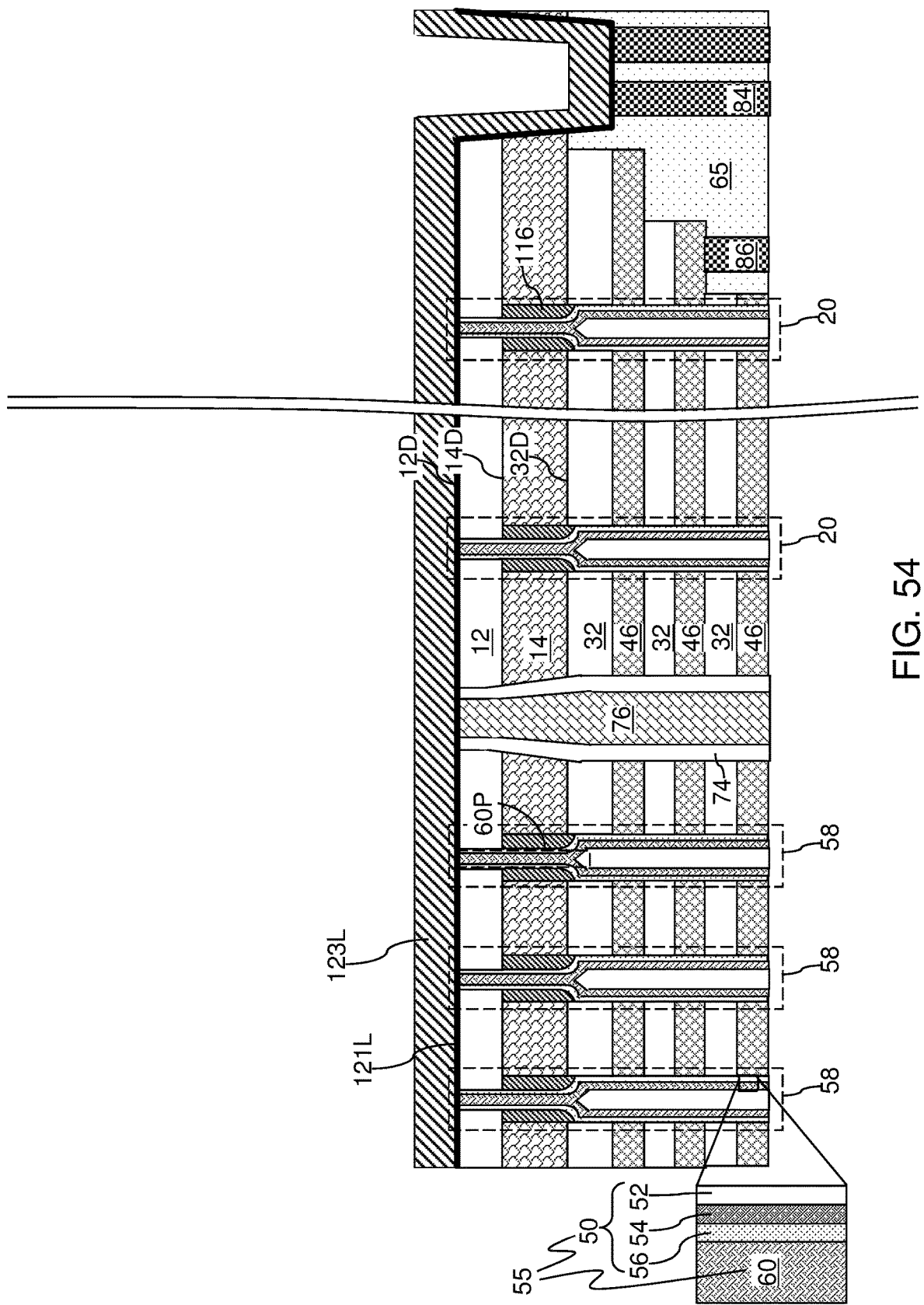
FIG. 54 is a vertical cross-sectional view of the second exemplary bonded assembly after formation of a contact recess region and deposition of at least one metallic material layer according to an embodiment of the present disclosure.

Referring to FIG. 54, dopants of the first conductivity type may be implanted into the pillar portions 60P of the vertical semiconductor channels 60. The dose of the ion implantation process may be selected such that the pillar portions 60P include dopants of the first conductivity type at an atomic concentration in a range from $1.0 \times 10^{16}/cm^3$ to $1.0 \times 10^{19}/cm^3$, such as from $1.0 \times 10^{17}/cm^3$ to $1.0 \times 10^{18}/cm^3$. In this case, the pillar portions 60P may have a higher dopant concentration than the hollow portions 60H.

A photoresist layer (not shown) can be applied over the dielectric spacer layer 12, and can be lithographically patterned to form openings in areas that overlie the pass-through via structures 84. An etch process, such as an anisotropic etch process, can be performed to etch through unmasked portions of the dielectric spacer layer 12 and the semiconductor material layer 14. A contact recess region vertically extending through the dielectric spacer layer 12 and the semiconductor material layer 14 can be formed over each pass-through via structure 84. A and a surface of the at least one pass-through via structure 84 can be physically exposed at the bottom of each contact recess region 103. The photoresists layer can be subsequently removed, for example, by ashing.

At least one electrically conductive material layer can be deposited on and over the distal surface 12D of the dielectric spacer layer 12. The at least one conductive material layer may comprise at least one metallic material layer (121L, 123L). In one embodiment, the at least one metallic material layer (121L, 123L) may comprise a metallic diffusion barrier liner 121L and a metallic fill material layer 123L. The metallic diffusion barrier liner 121L may comprise a metallic diffusion barrier material such as Ti, Ta, WN, TiN, TaN, MoN, TiC, TaC, WC, or a combination thereof. The thickness of a horizontally-extending portion of the metallic diffusion barrier liner 121L may be in a range from 1 nm to 10 nm, although lesser and greater thicknesses may also be employed. The metallic diffusion barrier liner 121L may be deposited by a conformal deposition process or a non-conformal deposition process. The metallic fill material layer 123L comprises at least one high-conductivity metal such as W, Ti, Ta, Mo, Ru, Co, Nb, Cu, Al, etc. The metallic fill material layer 123L may be deposited by physical vapor deposition, chemical vapor deposition, electroplating, electroless plating, etc. The at least one metallic material layer (121L, 123L) can contact each end surface of the pillar portions 60P of the vertical semiconductor channels 60 and each end surface of the pass-through via structures 84. Alternatively, a heavily doped semiconductor material, such as heavily doped polysilicon may be used instead of or in addition to the at least one metallic material layer (121L, 123L).

Figure 55:
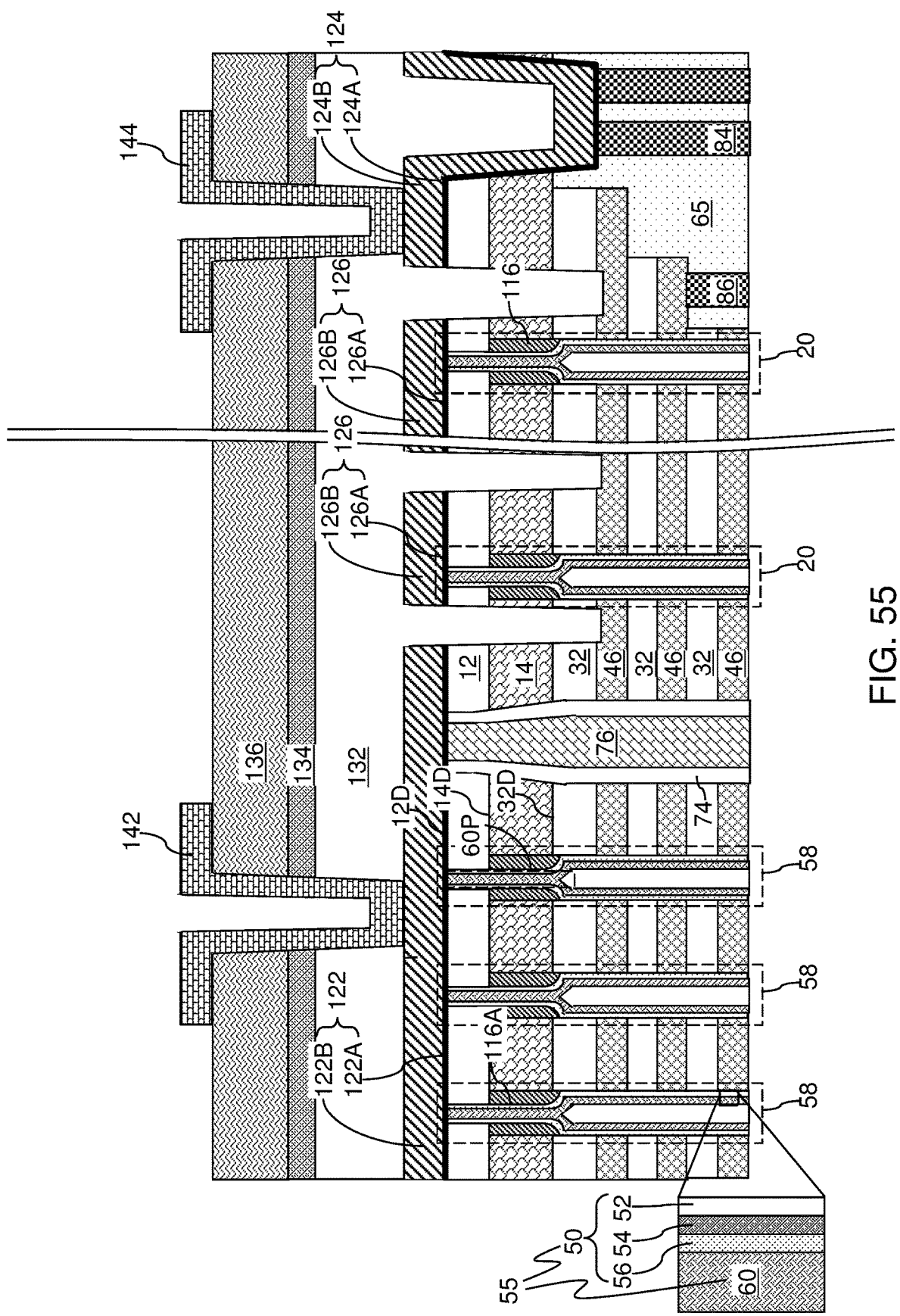
FIG. 55 is a vertical cross-sectional view of the second exemplary bonded assembly after formation of backside isolation trenches, backside dielectric material layers, and backsides bonding pads according to an embodiment of the present disclosure.

Referring to FIG. 55, a photoresist layer (not shown) may be applied over the top surface of the at least one metallic material layer (121L, 123L), and may be lithographically patterned to form discrete areas. An etch process, such as an anisotropic etch process, can be performed to transfer the pattern in the photoresist layer through the at least one metallic material layer (121L, 123L), the dielectric spacer layer 12, and the semiconductor material layer 14. The at least one metallic material layer (121L, 123L), the dielectric spacer layer 12, and the semiconductor material layer 14 can be divided into multiple discrete portions that are laterally spaced apart from each other by backside isolation trenches.

Patterned portions of the at least one metallic material layer (121L, 123L) comprise a source layer 122 that contacts end surfaces of the pillar portions 60P of the vertical semiconductor channels 60. Alternatively, the source layer 122 may comprise a heavily doped semiconductor material, such as heavily doped polysilicon, instead of or in addition to the at least one metallic material layer (121L, 123L). Generally, the source layer 122 comprises at least one electrically conductive material that is in direct contact with the distal surface 12D of the dielectric spacer layer 12 and in direct contact with distal end surfaces of the solid semiconductor pillar portions 60P of the vertical semiconductor channels 60. The source layer 122 may comprise a source metallic barrier liner 122A that is a patterned portion of the metallic diffusion barrier liner 121L, and a source metal layer 122B that is a patterned portion of the metallic fill material layer 123L.

Thus, the source layer 122 is formed over the dielectric spacer layer 12, and directly on the pillar portions 60P of the vertical semiconductor channels 60. The pillar portions 60P of the vertical semiconductor channels 60 have end surfaces contacting the source layer 122 within a horizontal plane that includes an interface between the source layer 122 and the dielectric spacer layer 12. In one embodiment, the straight cylindrical surface segments of the pillar portions 60P of the vertical semiconductor channels 60 vertically extend through the semiconductor material layer 14 and through the dielectric spacer layer 12, and are adjoined to the source layer 122.

Further, patterned portions of the at least one metallic material layer (121L, 123L) comprise a metallic contact plate 124 that contacts end surfaces of a respective one of the pass-through via structures 84. The metallic contact plate 124 may comprise a contact metallic barrier liner 124A that is a patterned portion of the metallic diffusion barrier liner 121L, and a contact metal layer 124B that is a patterned portion of the metallic fill material layer 123L. Optionally, patterned portions of the at least one metallic material layer (121L, 123L) may comprise dummy metallic plates 126 that contact end surfaces of a respective one of the support pillar structures 20. The dummy metal plates 126 may comprise a dummy metallic barrier liner 126A that is a patterned portion of the metallic diffusion barrier liner 121L, and a dummy metal layer 126B that is a patterned portion of the metallic fill material layer 123L. The dummy metal plates 126 may be laterally spaced from each other to minimize the effect of leakage currents. The dummy metal plates 126 are electrically inactive components which are not connected to an external voltage source, and are electrically floating.

In one embodiment, the dielectric spacer layer 12 is more distal from the second semiconductor die 700 than any portion of the dielectric cores 62 of the memory opening fill structures 58 is from the second semiconductor die 700, i.e., more distal from the second semiconductor die 700 than the most distal portions of the dielectric cores 62 of the memory opening fill structures 58.

In one embodiment, each of the memory openings 49 has a sidewall including the cylindrical inner sidewall 116A of the tubular spacer 116 and a sidewall segment of the dielectric spacer layer 12. In one embodiment, each of the vertical semiconductor channels 60 comprises a pillar portion 60P having a respective end surface located between a horizontal plane including the distal surface 14D of the semiconductor material layer 14 and a horizontal plane including the distal surface 12D of the dielectric spacer layer 12.

In one embodiment, the alternating stack (32, 46) comprises a staircase region in which lateral extents of the alternating stack (32, 46) decrease with a vertical distance from the dielectric spacer layer 12 and in which stepped surfaces of the alternating stack (32, 46) are present. The memory die 1000 comprises a stepped dielectric material portion 65 contacting the stepped surfaces. In one embodiment, the memory die comprises support pillar structures 20 that vertically extend through the stepped dielectric material portion 65, a respective portion of the alternating stack (32, 46), and the semiconductor material layer 14, and at least partly through the dielectric spacer layer 12.

Backside dielectric material layers (132, 134, 136) can be formed over the source layer 122 and the metallic contact plates 124. The backside dielectric material layers (132, 134, 136) may comprise, for example, a backside dielectric fill material layer 132 including a dielectric fill material, such as a silicon oxide, a backside dielectric passivation layer 134 that comprises a diffusion blocking dielectric material, such as a silicon nitride or silicon carbide nitride, and a polymer material layer 136 that includes a photosensitive polymer material such as polyimide. The polymer material layer 136 may be patterned with the discrete openings, for example, by lithographic exposure and development, and an etch process such as an anisotropic etch process can be performed to transfer the pattern of the openings in the polymer material layer 136 through the backside dielectric passivation layer 134 and the backside dielectric fill material layer 132.

At least one metallic material including on under bump metallurgy (UBM) material stack may be deposited in the openings through the backside dielectric material layers (132, 134, 136) directly on physically exposed surfaces of the source layer 122 and the metallic contact plates 124. The at least one metallic material can be subsequently patterned to form bonding pads (142, 144), which may comprise at least one source-side a bonding pad 142 and contact-connection bonding pads 144.

Generally, at least one backside dielectric material layer (132, 134, 136) can be formed in on the source layer 122, and a bonding pad (such as a source-side bonding pad 142) vertically extends through the at least one backside dielectric material layer (132, 134, 136) and contacts the source layer 122. A pass-through via structure 84 may vertically extend through the stepped dielectric material portion 65 to the peripheral devices 710 of the logic die 700, and an additional bonding pad vertically extending through the at least one backside dielectric material layer (132, 134, 136) and electrically connected to the pass-through via structure 84.

Figure 56:
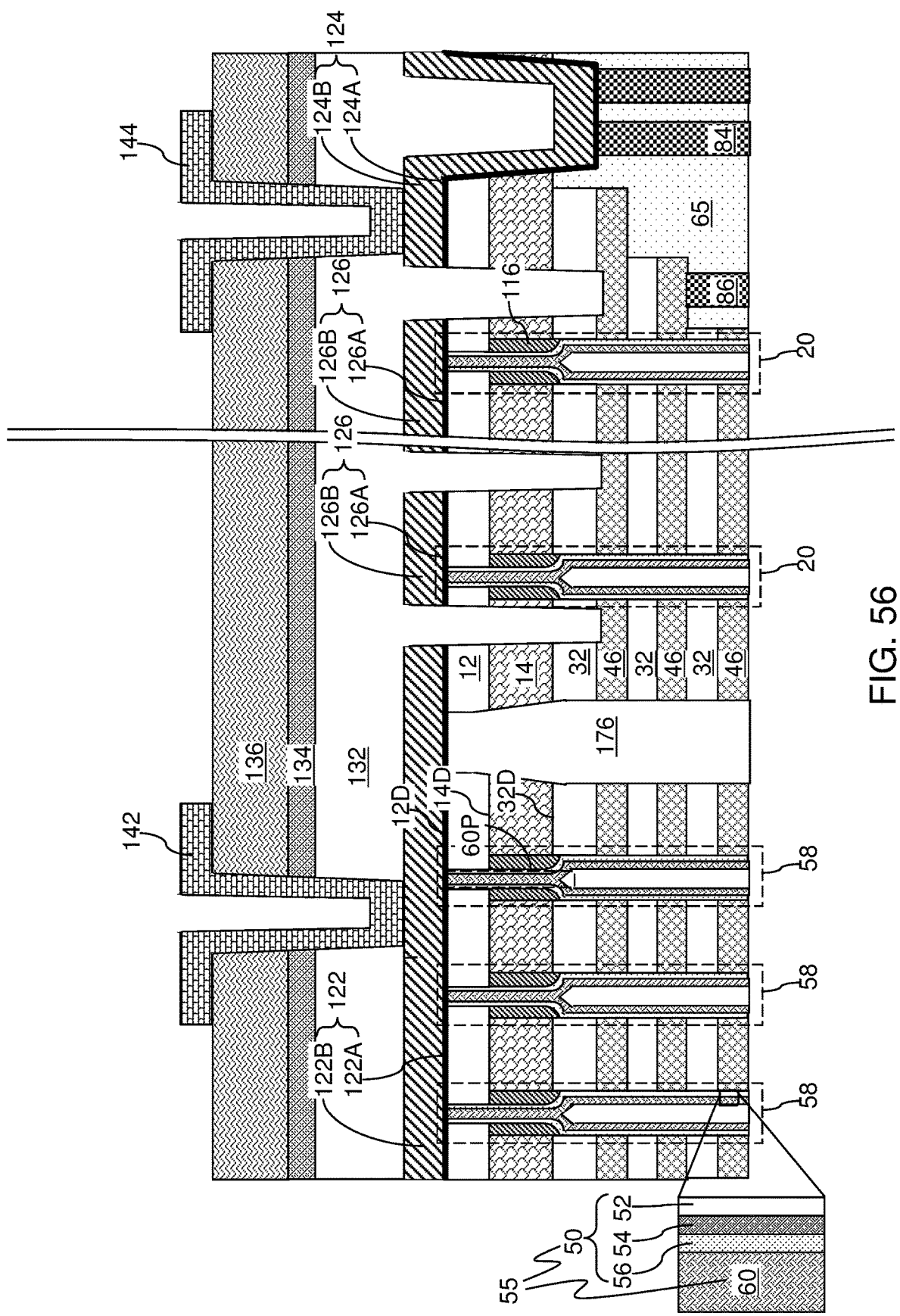
FIG. 56 is a vertical cross-sectional view of a first alternative configuration of the second exemplary bonded assembly according to an embodiment of the present disclosure.

Referring to FIG. 56, a first alternative configuration of the second exemplary bonded assembly may be derived from the second exemplary bonded assembly illustrated in FIG. 55 by forming a dielectric backside trench fill structure 176 comprising a dielectric material in lieu of each combination of a backside insulating spacer 74 and a backside trench via structure 76.

Figure 57:
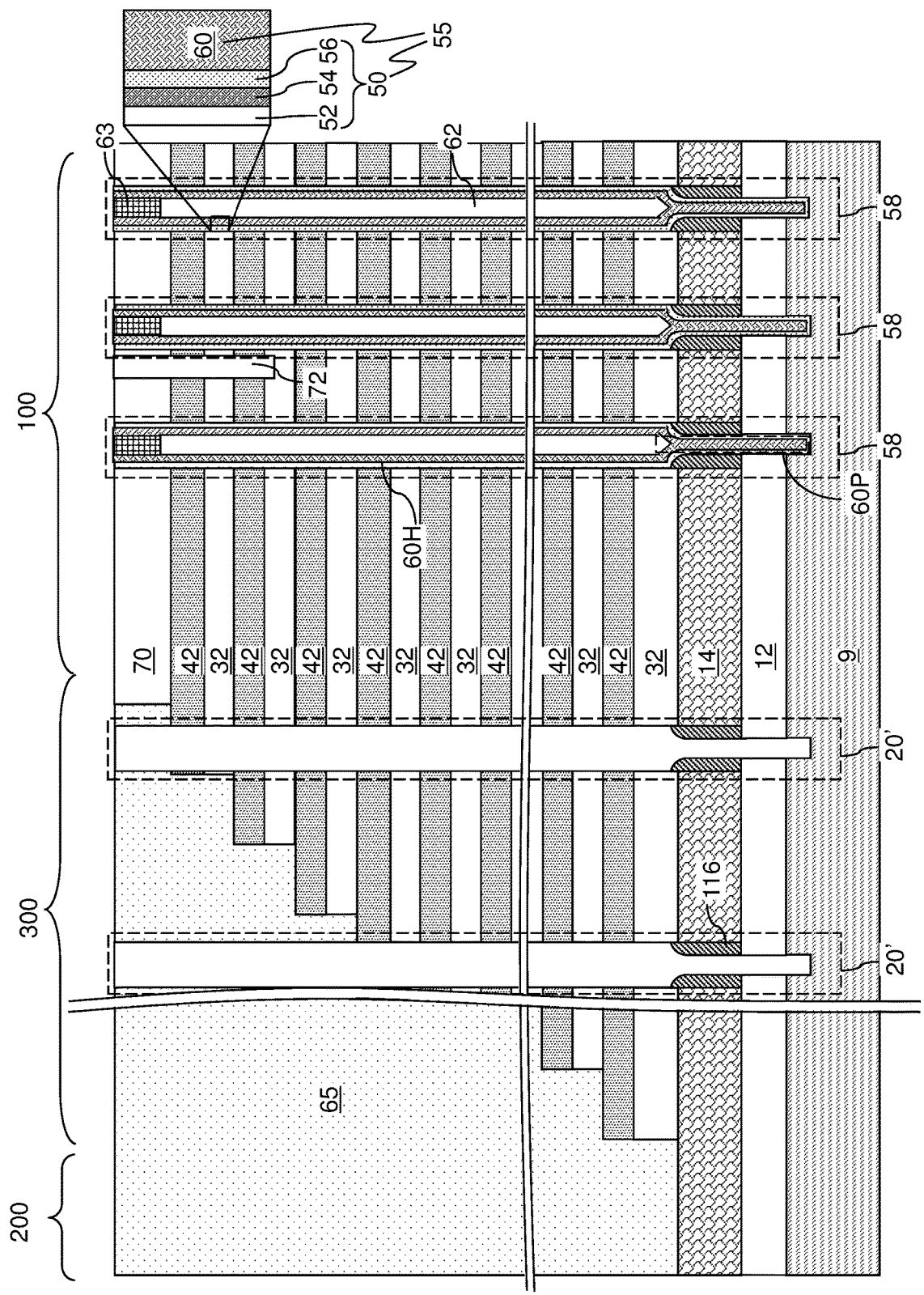
FIG. 57 is a vertical cross-sectional view of an alternative configuration of the second exemplary structure after formation of memory opening fill structures and support pillar structures according to an embodiment of the present disclosure.

Referring to FIG. 57, an alternative configuration of the second exemplary structure can be derived from the second exemplary structure illustrated in FIG. 48 by forming support pillar structures 20' prior to, or after, formation of the memory opening fill structures 58. In this case, the support openings 19 are filled with at least dielectric fill material such as silicon oxide to form support pillar structures 20' consisting essentially of the at least one dielectric fill material. In other words, the memory openings 49 and the memory opening fill structures 58 can formed using a separate set of processing steps than the set of processing steps and are employed to form the support openings 19 and the support pillar structures 20'. Alternatively, the memory openings 49 and the support openings 19 may be formed at a same processing step employing an anisotropic etch process, and sacrificial fill material portions may be formed and are subsequently selectively removed to enables sequential formation of the memory opening fill structures 58 before or after the support pillar structures 20'.

Figure 58:
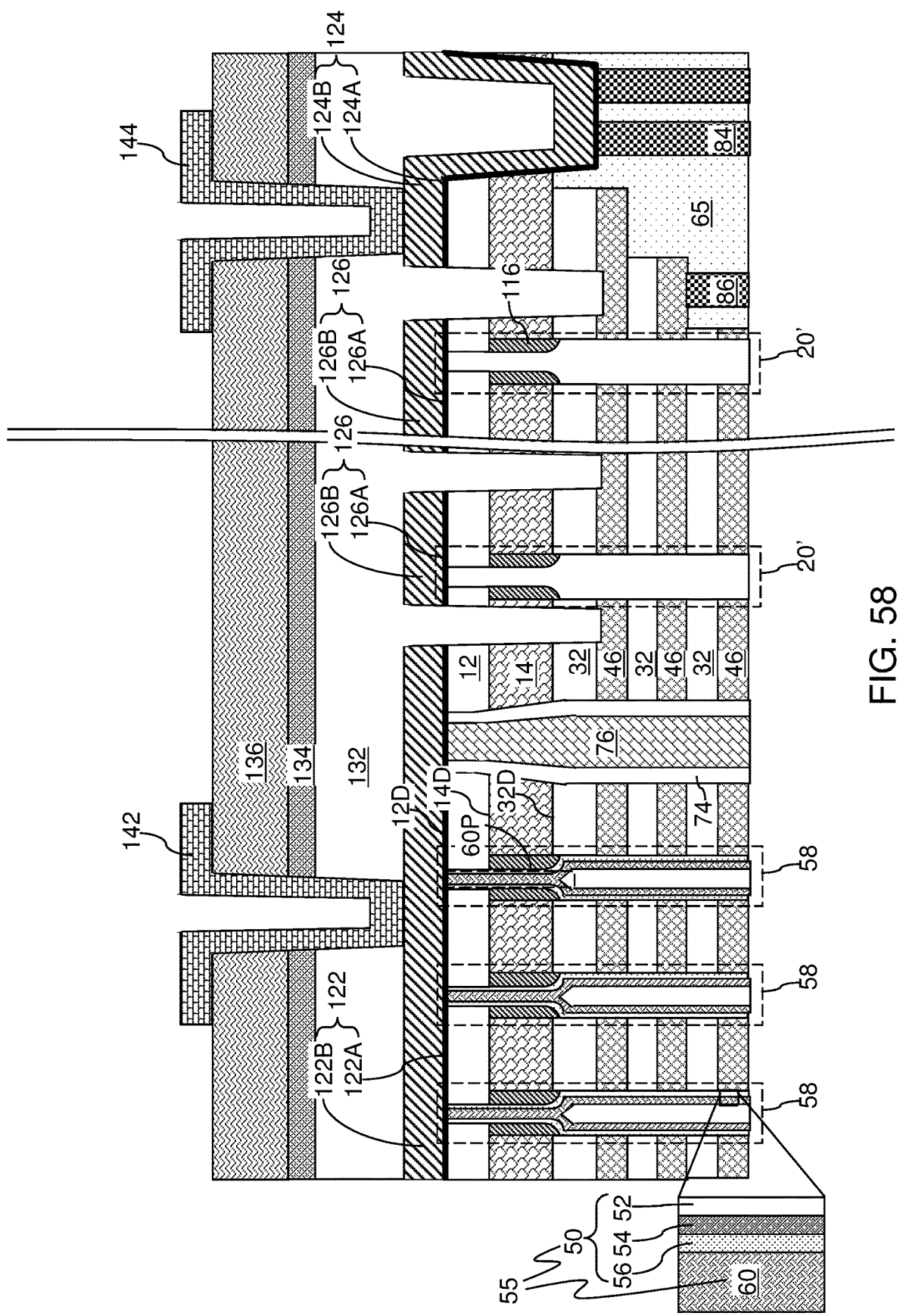
FIG. 58 is a vertical cross-sectional view of a second alternative configuration of the second exemplary bonded assembly according to an embodiment of the present disclosure.

Referring to FIG. 58, subsequent processing steps described above may be performed to provide a second alternative configuration of the second exemplary bonded assembly according to an embodiment of the present disclosure.

Figure 59:
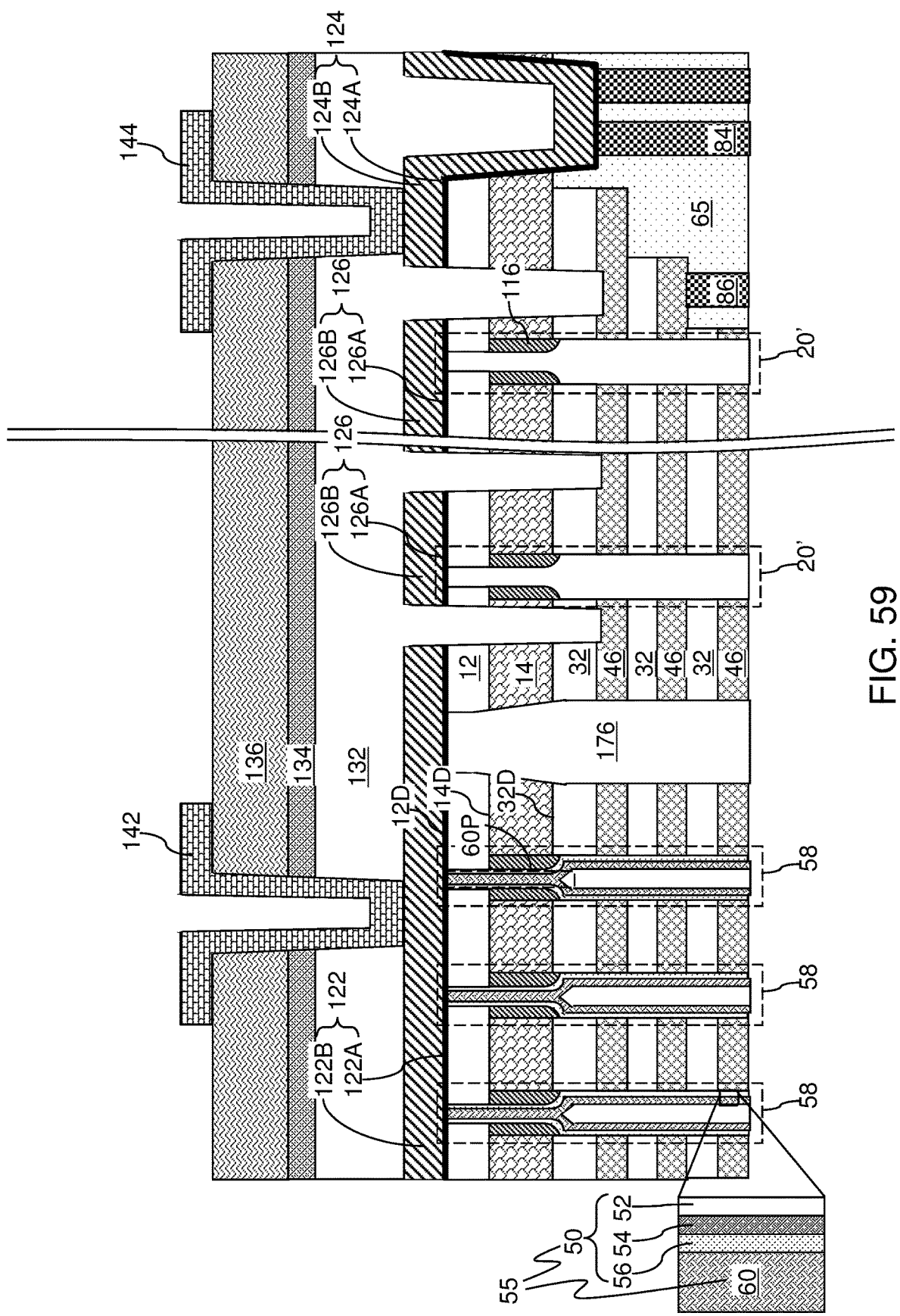
FIG. 59 is a vertical cross-sectional view of a third alternative configuration of the second exemplary bonded assembly according to an embodiment of the present disclosure.

Referring to FIG. 59, a vertical cross-sectional view of a third alternative configuration of the second exemplary bonded assembly is illustrated. The features and the processing steps of the first alternative configuration and the second alternative configuration of the second exemplary bonded assembly may be employed to provide the third alternative configuration of the second exemplary bonded assembly.

Figure 60:
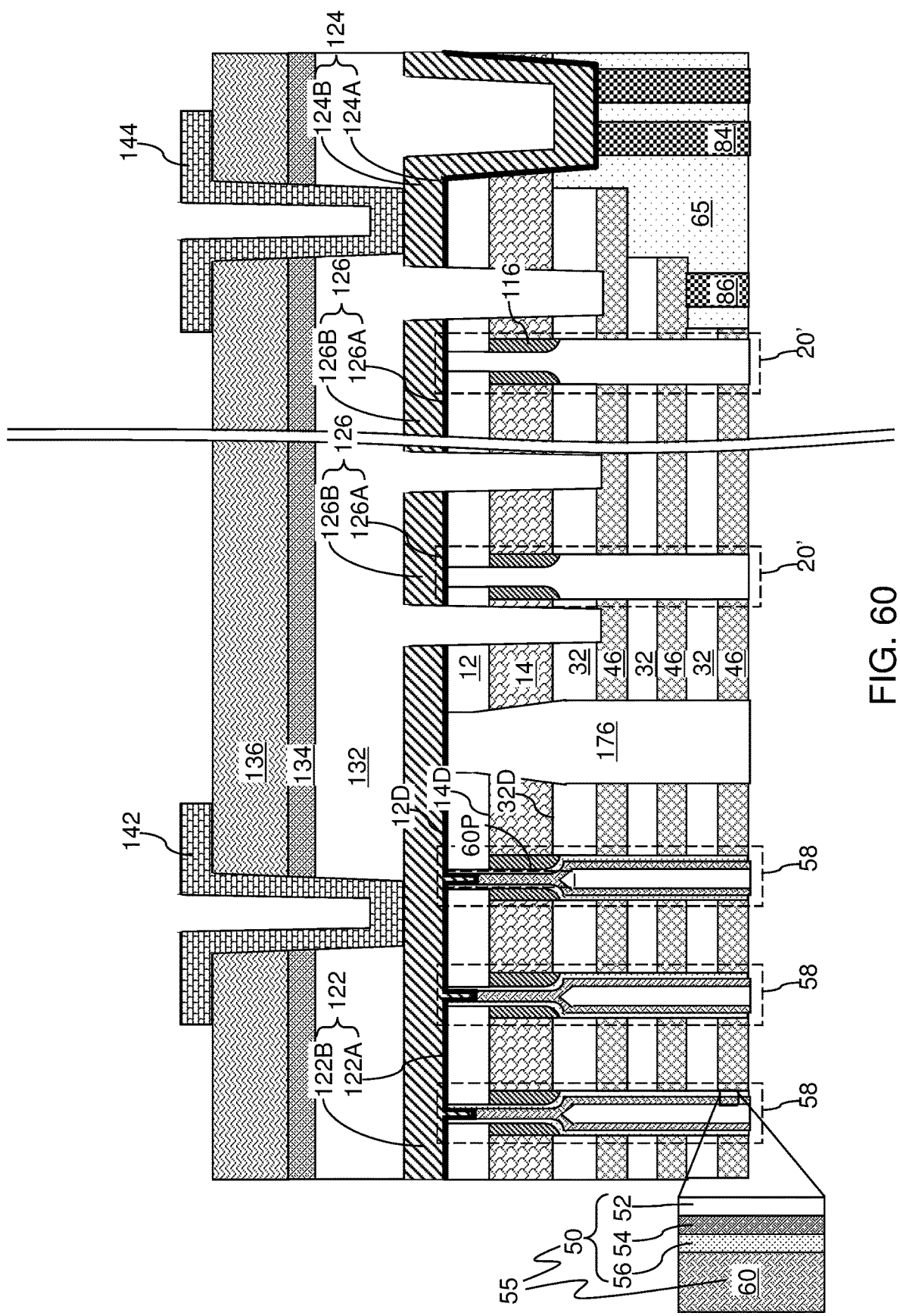
FIG. 60 is a vertical cross-sectional view of a fourth alternative configuration of the second exemplary bonded assembly according to an embodiment of the present disclosure.

Referring to FIG. 60, a fourth alternative configuration of the second exemplary bonded assembly according to an embodiment of the present disclosure may be derived from any of the above-described configurations of the second exemplary bonded assembly by vertically recessing the pillar portions 60P of the vertical semiconductor channels 60 prior to deposition of the at least one metallic material layer (121L, 123L) that is subsequently employed to form the source layer 122, as described with reference to FIG. 20 above.

Referring to various embodiments and drawings that are related to the second exemplary bonded assembly and/or the second exemplary structure, a semiconductor structure that comprises a memory die 1000 is provided. The memory die 1000 comprises: an alternating stack (32, 46) of insulating layers 32 and electrically conductive layers 46; a semiconductor material layer 14 located over the alternating stack (32, 46); a dielectric spacer layer 12 located over the semiconductor material layer 14, and spaced from the alternating stack (32, 46) by the semiconductor material layer 14; a memory opening 49 vertically extending through the alternating stack (32, 46), through the semiconductor material layer 14, and at least partly through the dielectric spacer layer 12; a memory opening fill structure 58 located in the memory opening 49 and comprising a dielectric core 62, a vertical semiconductor channel 60 having a hollow portion 60H which surrounds the dielectric core 62 and a pillar portion 60P which does not surround the dielectric core 62, a memory film 50; and a source layer 122 located over the dielectric spacer layer 12 and contacting the pillar portion 60P of the vertical semiconductor channel 60.

In one embodiment, the memory die also includes a tubular spacer 116 that laterally surrounds the pillar portion 60P, is laterally spaced from the pillar portion 60P by a cylindrical portion of the memory film 50, and contacts a cylindrical sidewall of the semiconductor material layer 14.

In one embodiment, the pillar portion 60P vertically extends through an opening in the tubular spacer 116. In one embodiment, the pillar portion 60P comprises a straight cylindrical surface segment and an annular concave surface segment connecting an edge of the straight cylindrical surface segment and an edge of an outer sidewall of the hollow portion 60H of the vertical semiconductor channel 60. In one embodiment, the straight cylindrical surface segment vertically extends through the semiconductor material layer 14 and through the dielectric spacer layer 12, and is adjoined to the source layer 122.

In one embodiment, the tubular spacer 116 comprises a semiconductor material or a conductive material. In one embodiment, the tubular spacer 116 has an outer sidewall that is vertically coincident with, and is adjoined to, an outer sidewall of the memory film 50. In one embodiment, the tubular spacer 116 comprises a cylindrical outer sidewall, a cylindrical inner sidewall that is laterally offset inward from the cylindrical outer sidewall by a uniform lateral offset distance, a planar annular surface contacting the dielectric spacer layer 12, and a convex annular surface contacting the memory film 50.

In one embodiment, the pillar portion 60P has a higher dopant concentration than the hollow portion 60H. In one embodiment, the pillar portion 60P of the vertical semiconductor channel 60 has an end surface contacting the source layer 122 within a horizontal plane that includes an interface between the source layer 122 and the dielectric spacer layer 12.

In one embodiment, the semiconductor structure comprises a logic die 700 that is bonded to the memory die 1000, wherein the alternating stack (32, 46) is more proximal to the logic die 700 than the semiconductor material layer 14 is to the logic die 700. In one embodiment, the logic die 700 contains peripheral semiconductor devices configured to control operation of the electrically conductive layers 46 and the vertical semiconductor channel 60.

In one embodiment, the alternating stack (32, 46) comprises a staircase region in which lateral extents of the alternating stack (32, 46) decrease with a vertical distance from the dielectric spacer layer 12 and in which stepped surfaces of the alternating stack (32, 46) are present; the memory die 1000 further comprises a stepped dielectric material portion 65 contacting the stepped surfaces; and the memory die 1000 further comprises support pillar structures 20 that vertically extend through the stepped dielectric material portion 65, a respective portion of the alternating stack (32, 46), and the semiconductor material layer 14, and at least partly through the dielectric spacer layer 12.

In one embodiment, the semiconductor structure comprises: at least one backside dielectric material layer (132, 134, 136) located on the source layer 122; a bonding pad 142 vertically extending through the at least one backside dielectric material layer (132, 134, 136) and contacting the source layer 122; a pass-through via structure 84 that vertically extends through the stepped dielectric material portion 65; and an additional bonding pad 144 vertically extending through the at least one backside dielectric material layer (132, 134, 136) and electrically connected to the pass-through via structure 84.

The various embodiments of the present disclosure may be employed to provide reliable physical and electrical contact between end portions of the vertical semiconductor channels 60 in a three-dimensional memory device to a source layer 112, which may be formed on a backside of a bonded assembly after removal of a carrier substrate.

In the second embodiment, by using the tubular spacers 116 to narrow the bottom of the memory openings 49, the bottom position of the dielectric core 62 is set in a more precise location. Therefore, the length of the pillar portion 60P of the semiconductor channel 60 is more precisely controlled, leading to a more stable device. Furthermore, the thickness of the semiconductor material layer 14 may be reduced, which reduces the process cost. Finally, by adding the tubular spacers 116, a taper etch of the semiconductor material layer 14 is not required during formation of the memory opening 49, which simplifies the device fabrication process.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure that comprises a memory die, wherein the memory die comprises:

an alternating stack of insulating layers and electrically conductive layers;

a semiconductor material layer located over the alternating stack;

a dielectric spacer layer located over the semiconductor material layer, and spaced from the alternating stack by the semiconductor material layer;

a memory opening vertically extending through the alternating stack, through the semiconductor material layer, and at least partly through the dielectric spacer layer;

a memory opening fill structure located in the memory opening and comprising a dielectric core, a vertical semiconductor channel having a hollow portion which surrounds the dielectric core and a pillar portion which does not surround the dielectric core, a memory film; and a source layer located over the dielectric spacer layer and contacting the pillar portion of the vertical semiconductor channel.

2. The semiconductor structure of claim 1, further comprising a tubular spacer that laterally surrounds the pillar portion, is laterally spaced from the pillar portion by a cylindrical portion of the memory film, and contacts a cylindrical sidewall of the semiconductor material layer.

3. The semiconductor structure of claim 2, wherein the pillar portion comprises a straight cylindrical surface segment and an annular concave surface segment connecting an edge of the straight cylindrical surface segment and an edge of an outer sidewall of the hollow portion of the vertical semiconductor channel.

4. The semiconductor structure of claim 3, wherein the straight cylindrical surface segment vertically extends through the semiconductor material layer and through the dielectric spacer layer, and is adjoined to the source layer.

5. The semiconductor structure of claim 2, wherein the tubular spacer comprises a semiconductor material or a conductive material.

6. The semiconductor structure of claim 2, wherein:
the pillar portion vertically extends through an opening in the tubular spacer; and
the tubular spacer has an outer sidewall that is vertically coincident with and is adjoined to an outer sidewall of the memory film.

7. The semiconductor structure of claim 2, wherein the tubular spacer comprises a cylindrical outer sidewall, a cylindrical inner sidewall that is laterally offset inward from the cylindrical outer sidewall by a uniform lateral offset distance, a planar annular surface contacting the dielectric spacer layer, and a convex annular surface contacting the memory film.

8. The semiconductor structure of claim 1, wherein the pillar portion has a higher dopant concentration than the hollow portion.

9. The semiconductor structure of claim 1, wherein the pillar portion of the vertical semiconductor channel has an end surface contacting the source layer within a horizontal plane that includes an interface between the source layer and the dielectric spacer layer.

10. The semiconductor structure of claim 1, further comprising a logic die that is bonded to the memory die, wherein the alternating stack is more proximal to the logic die than the semiconductor material layer is to the logic die.

11. The semiconductor structure of claim 10, wherein the logic die contains peripheral semiconductor devices configured to control operation of the electrically conductive layers and the vertical semiconductor channel.

12. The semiconductor structure of claim 1, wherein:
the alternating stack comprises a staircase region in which lateral extents of the alternating stack decrease with a vertical distance from the dielectric spacer layer and in which stepped surfaces of the alternating stack are present; and
the memory die further comprises a stepped dielectric material portion contacting the stepped surfaces.

13. The semiconductor structure of claim 12, wherein the memory die further comprises support pillar structures that vertically extend through the stepped dielectric material portion, a respective portion of the alternating stack, and the semiconductor material layer, and at least partly through the dielectric spacer layer.

14. The semiconductor structure of claim 13, further comprising:
at least one backside dielectric material layer located on the source layer;
a bonding pad vertically extending through the at least one backside dielectric material layer and contacting the source layer;
a pass-through via structure that vertically extends through the stepped dielectric material portion; and
an additional bonding pad vertically extending through the at least one backside dielectric material layer and electrically connected to the pass-through via structure.

15. A method of forming a memory device, comprising:
forming a dielectric spacer layer, a semiconductor material layer, and an alternating stack of insulating layers and spacer material layers over a carrier substrate, wherein the spacer material layers are formed as or are subsequently replaced with electrically conductive layers;
forming a memory opening through the alternating stack and the semiconductor material layer, wherein a surface of the dielectric spacer layer is physically exposed to the memory opening;
forming memory opening fill structure in the memory opening by forming a memory film in the memory opening, forming a vertical semiconductor channel on the memory film, and forming a dielectric core on the vertical semiconductor channel;
removing the carrier substrate;
physically exposing the pillar portion of the vertical semiconductor channel after removing the carrier substrate; and
forming a source layer directly on the pillar portion of the vertical semiconductor channel.

16. The method of claim 15, further comprising selectively depositing a tubular spacer on physically exposed surfaces of the semiconductor material layer, wherein the memory film is deposited on the tubular spacer and on sidewalls of the alternating stack after selectively depositing the tubular spacer.

17. The method of claim 16, wherein the vertical semiconductor channel comprises:
a hollow portion which laterally surrounds the dielectric core and vertically extends through the alternating stack; and
a pillar portion which vertically extends through the tubular spacer and the dielectric spacer and does not surround the dielectric core.

18. The method of claim 16, further comprising performing an extension etch process that anisotropically etches a portion of the dielectric spacer layer that is not masked by the tubular spacer after the selectively depositing the tubular spacer, wherein an end portion of the memory opening is vertically extended through the dielectric spacer layer.

19. The method of claim 18, wherein:
- the tubular spacer comprises a semiconductor material or a conductive material;
- the extension etch process etches a portion of the carrier substrate;
- the memory film is deposited directly on a physically exposed surface of the carrier substrate and on a cylindrical inner sidewall of the dielectric spacer layer in an outer portion of a cavity that is laterally surrounded by the tubular spacer, and an inner sidewall of the tubular spacer; and
- the vertical semiconductor channel is formed in and fills an inner portion of the cavity.

20. The method of claim 15, further comprising:
- forming a drain region on an end portion of the vertical semiconductor channel that is distal from the semiconductor material layer;
- forming a bit line that is electrically connected to the drain region;
- forming first bonding structures over the bit line, wherein one the first bonding structures is electrically connected to the bit line, and whereby a memory die is formed;
- providing a logic die comprising semiconductor devices located on a semiconductor substrate and second bonding structures that overlie, and are electrically connected to, the semiconductor devices, wherein the logic die comprises peripheral devices configured to control operation of the electrically conductive layers and the bit line;
- bonding the second bonding structures to the first bonding structures to form a bonded assembly of the memory die and the logic die, wherein the carrier substrate is removed after bonding the second bonding structures to the first bonding structures; and
- forming a bonding pad on the source layer.

\* \* \* \* \*